United States Patent
Yoshida et al.

(10) Patent No.: US 9,279,078 B2
(45) Date of Patent: Mar. 8, 2016

(54) HARDENING RESIN COMPOSITION AND COLOR CONVERSION MATERIAL USING THE SAME

(75) Inventors: Kazuhiro Yoshida, Chiba (JP); Ryota Mineo, Chiba (JP)

(73) Assignee: JNC CORPORATION, Tokyo (JP)

(*) Notice: Subject to any disclaimer, the term of this patent is extended or adjusted under 35 U.S.C. 154(b) by 67 days.

(21) Appl. No.: 13/985,874

(22) PCT Filed: Feb. 16, 2012

(86) PCT No.: PCT/JP2012/053694
§ 371 (c)(1),
(2), (4) Date: Aug. 16, 2013

(87) PCT Pub. No.: WO2012/111765
PCT Pub. Date: Aug. 23, 2012

(65) Prior Publication Data
US 2013/0320264 A1    Dec. 5, 2013

(30) Foreign Application Priority Data
Feb. 18, 2011   (JP) ................ 2011-033970

(51) Int. Cl.
| | | |
|---|---|---|
| *H01L 23/29* | (2006.01) | |
| *H01L 23/31* | (2006.01) | |
| *H01L 23/50* | (2006.01) | |
| *C08L 63/00* | (2006.01) | |
| *C08G 77/38* | (2006.01) | |
| *C08G 77/50* | (2006.01) | |
| *C08G 59/20* | (2006.01) | |
| *C08G 65/18* | (2006.01) | |
| *C09K 11/02* | (2006.01) | |
| *H01L 33/50* | (2010.01) | |
| *C08L 83/04* | (2006.01) | |
| *C08K 5/549* | (2006.01) | |
| *C08G 77/20* | (2006.01) | |

(52) U.S. Cl.
CPC ............... *C09K 11/025* (2013.01); *C08L 83/04* (2013.01); *H01L 33/501* (2013.01); *C08G 77/20* (2013.01); *C08K 5/549* (2013.01); *C08L 63/00* (2013.01)

(58) Field of Classification Search
CPC .... C09K 11/02; H01L 33/502; H01L 33/505; C08L 83/04; C08L 83/16; C08L 63/00; C08K 5/549

USPC ............ 252/301.36; 313/502; 257/98
See application file for complete search history.

(56) References Cited

U.S. PATENT DOCUMENTS 5,096,936 A    3/1992   Seko et al.

FOREIGN PATENT DOCUMENTS

| JP | 61-112334 | 5/1986 |
|---|---|---|
| JP | H02-289611 | 11/1990 |
| JP | 2003-037295 | 2/2003 |
| JP | 2003-273292 | 9/2003 |
| JP | 2004-037295 | 2/2004 |
| JP | 2004-238589 | 8/2004 |
| JP | 2004-359933 | 12/2004 |
| JP | 2006-299099 | 11/2006 |
| JP | 2009-084511 | 4/2009 |
| JP | 2009-280767 | 12/2009 |
| JP | 2010-123802 | 6/2010 |
| JP | 2010-254814 | 11/2010 |
| JP | 2010-285563 | * 12/2010 |
| WO | 2008133138 | 11/2008 |

OTHER PUBLICATIONS

Translation of JP 2010-285563, Dec. 2010.*
"International Search Report (Form PCT/ISA/210)", mailed on May 1, 2012, with English translation thereof, p. 1-p. 6, in which the listed references (JP2010-285563, JP2010-254814, JP2004-238589, JP2009-280767, and WO2008/133138) were cited.
"Office Action of Japan Counterpart Application", mailed on Jun. 23, 2015, pp. 1-20, with English translation thereof.
"Written Opinion of the International Searching Authority of PCT/JP2012/053694", this report contains the following items: Form PCT/ISA237 (cover sheet), PCT/ISA237 (Box No. 1), PCT/ISA237 (Box No. IV), PCT/ISA237 (Box No. V) and PCT/ISA237 (Box No. VIII), mailed on May 1, 2012, which is English translation of "Written Opinion of the International Searching Authority", pp. 1-16.
"Office Action of Taiwan Counterpart Application", issued on Jul. 22, 2015, p. 1-p. 10, with English translation thereof.

* cited by examiner

*Primary Examiner* — Carol M Koslow
(74) *Attorney, Agent, or Firm* — Jianq Chyun IP Office

(57) ABSTRACT

The invention provides a resin composition having an excellent dispersibility of a phosphor, and when the resin composition is processed and used as a color conversion material, to give a hardened material having a high heat resistance, resistance to thermal yellowing, light resistance, transparency and refractive index, and an excellent adhesion to allow color conversion of light emitted from an optical semiconductor stably and without a flare spot over a long period of time. The invention also relates to a hardening resin composition having at least one of epoxy and oxetanyl.

14 Claims, No Drawings

HARDENING RESIN COMPOSITION AND COLOR CONVERSION MATERIAL USING THE SAME

CROSS-REFERENCE TO RELATED APPLICATION

This application is a 371 application of an international PCT application serial no. PCT/JP2012/053694, filed on Feb. 16, 2012, which claims the priority benefit of Japan application no. 2011-033970, filed on Feb. 18, 2011. The entirety of each of the above-mentioned patent applications is hereby incorporated by reference herein and made a part of this specification.

TECHNICAL FIELD

The invention relates to a hardening resin composition that contains a silicon compound having an epoxy group and is prepared by composing a phosphor, and is useful for an application such as a coating agent, an optical material and an electronic material, and relates to a hardened material obtained by hardening the hardening resin composition.

BACKGROUND ART

A light emitting diode (LED) has rapidly spread recently. With regard to a light emitting apparatus, such as the light emitting diode (LED) that has widely spread for use in a large display such as a TV and a PC, an information terminal for a touch panel, a cell phone and a smartphone, and lighting, a trend is to achieve high brightness. In such a current situation, high performance is also required for a sealing material used for the devices.

A method has been tried so far for performing resin sealing of an LED or the like by using as the sealing material a novolak-based epoxy resin, a cycloaliphatic epoxy resin or an acrylic resin, and hardening with acid anhydride or a polymerization initiator (see Patent literature Nos. 1 and 2, for example). However, the resins are deteriorated by heat or ultraviolet light from a light emitting device not to allow maintenance of high transparency, and thus have a disadvantage of causing colorization.

As a sealing material having a high transparency, a dimethyl silicone-based resin has been used (see Patent literature Nos. 3 and 4, for example). The resins are hardened by condensation between silanol groups, a hydrosilylation reaction between a carbon-to-carbon double bond and a SiH group using a platinum catalyst, a reactive functional group such as an epoxy group, or the like.

A resin mainly formed of dimethyl silicone can keep a higher transparency over a long period of time, even when exposed to heat or light, in comparison with a conventional epoxy resin, and therefore has been widely used as the sealing material for the LED or the like. However, the resin has problems such as a low adhesion to a base material, a lower refractive index of the resin in comparison with a value required as the sealing material, tackiness on a surface of a resin hardened material during LED manufacture, and easy scratching of a surface due to softness of a hardened film, and thus a further improvement has been required for the resin.

On the other hand, a siloxane-based resin synthesized by a sol-gel process has bee also studied as an LED sealing material (Patent literature Nos. 5 and 6). However, while the resin has a high surface hardness, the resin has a crack caused during hardening, distortion of a film by shrinkage during hardening, a low compatibility with other molecules, and therefore is not dissolved to be transparent without adding a large amount of diluent to cause a low viscosity, and thus the phosphor is easily settled out. Moreover, when a large amount of diluent formed of an organic component is added, a ratio of silicon in a resin composition decreases, and if exposed to heat or light for a long period of time, the resin has a problem such as a decrease in transparency.

Various types have been proposed for an optical semiconductor device package and a method for manufacturing the package. Above all, with regard to a resin composition containing a phosphor, a sheet for sealing an optical semiconductor, or the like, when the phosphor is uniformly dispersed into the resin composition, a fluctuation in chromaticity is minimized, and high brightness can be maintained (see Patent literature Nos. 7, 8 and 9, for example).

Thus, when a resin composition in which dispersibility of the phosphor is improved, or a processed sheet for sealing the semiconductor is used, an optical semiconductor package having a higher brightness can be produced. However, when the resin composition is provided as the sheet for sealing the semiconductor, a method for manufacturing the optical semiconductor package is limited.

Moreover, in a case where the phosphor is dispersed into the resin composition, the phosphor sinks during molding, and therefore is unevenly distributed. In a case where a plurality of color conversion materials are used, specific gravity of each material is different, and therefore the materials are not uniformly dispersed. Thus, the case has a problem of generation of color unevenness.

Furthermore, in a case where a device that emits light having a short wavelength, such as an ultraviolet light-emitting device, is used, the resin into which the phosphor is dispersed deteriorates by light from the device, and thus the case also has a problem of causing a change of color.

Accordingly, a liquid resin composition containing the phosphor is required to have an excellent dispersibility of the phosphor, and simultaneously in a case where the resin composition is processed and used as the color conversion material, to have a high heat resistance, resistance to thermal yellowing, transparency or surface hardness, and an excellent adhesion to a base material. However, a resin composition having a balance among various characteristics described above has not existed yet. Therefore, a resin composition having a good balance among the characteristics is desired.

On the other hand, a sealing process in manufacture of the optical semiconductor package has been applied by thermosetting so far in many cases, in which several hours are required in order to sufficiently harden the composition. In such a situation, a need is present for requiring a material that can increase a production rate.

CITATION LIST

Patent Literature

Patent literature No. 1: JP S61-112334 A.
Patent literature No. 2: JP H02-289611 A.
Patent literature No. 3: JP 2003-273292 A.
Patent literature No. 4: JP 2006-299099 A.
Patent literature No. 5: JP 2004-238589 A.
Patent literature No. 6: JP 2004-359933 A.
Patent literature No. 7: JP 2003-37295 A.
Patent literature No. 8: JP 2009-84511 A.
Patent literature No. 9: JP 2010-123802 A.

SUMMARY OF INVENTION

Technical Problem

An object of the invention is to provide a resin composition having an excellent dispersibility of a phosphor, and simultaneously when the composition is processed and used as a color conversion material, to give a hardened material having a high heat resistance, resistance to thermal yellowing, light resistance or transparency, an excellent surface hardness and an excellent adhesion to a base material to allow color conversion of light emitted from an optical semiconductor stably without a flare spot over a long period of time.

Solution to Problem

The present inventors have diligently continued to conduct research for achieving the object. As a result, the present inventors have found that the object can be achieved by using a hardening resin composition having a constitution described below, and thus have completed the invention.

More specifically, the invention has the constitution described below.

Item 1. A hardening resin composition containing (A) to (E) below:

(A) a silicon compound that is obtained by performing a hydrosilylation reaction among compound (a), compound (b), and when necessary, compound (c) below, and has at least one of epoxy and oxetanyl, wherein
compound (a) is at least one of silicone and silsesquioxane having two or more of SiH in one molecule,
compound (b) is a compound having at least one of epoxy and oxetanyl, and alkenyl having 2 to 18 carbons in one molecule, and compound (c) is at least one of silicone and silsesquioxane having two or more of alkenyl in one molecule;
(B) a phosphor;
(C) an epoxy resin;
(D) a hardening agent; and
(E) an antioxidant.

Item 2. The hardening resin composition according to item 1, wherein compound (a) is at Least one kind selected from the group of compounds represented by formula (a-1) to formula (a-10) below, compound (b) is at least one kind selected from the group of compounds represented by formula (b-1) to formula (b-3) below, and compound (c) in a case where compound (c) is used when necessary is at least one kind selected from the group of compounds represented by formula (c-1) and (c-2).

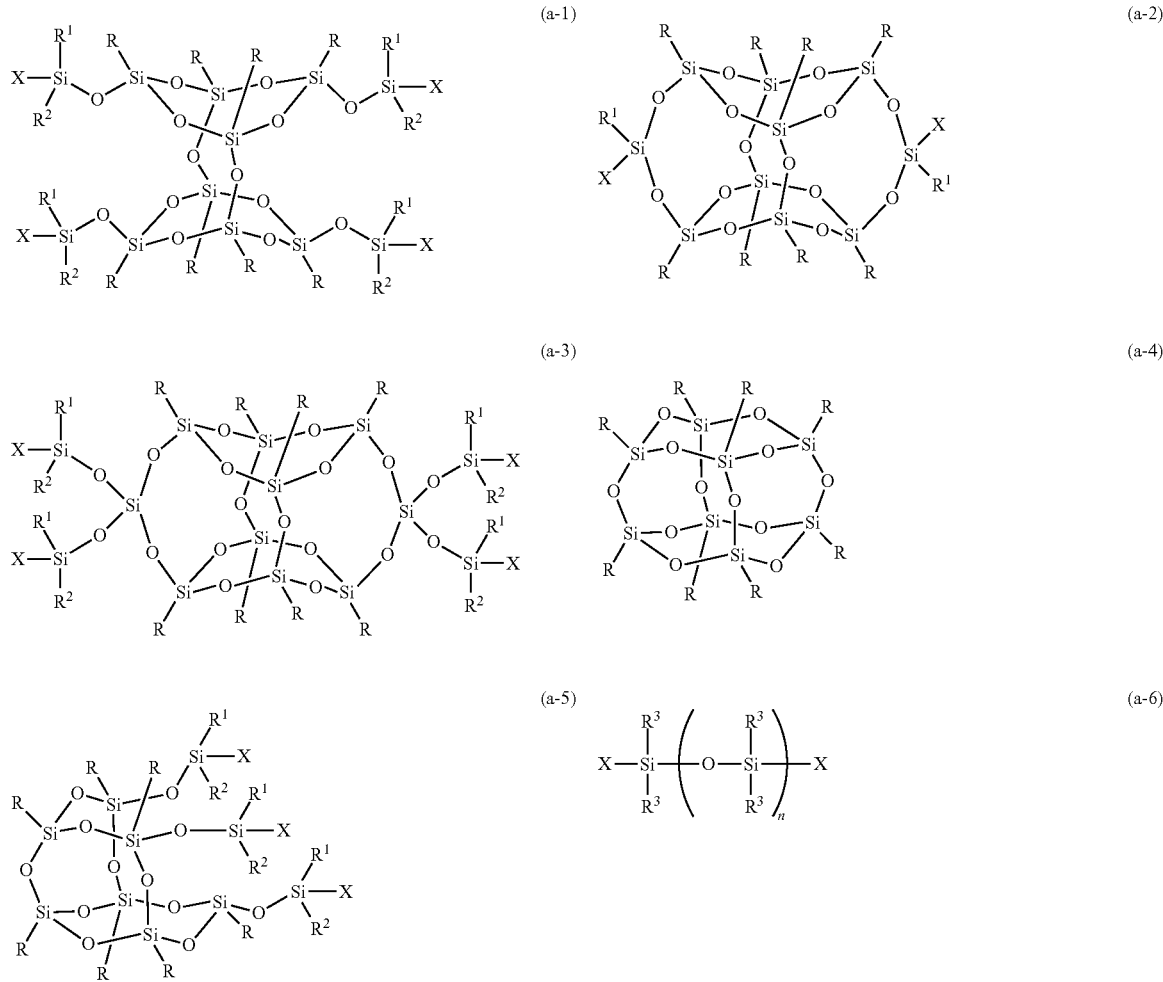

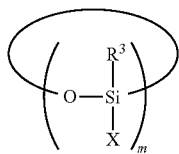 (a-7)

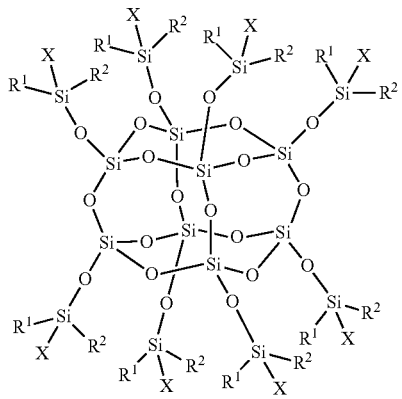 (a-8)

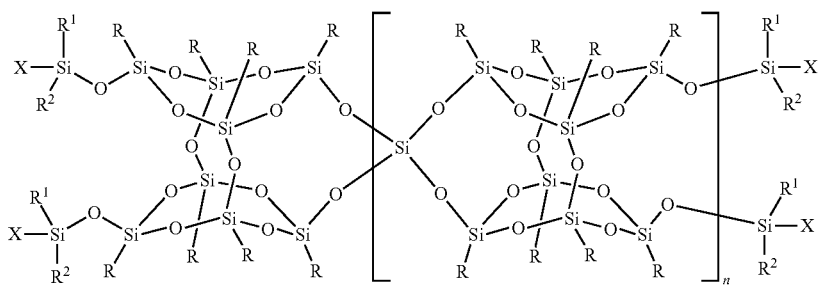 (a-9)

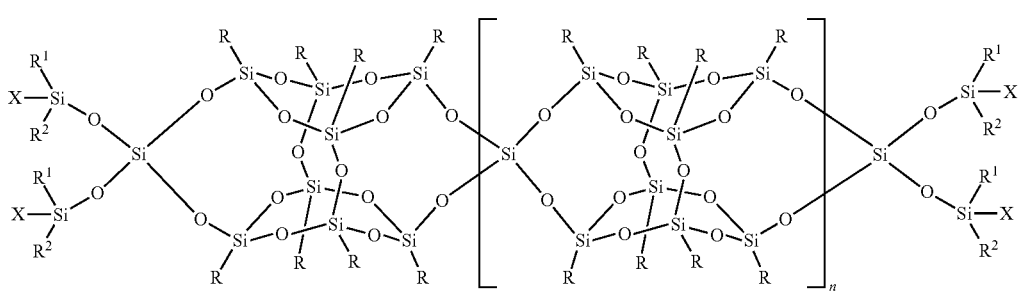 (a-10)

In formula (a-1) to formula (a-10), R is a group independently selected from alkyl having 1 to 45 carbons, cycloalkyl having 4 to 8 carbons, aryl having 6 to 14 carbons and arylalkyl having 7 to 24 carbons; in the alkyl having 1 to 45 carbons, arbitrary hydrogen may be replaced by fluorine, and arbitrary non-adjacent —$CH_2$— may be replaced by —O— or —CH=CH—; in a benzene ring in the aryl and the arylalkyl, arbitrary hydrogen may be replaced by halogen or alkyl having 1 to 10 carbons, and in the alkyl having 1 to 10 carbons, arbitrary hydrogen may be replaced by fluorine, and arbitrary non-adjacent —$CH_2$— may be replaced by —O— or —CH=CH—; the number of carbons of alkylene in the arylalkyl is 1 to 10, and arbitrary non-adjacent —$CH_2$— may be replaced by —O—; $R^1$ and $R^2$ are a group independently selected from alkyl having 1 to 4 carbons, cyclopentyl, cyclohexyl and phenyl; $R^3$ is a group independently selected from alkyl having 1 to 4 carbons, cyclopentyl, cyclohexyl and phenyl; at least two of X, in one molecules of each compound, are hydrogen, and the rest of X is a group independently selected from alkyl having 1 to 4 carbons, cyclopentyl, cyclohexyl and phenyl; and n is an integer from 0 to 100, and m is an integer from 3 to 10.

 (b-1)

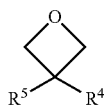 (b-2)

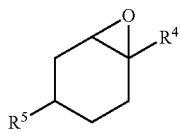 (b-3)

In formulas (b-1) to (b-3), at least one of $R^4$ and $R^5$ is alkenyl having 2 to 10 carbons, and one of —$CH_2$— in the alkenyl may be replaced by —O— or 1,4-phenylene, and the other is hydrogen or alkyl having 1 to 6 carbons.

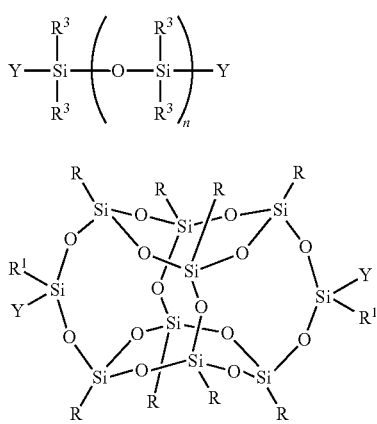

(c-1)

(c-2)

In formula (c-1) and formula (c-2), R and $R^3$ are a group defined in a manner similar to the definitions of R and $R^3$ in formula (a-6) and formula (a-7) above, $R^1$ is a group independently selected from alkyl having 1 to 4 carbons, cyclopentyl, cyclohexyl and phenyl, Y is a group independently selected from vinyl and allyl, and n is an integer from 0 to 100.

Item 3. The hardening resin composition according to item 1 or 2, wherein compound (a) is a silsesquioxane derivative represented by formula (a-1-1) below.

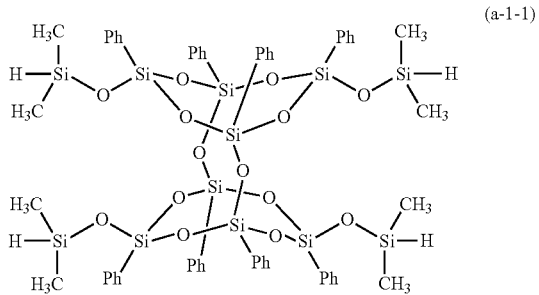 [SMILES: C[SiH](C)O[Si]1(c2ccccc2)O[Si]2(c3ccccc3)O[Si](O[SiH](C)C)(c3ccccc3)O[Si](c3ccccc3)(O1)O[Si]1(c3ccccc3)O[Si](O[SiH](C)C)(c3ccccc3)O[Si](c3ccccc3)(O[Si](O[SiH](C)C)(c3ccccc3)O1)O2]

(a-1-1)

Item 4. The hardening resin composition according to any one of items 1 to 3, wherein compound (b) is one kind or two kinds selected from the group of compounds represented by formula (b-1-1), formula (b-2-1), formula (b-2-2), formula (b-3-1) and formula (b-3-2) below.

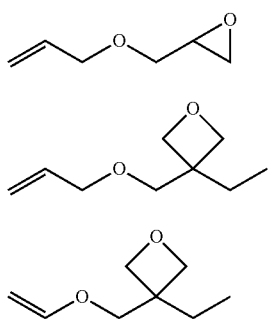

(b-1-1)

(b-2-1)

(b-2-2)

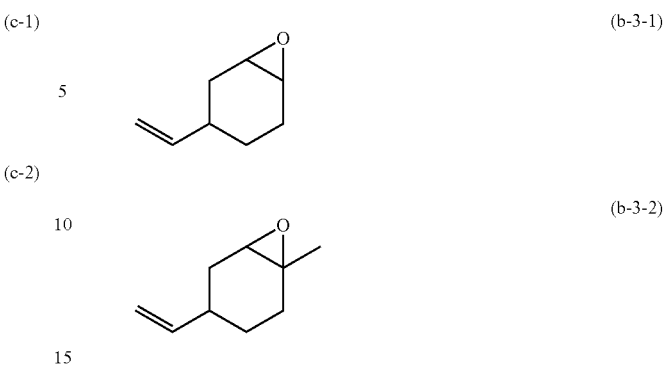

(b-3-1)

(b-3-2)

Item 5. The hardening resin composition according to any one of items 1 to 4, wherein compound (c) is represented by formula (c-1-1) or formula (c-2-1) below.

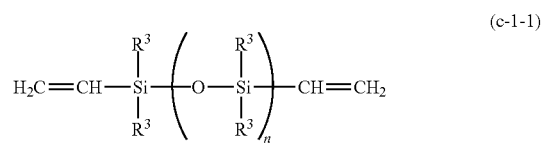

(c-1-1)

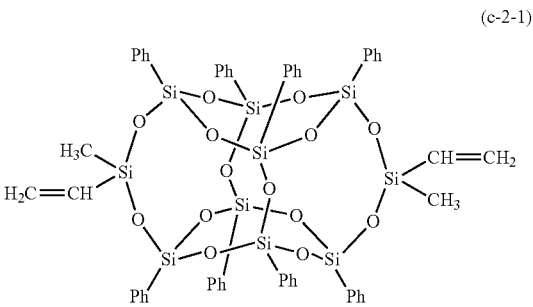

(c-2-1)

Item 6. The hardening resin composition according to any one of items 1 to 5, wherein the silicon compound represented by (A) and having the epoxy group is polysilsesquioxane represented by formula (α).

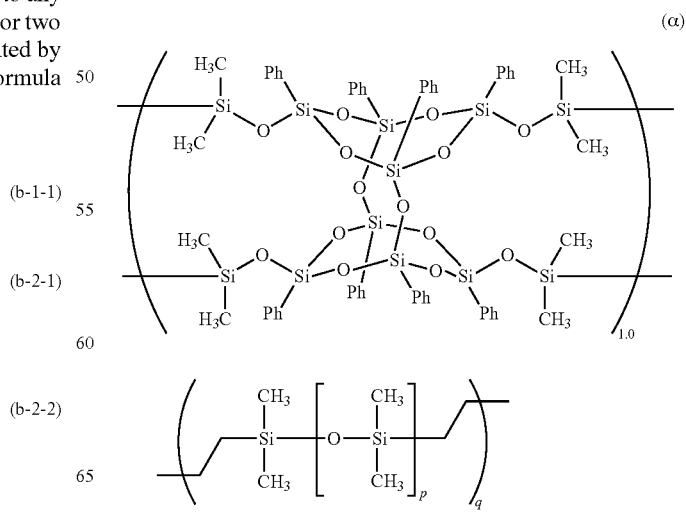

(α)

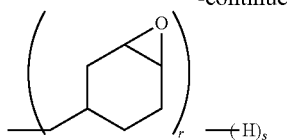

In formula (α), p is an integer from 1 to 100, q and r each are a value satisfying expressions: 0≤q≤1.95 and 0.1≤r≤4, s is a value satisfying an expression: 0≤s≤3, and q, r and s each are a value satisfying an expression: 2q+r+s≤4.

Item 7. The hardening resin composition according to any one of items 1 to 5, wherein the silicon compound having the epoxy and represented by (A) is silsesquioxane represented by formula (β).

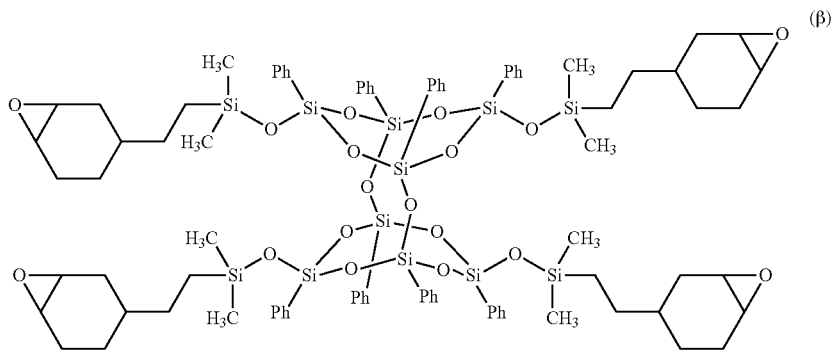 [SMILES: C[Si](C)(CCC1CCC2OC2C1)O[Si]1(c2ccccc2)O[Si]2(c3ccccc3)O[Si](O[Si](C)(C)CCC3CCC4OC4C3)(c3ccccc3)O[Si](c3ccccc3)(O1)O[Si]1(c3ccccc3)O[Si](O[Si](C)(C)CCC3CCC4OC4C3)(c3ccccc3)O[Si](c3ccccc3)(O[Si](O[Si](C)(C)CCC3CCC4OC4C3)(c3ccccc3)O1)O2]

Item 8. The hardening resin composition according to any one of items 1 to 7, wherein the phosphor represented by (B) is a phosphor for a white LED.

Item 9. The hardening resin composition according to any one of items 1 to 8, wherein the epoxy resin represented by (C) is an epoxy resin represented by formula (γ1) or (γ2), and has at least one of the epoxy resins.

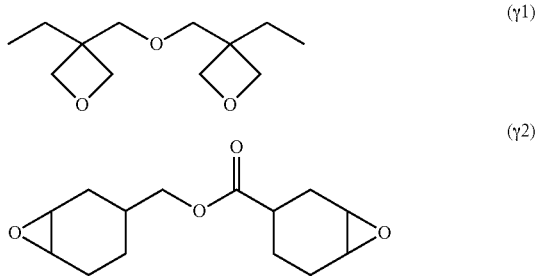

Item 10. The hardening resin composition according to any one of items 1 to 9, wherein the hardening agent represented by (D) is a thermal cationic polymerization agent or a photo-cationic polymerization initiator.

Item 11. The hardening resin composition according to any one of items 1 to 10, wherein the antioxidant represented by (E) is a phenolic antioxidant, or a phosphorus-based antioxidant and a phenolic antioxidant.

Item 12. A hardened material in a form of a film, a sheet or a coating film, obtained by applying onto a transparent base material the hardening resin composition according to any one of items 1 to 11, and hardening an applied product by heating or light irradiation.

Item 13. A color conversion material containing the hardened material according to item 12.

Item 14. An optical semiconductor device including the color conversion material according to item 13.

Advantageous Effects of Invention

A hardening resin composition of the invention has an excellent dispersibility of a phosphor, and a hardened material of the hardening resin composition has a high heat resistance, resistance to thermal yellowing, transparency, light resistance and refractive index, and an excellent adhesion to a base material, and has stress-relaxation properties. Therefore, neither a crack nor distortion is caused in a hardened film during hardening, a surface of the hardened film is flat, and has a proper surface hardness. A color conversion material containing the hardened material can perform color conversion of light emitted from an optical semiconductor stably without a flare spot over a long period of time. Moreover, in manufacturing of an optical semiconductor device package, the hardening resin composition can be provided in the form of a varnish or the like, and further a sealing resin can be hardened quickly by light irradiation, and thus the resin composition is handled with easiness.

DESCRIPTION OF EMBODIMENTS

Terms used in the invention will be explained.

A compound represented by formula (I) may be occasionally described as compound (I). Any compound represented by any other formula may be occasionally abbreviated and referred to in a similar manner.

A term "arbitrary" in the invention means any of not only positions but also the numbers. Then, an expression "arbitrary A may be replaced by B or C" means inclusion of a case where at least one of A is replaced by B, a case where at least one of A is replaced by C, and also a case where at least one of A is replaced by B, and simultaneously at least one of other A is replaced by C.

In addition, setting in which arbitrary —CH$_2$— in alkyl or alkylene may be replaced by —O— does not include a case where all of plurality of consecutive —CH$_2$— are replaced by —O—.

In Examples, data displayed on an electronic balance are expressed in terms of g (gram) being a mass unit. Percent by mass or a mass ratio is expressed in terms of data based on such a numeric value.

Hardening Resin Composition

A hardening resin composition of the invention contains, as being hardenable by heating or light irradiation, (A) a silicon compound having at least one of epoxy and oxetanyl, (B) a phosphor, (C) an epoxy resin, (D) a hardening agent, and when necessary, can contain a silane coupling agent.

(A) Silicon Compound Having an Epoxy Group

An organosilicon compound having an epoxy group contained in the hardening resin composition according to the invention is obtained by a hydrosilylation reaction between compound (a) and compound (b), or a hydrosilylation reaction among compound (a), compound (b) and compound (c), as described below.

Compound (a) is at least one of silicone and silsesquioxane having two or more Si—H groups in one molecule, preferably, silsesquioxane. Molecular weight of compound (a) is preferably 100 to 500,000, particularly preferably, 1,000 to 100,000.

Compound (b) is a compound having at least one of epoxy and oxetanyl, and alkenyl having 2 to 18 carbons in one molecule, preferably, has one or more of at least one of epoxy and oxetanyl in one molecule.

Compound (c) is at least one of silicone and silsesquioxane having two or more of alkenyl in one molecule. Molecular weight of compound (c) is preferably 100 to 500,000, particularly preferably, 150 to 10,000.

A ratio of constitutional units from compound (a), compound (b) and compound (c), respectively, in (A) the silicon compound having at least one of epoxy and oxetanyl to be used in the invention, when a mole fraction of each compound is defined to be ω, ψ and φ, respectively, preferably satisfies expressions:

{ω×the number of SiH groups included in one molecule of compound (a)}≤{ψ×the number of alkenyl included in one molecule of compound (b)}+{φ×the number of alkenyl included in one molecule of compound (c)}.

With regard to the hydrosilylation reaction among compound (a), compound (b) and compound (c), compound (a), compound (b) and compound (c) may be simultaneously added to perform the hydrosilylation reaction, but preferably, first, a hydrosilylation reaction between compound (a) and compound (c) is allowed so as to be "the number of moles of SiH groups included in (a)>the number of moles of alkenyl included in (c)," and then an excessive amount of compound (b) is added to allow a hydrosilylation reaction between an unreacted SiH group and alkenyl of compound (b).

The hydrosilylation reaction is preferably performed in a solvent. The solvent used for the hydrosilylation reaction is not particularly limited, if the solvent does not adversely affect progress of the reaction. Specific examples of preferred solvents include a hydrocarbon solvent such as hexane and heptane, an aromatic hydrocarbon solvent such as benzene, toluene and xylene, an ether solvent such as diethyl ether, tetrahydrofuran (THF) and dioxane, a halogenated hydrocarbon solvent such as methylene chloride and carbon tetrachloride, and an ester solvent such as ethyl acetate.

The solvents may be used alone or in combination with a plurality of the solvents. Among the solvents, an aromatic hydrocarbon solvent is preferred, and in the solvents, toluene is most preferred.

The hydrosilylation reaction may be performed at room temperature. Heating may be applied in order to accelerate polymerization. Cooling may be applied in order to control development of heat by polymerization, undesired polymerization or the like. In hydrosilylation polymerization, a catalyst can be used when necessary.

When a hydrosilylation catalyst is added, polymerization can be progressed more easily. As the hydrosilylation catalyst, a Karstedt catalyst, a Speier catalyst, hexachloroplatinic acid or the like can be preferably utilized.

The hydrosilylation catalysts have a high reactivity, and therefore the reaction can be sufficiently progressed by adding a small amount thereof. An amount of use is preferably $10^{-9}$ to 1 mol %, further preferably, $10^{-7}$ to $10^{-3}$ mol % in terms of a ratio of a transition metal contained in the catalyst to a hydroxyl group.

Specific examples of compound (a) include compounds represented by formula (a-1) to formula (a-10) below.

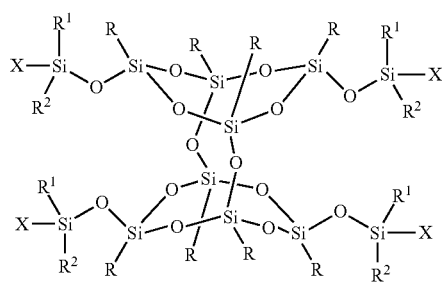

(a-1)

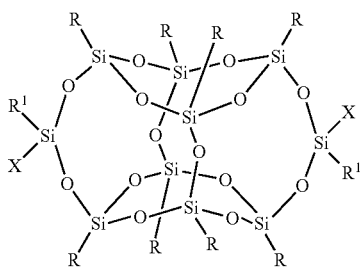

(a-2)

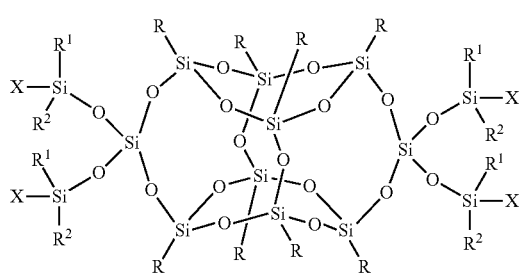

(a-3)

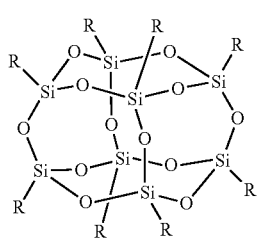

(a-4)

-continued

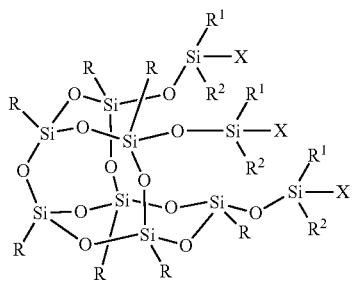
(a-5)

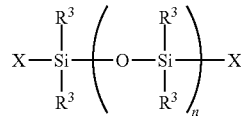
(a-6)

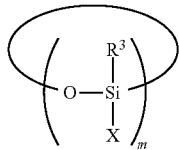
(a-7)

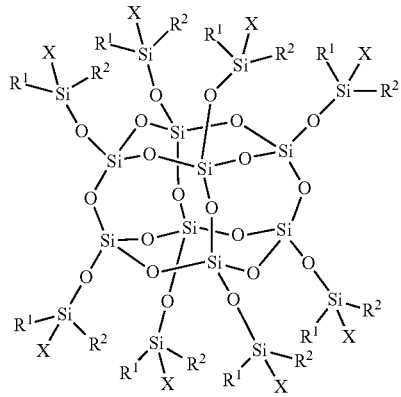
(a-8)

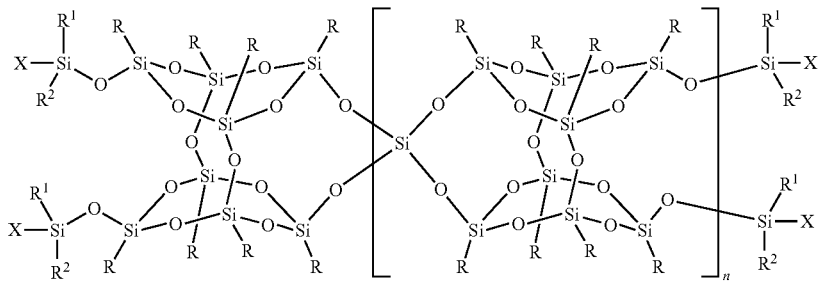
(a-9)

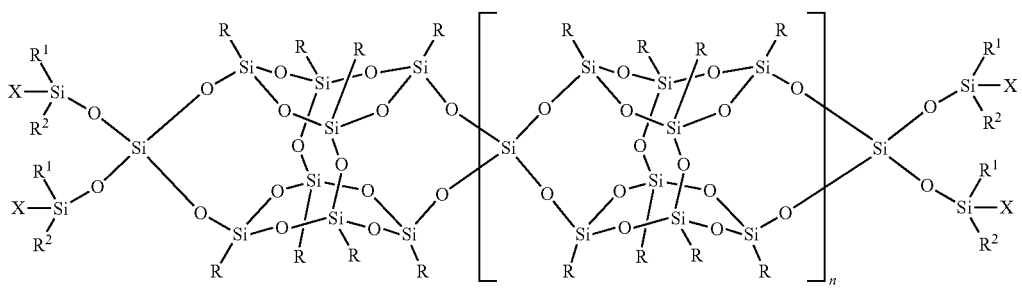
(a-10)

In formula (a-1), formula (a-2), formula (a-3), formula (a-4), formula (a-5), formula (a-9) and formula (a-10), R is a group independently selected from alkyl having 1 to 45 carbons, cycloalkyl having 4 to 8 carbons, aryl having 6 to 14 carbons and arylalkyl having 7 to 24 carbons.

In the alkyl having 1 to 45 carbons, arbitrary hydrogen may be replaced by fluorine, and arbitrary non-adjacent —CH$_2$— may be replaced by —O— or —CH=CH—.

In a benzene ring in the aryl having 6 to 14 carbons and the arylalkyl having 7 to 24 carbons, arbitrary hydrogen may be replaced by halogen or alkyl having 1 to 10 carbons. In the alkyl having 1 to 10 carbons, arbitrary hydrogen may be replaced by fluorine, and arbitrary non-adjacent —CH$_2$— may be replaced by —O— or —CH=CH—.

The number of carbons of alkylene in the arylalkyl is 1 to 10, and arbitrary non-adjacent —CH$_2$— may be replaced by —O—.

R is preferably a group independently selected from cyclopentyl, cyclohexyl, phenyl, and alkyl having 1 to 10 carbons. In the alkyl having 1 to 10 carbons, arbitrary hydrogen may be replaced by fluorine, and arbitrary non-adjacent —CH$_2$— may be replaced by —O—. Moreover, in the phenyl, arbitrary hydrogen may be replaced by halogen such as fluorine, or alkyl having 1 to 10 carbons.

R is further preferably cyclopentyl, cyclohexyl, or phenyl in which arbitrary hydrogen may be replaced by chlorine, fluorine, methyl, methoxy or trifluoromethyl, still further preferably, cyclohexyl or phenyl, most preferably, phenyl.

In formula (a-1), formula (a-2), formula (a-3), formula (a-5), formula (a-8), formula (a-9) and formula (a-10), $R^1$ and $R^2$ are a group independently selected from alkyl having 1 to 4 carbons, cyclopentyl, cyclohexyl and phenyl. Examples of the alkyl having 1 to 4 carbons are methyl, ethyl, propyl, 2-methylethyl, butyl and t-butyl. Preferred examples of $R^1$ or $R^2$ are methyl and phenyl. $R^4$ and $R^5$ are preferably an identical group.

In formula (a-6) and formula (a-7), $R^3$ is a group independently selected from alkyl having 1 to 4 carbons, cyclopentyl, cyclohexyl and phenyl. Examples of the alkyl having 1 to 4 carbons are methyl, ethyl, propyl, 2-methylethyl, butyl and t-butyl.

In formula (a-1) to formula (a-10), in one molecule of each compound, at least two of X are hydrogen, and the rest of X is a group independently selected from alkyl having 1 to 4 carbons, cyclopentyl, cyclohexyl and phenyl.

In formula (a-6), formula (a-9) and formula (a-10), n is an integer from 0 to 100, and in formula (a-7), m is an integer from 3 to 10.

As compound (a), a compound represented by formula (a-1-1) below is further preferred.

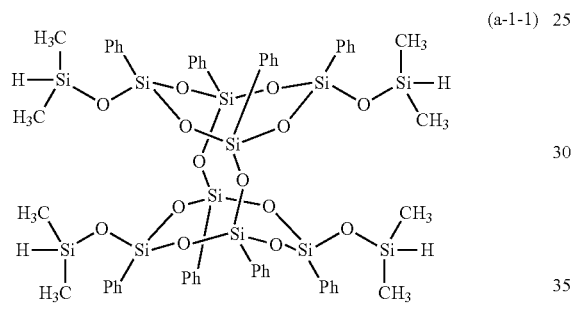
(a-1-1)

In formula (a-1-1), Ph stands for phenyl. A compound represented by formula (a-1-1) can be prepared by the method described in WO 2004/024741 A. Moreover, other compounds can also be obtained by publicly known methods.

Specific examples of compound (b) include a compound represented by formula (b-1), formula (b-2) or formula (b-3) below.

(b-1)

(b-2)

(b-3)

In formulas (b-1), (b-2) and (b-3), one of $R^4$ and $R^5$ is alkenyl having 2 to 10 carbons, and one of —$CH_2$— in the alkenyl may be replaced by —O— or 1,4-phenylene, and the other is hydrogen or alkyl having 1 to 6 carbons.

Specific examples of further preferred compound (b) include a compound represented by formula (b-1-1), formula (b-2-1), formula (b-2-2), formula (b-3-1) or formula (b-3-2) below.

(b-1-1)

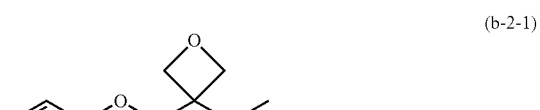
(b-2-1)

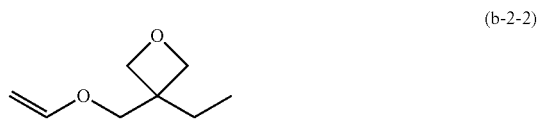
(b-2-2)

(b-3-1)

(b-3-2)

In addition, as a compound represented by formula (b-2-2), EOXTVE sold by Maruzen Petrochemical Co., Ltd. can be used, and as a compound represented by formula (b-3-1), CELLOXIDE 2000 sold by Daicel Chemical Industries, Ltd. can be used.

Specific examples of compound (c) include a compound represented by formula (c-1) or formula (c-2) below.

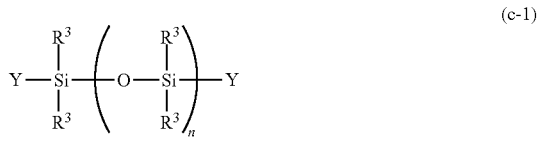
(c-1)

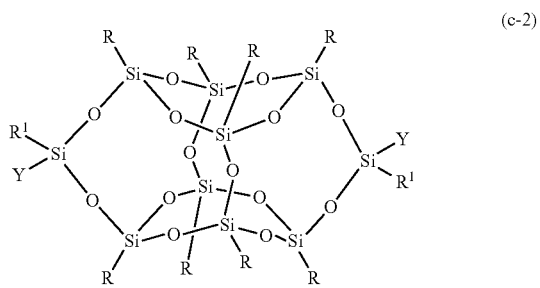
(c-2)

In formula (c-1), $R^3$ is a group defined in a manner similar to the definitions of $R^3$ in formula (a-6) or formula (a-7) above, and a preferred group is also defined in a similar manner.

In formula (c-2), R and $R^1$ are a group independently selected from alkyl having 1 to 4 carbons, cyclopentyl, cyclohexyl and phenyl. In formula (c-1) and formula (c-2), Y is a group independently selected from vinyl and allyl. In formula (c-1), n is an integer from 0 to 100.

As compound (c), a compound represented by formula (c-1) or (c-2-1) below is further preferred. In formula (c-1), $R^3$ is independently selected from methyl or phenyl, and n is an integer from 0 to 100.

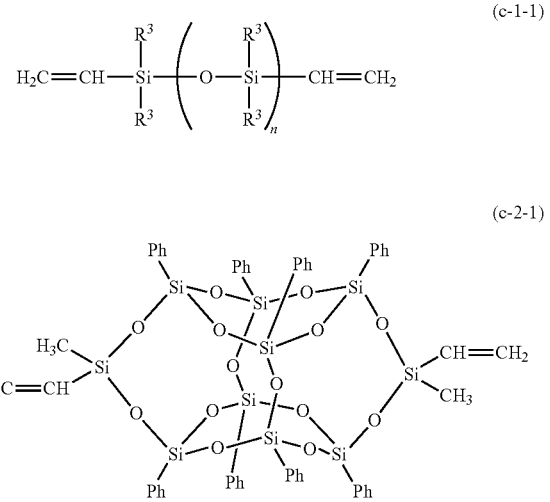

Specific examples of compounds represented by formula (c-1-1) include 1,3-divinyl-1,1,3,3-tetramethyldisiloxane, 1,3-divinyl-1,3-dimethyl-1,3-diphenyldisiloxane and vinyl terminated polydimethylsiloxane at both terminals.

(A) The silicon compound having the epoxy group used for the invention is preferably polysilsesquioxane represented by formula (α) below.

(A) The silicon compound having the epoxy group used for the invention is further preferably polysilsesquioxane represented by formula (β) below.

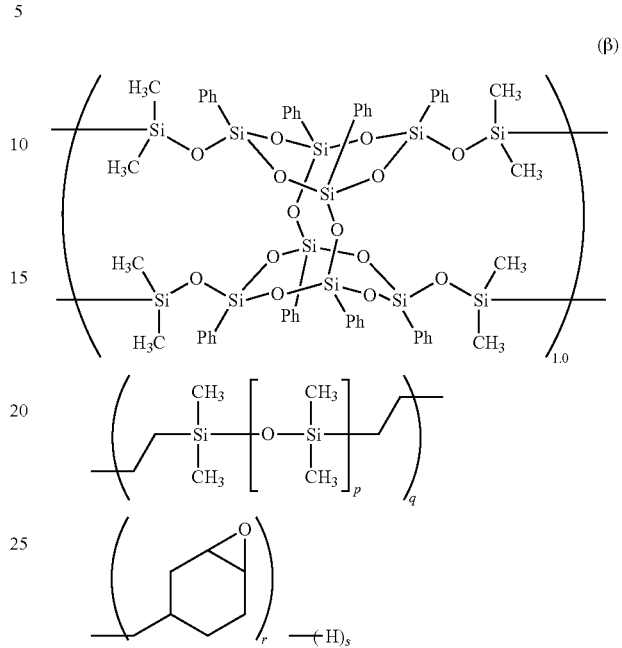

In formula (β), p is an integer from 1 to 100, and preferably, q and r each are a value satisfying expressions: $0 \leq q \leq 1.95$ and $0.1 \leq r \leq 4$, s is a value satisfying an expression: $0 \leq s \leq 3$, and q, r and s each are a value satisfying an expression: $2q+r+s \leq 4$, and q, r and s each satisfy expressions: $0.3 \leq q \leq 1$, $2 \leq r \leq 3.5$, and $0 \leq s \leq 1$.

Content of (A) the silicon compound having at least one of epoxy and oxetanyl in the hardening resin composition according to the invention is preferably 20 to 90% by mass, further preferably, 50 to 80% by mass, based on the total amount of the hardening resin composition. When the content is adjusted in the above range, the composition exhibits excellent characteristics with regard to heat resistance, transpar-

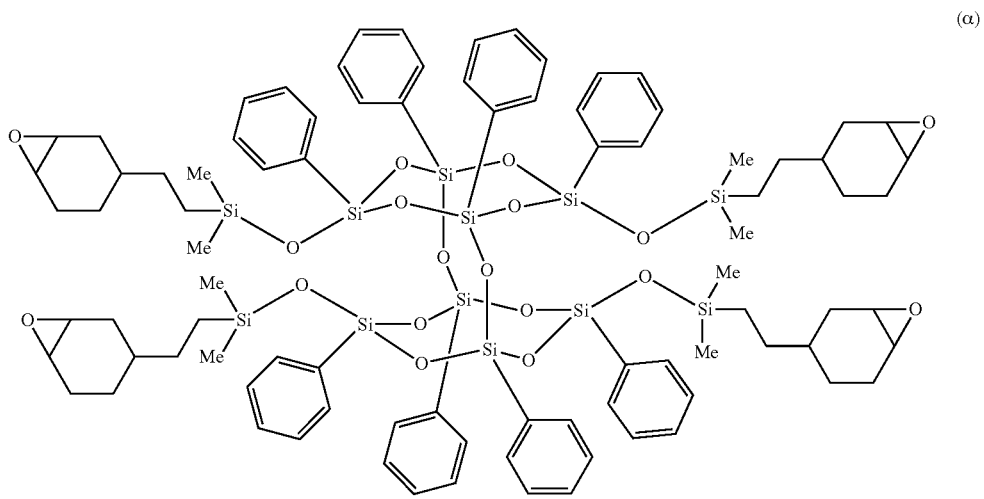 [SMILES: C[Si](C)(CCC1CCC2OC2C1)O[Si]1(c2ccccc2)O[Si]2(c3ccccc3)O[Si](O[Si](C)(C)CCC3CCC4OC4C3)(c3ccccc3)O[Si](c3ccccc3)(O1)O[Si]1(c3ccccc3)O[Si](O[Si](C)(C)CCC3CCC4OC4C3)(c3ccccc3)O[Si](c3ccccc3)(O[Si](O[Si](C)(C)CCC3CCC4OC4C3)(c3ccccc3)O1)O2]

ency, resistance to yellowing, resistance to thermal yellowing, light resistance, surface hardness, adhesion and optical cation hardening properties.

(B) Phosphor

The hardening resin composition of the invention contains a phosphor. The phosphor is preferably inorganic particles used as a phosphor for a light emitting diode (LED), further preferably, a phosphor for a white LED.

Specific examples of the phosphors include $(Y,Gd)_3(Al, Ga)_5O_{12}:Ce^{3+}$ that is referred to as YAG and widely utilized, $(Ba,Sr,Ca)_2SiO_4:Eu^{2+}$, and $CaAlSiN_3:Eu^{2+}$ being a nitride phosphor.

Content of (B) the phosphor in the hardening resin composition according to the invention is preferably 5 to 50% by mass because the content is deeply related to transmittance of light transmitted through the color conversion material, and color.

If the content of the phosphor in the hardening resin composition is 50% by mass or less, the transmittance does not decrease and the brightness does not decrease, and if the content is 5% by mass or more, the color of transmitted light does not change.

(C) Epoxy Resin

The hardening resin composition of the invention can contain an epoxy resin. In the invention, a compound including an oxetane compound being 4-membered ring cyclic ether or an oxetane resin may be occasionally referred to as the epoxy resin.

Specific examples of the epoxy resins include a hydrogenated bisphenol A epoxy resin, and a compound represented by formula (γ1) or (γ2) below.

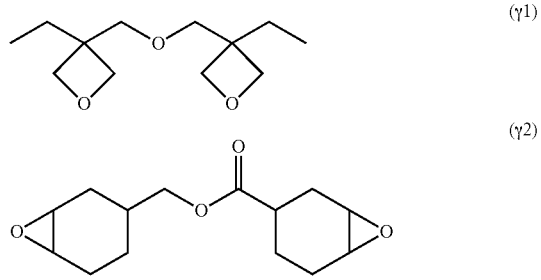

(γ1)

(γ2)

As the epoxy resin represented by formula (γ1) among types of the compounds, for example, Aron Oxetane DOX (trade name) made by Toagosei Co., Ltd. is sold, and easily available.

Moreover, the epoxy resin represented by formula (γ2) is commercially available, for example, as CELLOXIDE (trade name) 2021 P made by Daicel Chemical Industries, Ltd., and is easily available.

Content of (C) the epoxy resin in the hardening resin composition according to the invention is preferably 0.1 to 80% by mass, further preferably, 1 to 40% by mass, based on the total amount of the hardening resin composition. When the content is adjusted in the above range, adhesion of the hardening resin to the substrate can be improved, and viscosity of the hardening resin composition can also be adjusted.

(D) Hardening Agent

A hardening agent may be appropriately selected according to a kind of (A) the silicon compound having at least one of epoxy and oxetanyl to be used. For example, in the case of the compounds represented by formulas (a-1) to (a-10) above, the hardening agent may be appropriately selected according to a kind of X to be used, and ordinarily, a cationic polymerization initiator is preferably used.

Specific examples of the cationic polymerization initiators include an active energy-ray cationic polymerization initiator that generates cationic species or Lewis acid by active energy rays such as ultraviolet light, and a thermal cationic polymerization initiator that generates cationic species or Lewis acid by heat.

Specific examples of the active energy-ray cationic polymerization initiators include a metal fluoroboron complex, a boron trifluoride complex compound, a bis(perfluoroalkylsulfonyl)methane metal salt, an aryl diazonium compound, a dicarbonyl chelate of elements of Groups IIIa to Va in the Periodic Table, a thiopyrylium salt, $MF_6$ (elements of Group VIb in the Periodic Table in the form of an anion; wherein M is selected from phosphorus, antimony and arsenic), an aryl sulfonium complex salt, an aromatic iodonium complex salt, an aromatic sulfonium complex salt and a bis[4-(diphenylsulfonio)phenyl]sulfide-bis-hexafluoro metal salt. In addition thereto, a mixed ligand metal salt of an iron compound can also be used.

Moreover, specific examples of the active energy-ray cationic polymerization initiators include an aryl sulfonium complex salt, an aromatic sulfonium or iodonium salt of a halogen-containing complex ion, and an aromatic onium salt of elements of Groups II, Va and VIa in the Periodic Table. Some of the salts can be obtained as a commercial item.

Specific examples of the thermal cationic polymerization initiators include a cationic catalyst or protonic acid catalyst, such as a triflic acid salt and boron trifluoride, and a triflic acid salt is particularly preferred. Specific examples of the triflic acid salts include triflic acid diethyl ammonium, triflic acid diisopropyl ammonium and triflic acid ethyldiisopropyl ammonium.

On one hand, some of aromatic onium salts used as the active energy-ray cationic polymerization initiator generate cationic species by heat, and can also be used as the thermal cationic polymerization initiator.

Among the cationic polymerization initiators, an aromatic onium salt is preferred in view of an excellent balance among handling properties, latency and hardening properties. Among the aromatic onium salts, a diazonium salt, an iodonium salt, a sulfonium salt and a phosphonium salt are preferred in view of an excellent balance between handling properties and latency.

The cationic polymerization initiators may be used alone or in combination with two or more kinds.

Hardening Agent; Metal Chelate Compound

As the hardening agent, a metal chelate compound can be used. As the metal chelate compound, a composite catalyst between an organoaluminum compound and an organosilicon compound having a silanol group or a composite catalyst between an organoaluminum compound and an organosilicon compound having an alkoxy group can be used.

Specific examples of the organoaluminum compounds include an aluminum complex such as trisacetylacetonato aluminum, trisethylacetonato aluminum, tris(salicylaldehydato) aluminum and tris(o-carbonylphenolate)aluminum, an aluminum metal salt such as aluminum stearate and aluminum benzoate, and aluminum alkoxide.

Content of (D) the hardening agent in the hardening resin composition according to the invention is not particularly limited, but in order for a hardening reaction to sufficiently progress to allow obtaining of a target hardened material without causing a decrease in physical properties of the hardened material and without causing coloring to the hardened material, the content is preferably 0.007 to 10.0% by mass, further preferably, 0.01 to 1.0% by mass, based on the total amount of (A) the silicon compound having at least one of epoxy and oxetanyl, and (C) the epoxy resin.

(E) Antioxidant

An antioxidant is preferably contained in the hardening resin composition according to the invention from viewpoints of heat resistance and weather resistance. When the composition contains the antioxidant, oxidation deterioration during heating can be prevented, and coloring can be suppressed. Examples of the antioxidants include a phenolic antioxidant and a phosphorus-based antioxidant.

A ratio of compounding the antioxidant in the hardening resin composition according to the invention is preferably 0.1 to 2.0 in terms of a mass ratio on the basis of the total amount of the hardening resin composition.

Specific examples of the antioxidants include monophenols, bisphenols, polymer-type phenols, phosphites and oxaphosphaphenanthrene oxides.

Specific examples of the monophenols include 2,6-di-t-butyl-p-cresol, butylated hydroxyanisole, 2,6-di-t-butyl-p-ethylphenol and stearyl-β-(3,5-di-t-butyl-4-hydroxyphenyl) propionate.

Specific examples of the bisphenols include 2,2'-methylenebis(4-methyl-6-t-butylphenol), 2,2'-methylenebis(4-ethyl-6-t-butylphenol), 4,4'-thiobis(3-methyl-6-t-butylphenol), 4,4'-butylidenebis(3-methyl-6-t-butylphenol) and 3,9-bis[1,1-dimethyl-2-{β-(3-t-butyl-4-hydroxy-5-methylphenyl)propionyloxy}ethyl]2,4,8,10-tetraoxaspiro[5,5]undecane.

Specific examples of the polymer-type phenols include 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis[methylene-3-(3',5'-di-t-butyl-4'-hydroxyphenyepropionate]methane, bis[3,3'-bis(4'-hydroxy-3'-t-butylphenyl butyric acid]glycol ester, 1,3,5-tris(3',5'-di-t-butyl-4'-hydroxybenzyl)-S-triazine-2,4,6-(1H,3H,5H)trione and tocopherol.

Specific examples of the phosphites include triphenyl phosphite, diphenyl isodecyl phosphite, phenyl di-isodecyl phosphite, tris(nonylphenyl)phosphite, diisodecyl pentaerythritol phosphite, tris(2,4-di-t-butylphenyl)phosphite, cyclic neopentanetetrailbis(octadecyl)phosphite, cyclic neopentanetetraylbis(2,4-di-t-butylphenyl)phosphite, cyclic neopentanetetraylbis(2,4-di-t-butyl-4-methylphenyl)phosphite and bis[2-t-butyl-6-methyl-4-{2-(octadecyloxycarbonyl)ethyl}phenyl]hydrogen phosphite.

Specific examples of the oxaphosphaphenanthrene oxides include 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide and 10-decyloxy-9,10-dihydro-9-oxa-10-phosphaphenanthrene-10-oxide.

The antioxidants can be used alone, respectively, but is particularly preferably used in combination with a phenolic antioxidant and a phosphorus-based antioxidant.

Specific examples of commercially available antioxidants include "IRGANOX 1010 (trade name)" and "IRGAFOS 168 (trade name)," both made by BASF Japan Ltd. The antioxidants can be used alone, respectively, and can also be mixed and used.

Silane Coupling Agent

The hardening resin composition of the invention preferably further contains a silane coupling agent in addition to the components represented by (A) to (E) described above. When the composition contains the silane coupling agent, dispersibility of the phosphor can be improved. Specific examples of the silane coupling agents include a compound represented by a general formula below.

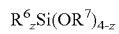

$R^6{}_z Si(OR^7)_{4-z}$

In the formula above, $R^6$ is a group having a reactive functional group represented by FG-$R^8$—, FG is an epoxy, amino group or vinyl group or (meth)acryl, and $R^8$ is linear or cyclic alkylene having 1 to 10 carbons, or phenylene. $R^7$ is alkyl having 1 to 4 carbons. Z is an integer from 0 to 3.

As the silane coupling agent in the hardening resin composition according to the invention, 2-(3,4-epoxycyclohexyl) ethyltrimethoxysilane {"Sila-Ace (registered trade name) S530" made by JNC Corporation} is particularly preferred from viewpoints of transparency and storage stability in the hardening resin composition.

Content of the silane coupling agent in the hardening resin composition according to the invention is preferably 0 to 40% by mass, further preferably, 2 to 20% by mass, based on the total amount of the hardening resin composition. When the content is adjusted in the above range, adhesion of the hardening resin composition to the substrate is improved to exhibit a high transparency.

Surface Treatment of a Phosphor

The phosphor used for the hardening resin composition according to the invention is preferably subjected to surface treatment by the silane coupling agent in order to improve dispersibility, transparency, weather resistance, moisture resistance, or the like. The silane coupling agents may be used alone in one kind, or in combination with two or more kinds arbitrarily and at an arbitrary ratio.

An amount of the silane coupling agent used onto a surface of the phosphor is not particularly limited, unless advantageous effects of a resin hardened material according to the invention are significantly adversely affected, but the amount is preferably in the range of 0.1 to 5% by mass based on the mass of the phosphor.

If the amount of the silane coupling agent used is in the range of 0.1% by mass or more based on the mass of the phosphor, a surface coating does not become incomplete, and dispersibility, transparency, weather resistance and moisture resistance can be improved, and if the amount is in the range of 5% by mass or less, light-emitting characteristics of the phosphor is not adversely affected.

Organic Solvent

The hardening resin composition of the invention may further contain an organic solvent. Here, specific examples of the organic solvents include a hydrocarbon solvent such as hexane and heptane, an aromatic hydrocarbon solvent such as benzene, toluene and xylene, an ether solvent such as diethyl ether, tetrahydrofuran (THF) and dioxane, a halogenated hydrocarbon solvent such as methylene chloride and carbon tetrachloride, an ester solvent such as ethyl acetate, and a ketone solvent such as acetone and 2-butanone. The solvents may be used alone or in combination with a plurality of kinds.

Content of the organic solvent in the hardening resin composition according to the invention is preferably 0 to 30% by mass, further preferably, 1 to 20% by mass, based on the total amount of the hardening resin composition. When the content is adjusted in the above range, viscosity of the hardening resin composition can be decreased.

Stabilizer; Ultraviolet Light Absorber

An ultraviolet light absorber may be compounded with the hardening resin composition according to the invention in order to improve light resistance. As the ultraviolet light absorber, a general ultraviolet light absorber for plastics can be used. A compounding ratio in the hardening resin composition according to the invention is preferably 0.0001 to 0.1 in teens of a mass ratio on the basis of the total amount of the hardening resin composition.

Specific examples of the ultraviolet light absorbers include salicylic acids, benzophenones, benzotriazoles and hindered amines.

Specific examples of the salicylic acids include phenyl salicylate, p-t-butylphenyl salicylate and p-octylphenyl salicylate.

Specific examples of the benzophenones include 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone and 2-hydroxy-4-methoxy-5-sulfobenzophenone.

Specific examples of the benzotriazoles include 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)benzotriazole, 2-(2'-hydroxy-3'-tert-butyl-5'-methylphenyl)-5-chlorobenzotriazole, 2-(2'-hydroxy-3',5'-di-tert-butylphenyl)-5-chlorobenzotriazole, 2-(2'-hydroxy-3',5'-di-tert-amylphenyl)benzotriazole and 2-{(2'-hydroxy-3',''',4'',5''',6''-tetrahydrophthalimidomethyl)-5'-methylphenyl}benzotriazole.

Specific examples of the hindered amines include bis(2,2,6,6-tetramethyl-4-piperidyl)sebacate, bis(1,2,2,6,6-pentamethyl-4-piperidyl)sebacate and bis(1,2,2,6,6-pentamethyl-4-piperidyl[{3,5-bis(1,1-dimethylethyl-4-hydroxyphenyl}methyl]butyl)malonate.

Preparation of a Hardened Material

A hardened material obtained by hardening a hardening resin composition according to the invention can be prepared, for example, by a method described below.

Liquid (I) and liquid (II) described below are prepared.

Liquid (I) to be prepared by mixing (A) a silicon compound having at least one of epoxy and oxetanyl, an arbitrary amount of (C) an epoxy resin or oxetane resin, (B) a phosphor subjected to surface treatment, and an arbitrary amount of a silane coupling agent and a stabilizer.

Liquid (II) to be prepared by mixing (D) a hardening agent, an arbitrary amount of (C) an epoxy resin or oxetane resin, and arbitrary amount of a silane coupling agent, and when necessary, the organic solvent described above.

Preparation of a Hardened Material by Thermosetting

Liquid (I) and liquid (II) that are prepared, respectively, are stirred and mixed, and then decompressed and defoamed. Then, the resultant mixture is poured into a mold, heated at 125° C. for 1 hour, and finally heated at 150° C. for 2 to 3 hours to allow thermosetting.

Preparation of a Hardened Material by Light Hardening

In a similar manner, liquid (I) and liquid (II) that are prepared are stirred and mixed, and decompressed and defoamed. A coating film obtained by applying the resultant mixture onto a substrate surface is irradiated with light such as ultraviolet light or visible light, and thus a hardened material can be obtained.

An amount of light (amount of exposure) when the coating film is irradiated with ultraviolet light, visible light or the like is appropriately determined according to the resin composition. When measurement is carried out using Digital UV Intensity Meter UIT-201 attached with photodetector UVD-365PD made by Ushio, Inc., the amount of light is preferably in the range of 10 to 3,000 mJ/cm$^2$, further preferably, 50 to 2,000 mJ/cm$^2$, still further preferably, 100 to 1,000 mJ/cm$^2$. Moreover, a wavelength of ultraviolet light, visible light or the like for irradiation is preferably in the range of 200 to 500 nanometers, further preferably, in the range of 300 to 450 nanometers.

In addition, an exposure system is not particularly limited, if an apparatus is mounted with a high pressure mercury lamp, an ultra-high pressure mercury lamp, a metal halide lamp, a halogen lamp or the like, and irradiates ultraviolet light, visible light or the like in the range of 250 to 500 nanometers.

Moreover, when necessary, a hardened film obtained by hardening by irradiation with light may be further heated. For example, when the film is heated at 50 to 150° C. for 10 to 60 minutes, strength of the hardened film can be further increased.

An additive, such as the ultraviolet light absorber may be mixed in the hardening resin composition of the invention.

With regard to transparency of a hardened material obtained by hardening a hardening resin composition according to the invention, when transmittance of the hardened material before and after heat resistance testing is measured with a UV-Vis spectrophotometer, and evaluated by a yellowness index (YI value) and a retention ratio of luminous transmittance, the yellowness index (YI value) and the retention ratio of luminous transmittance at 150° C. are preferably 2 or less, and 90% or more, respectively. When the values are within the above ranges, respectively, the values indicate that the hardened material is colorless and has a high transparency, and thus such a hardened material can be particularly preferably utilized in a field such as the sealing agent for the optical semiconductor in which transparency is required.

When the hardened material obtained by allowing thermosetting or light hardening of the hardening resin composition according to the invention is molded into the form of a film, a sheet or a coating film to form a molded object, the hardened material can be used in various applications.

Specific examples of the applications of the hardened material include a wavelength conversion film, a sealing material for an optical semiconductor and a color conversion material for an optical lens, a sealing material for a semiconductor, an insulating film, a sealant and an adhesive. The color conversion material containing the hardened material according to the invention can be used for an optical semiconductor device.

The coating film of the invention is obtained by applying the hardening resin composition of the invention onto a base material.

EXAMPLES

The invention will be explained in greater detail based on Examples. In addition, the invention is not limited by Examples described below.

Measuring Apparatus and Measuring Method

Number average molecular weight and weight average molecular weight of compound (A) were measured according to a gel permeation chromatography (GPC) method. Specifically, measurement was carried out by diluting silicone and silsesquioxane with tetrahydrofuran (THF) for a concentration of silicone and silsesquioxane to be about 0.05 to about 0.10% by mass, connecting columns KF-805L and KF-804L made by Showa Denko K.K. in series in the above order and using the connected columns, and using THF as a developer according to the gel permeation chromatography (GPC) method, and the molecular weight was determined by calculating a polymethylmethacrylate equivalent.

Synthesis of a Silicon Compound Having an Epoxy Group

Synthesis Example 1

Compound (ab) was manufactured according to a formula below.

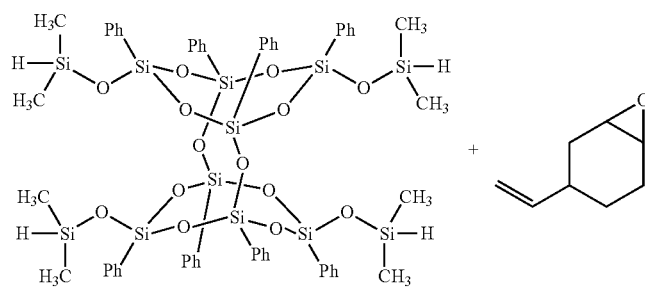

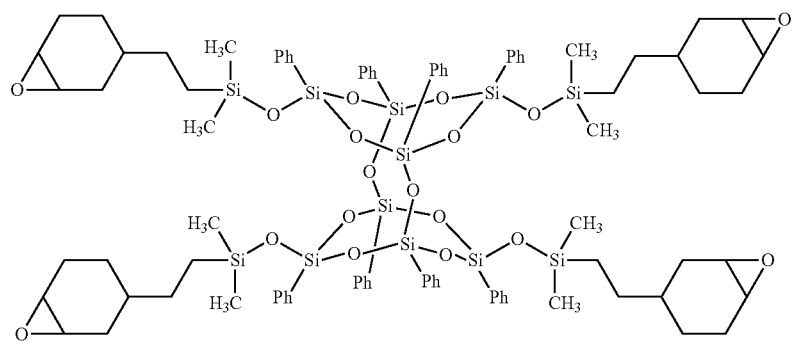

Under a nitrogen atmosphere, compound (A) (21.0 g) prepared by the method disclosed in WO 2004/024741 A, and dry toluene (20 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C.

A Pt catalyst (21 µL) was added using a microsyringe, CELLOXIDE 2000 (product name) (10 g) (made by Daicel Chemical Industries, Ltd.) was slowly added dropwise from the dropping funnel, and the resultant mixture was stirred for 3 hours. Contents in the reaction vessel were transferred into an evaporator and concentrated therein, and thus a crude crystal was obtained. Acetone was added to the crude crystal obtained to prepare a 20% by mass solution.

Furthermore, 3% by mass of activated carbon was added to the crude crystal, and the resultant mixture was stirred for 1 hour. Then, the activated carbon was filtered off, hexane in 10 times the amount of crude crystal was added, and the resultant mixture was stirred at 25° C. for 2 hours. Then, the resultant mixture was filtered, and a filtrate was concentrated using an evaporator. Hexane in 1.25 times the amount of crude crystal obtained was added, and the resultant mixture was heated to 60° C. and the crystal was dissolved, and then subjected to recrystallization at 25° C. A crystal obtained (yield 22 g, percent yield: 76%) obtained was found to be compound (ab) as a result of measurement by NMR (DRX500 (500 MHz), made by Bruker Corporation).

Synthesis Example 2

Compound (abc1) was manufactured according to a formula below.

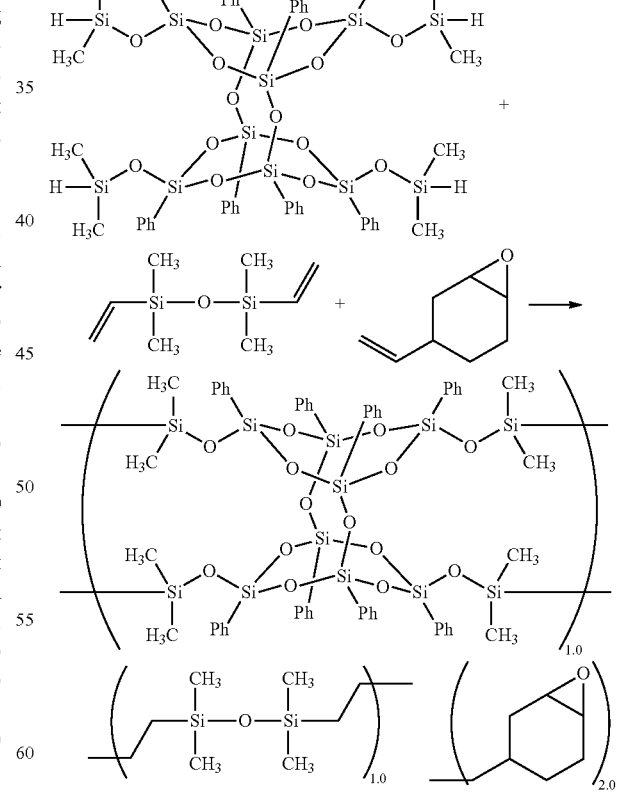

Under a nitrogen atmosphere, compound (A) (80 g) prepared by the method disclosed in WO 2004/024741 A, and dry toluene (80 g) were charged into a reaction vessel having an internal volume of 500 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (16 μL) and 1,3-divinyl-1,1,3,3-tetramethyldisiloxane (11.5 g) (made by AZmax, Co.) were added.

The resultant reaction mixture was heated to a reflux temperature and stirred for 3 hours. The reaction temperature was decreased to 80° C., a Pt catalyst (16 μL) and CELLOXIDE 2000 (trade name) (30.5 g) (made by Daicel Chemical Industries, Ltd.) were added, and the resultant mixture was stirred for 3 hours. The reaction mixture was cooled to room temperature, 4 g of activated carbon was added, and the resultant mixture was stirred overnight.

The activated carbon was removed by filtration. The resultant filtrate was transferred into an evaporator and concentrated therein. Then, 700 mL of hexane was added to a concentrate obtained to allow dissolution at 50° C. Purification was performed by chromatography using Kyoward 500 (trade name) (20 g) (made by Kyowa Chemical Industry Co., Ltd.). Hexane (300 mL) was further added to allow washing of a purified material. A solution obtained was concentrated using an evaporator, and thus 110 g of a colorless glassy concentrate (abc1) was obtained. When the concentrate was analyzed by GPC, number average molecular weight (Mn) was 3,500 and weight average molecular weight (Mw) was 7,300.

Synthesis Example 3

Compound (abc1+es) was manufactured according to a formula below.

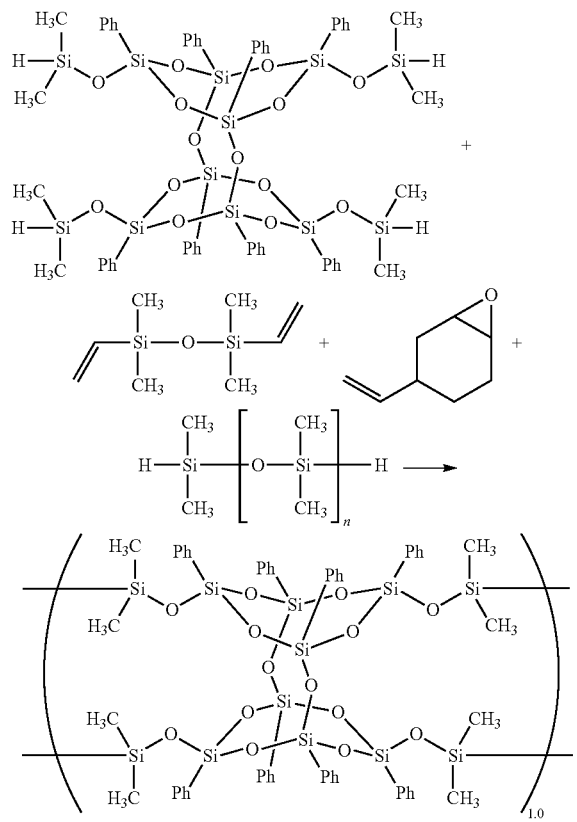

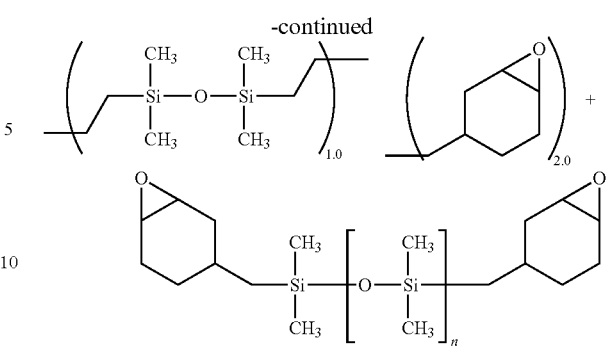

Under a nitrogen atmosphere, compound (A) (50 g) and dry toluene (75 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (16 μL) and divinyl disiloxane (7.2 g) were added. The resultant reaction mixture was heated to a reflux temperature and stirred for 3 hours.

The reaction temperature was decreased to 80° C., a Pt catalyst (16 .μ) and CELLOXIDE 2000 (trade name) (20.5 g) (made by Daicel Chemical Industries, Ltd.) were added, and the resultant mixture was stirred for 2 hours.

Subsequently, FM-1105 (trade name) including hydrosilyl groups at both terminals (9.8 g)(made by JNC Corporation) was added, and the resultant mixture was stirred for 1 hour. The resultant reaction mixture was cooled to room temperature, 4 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (trade name) (15 g) (made by Kyowa Chemical Industry Co., Ltd.). Hexane (300 mL) was further added to allow washing of a purified material. A solution obtained was concentrated using an evaporator, and thus 79 g of a colorless glassy concentrate (abc1+es) was obtained. When the concentrate was analyzed by GPC, number average molecular weight (Mn) was 3,300 and weight average molecular weight (Mw) was 7,000.

Synthesis Example 4

Compound (abc2) was manufactured according to a formula below.

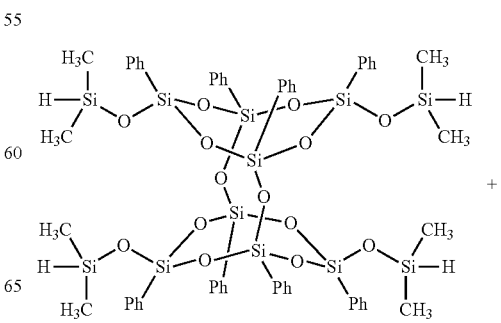

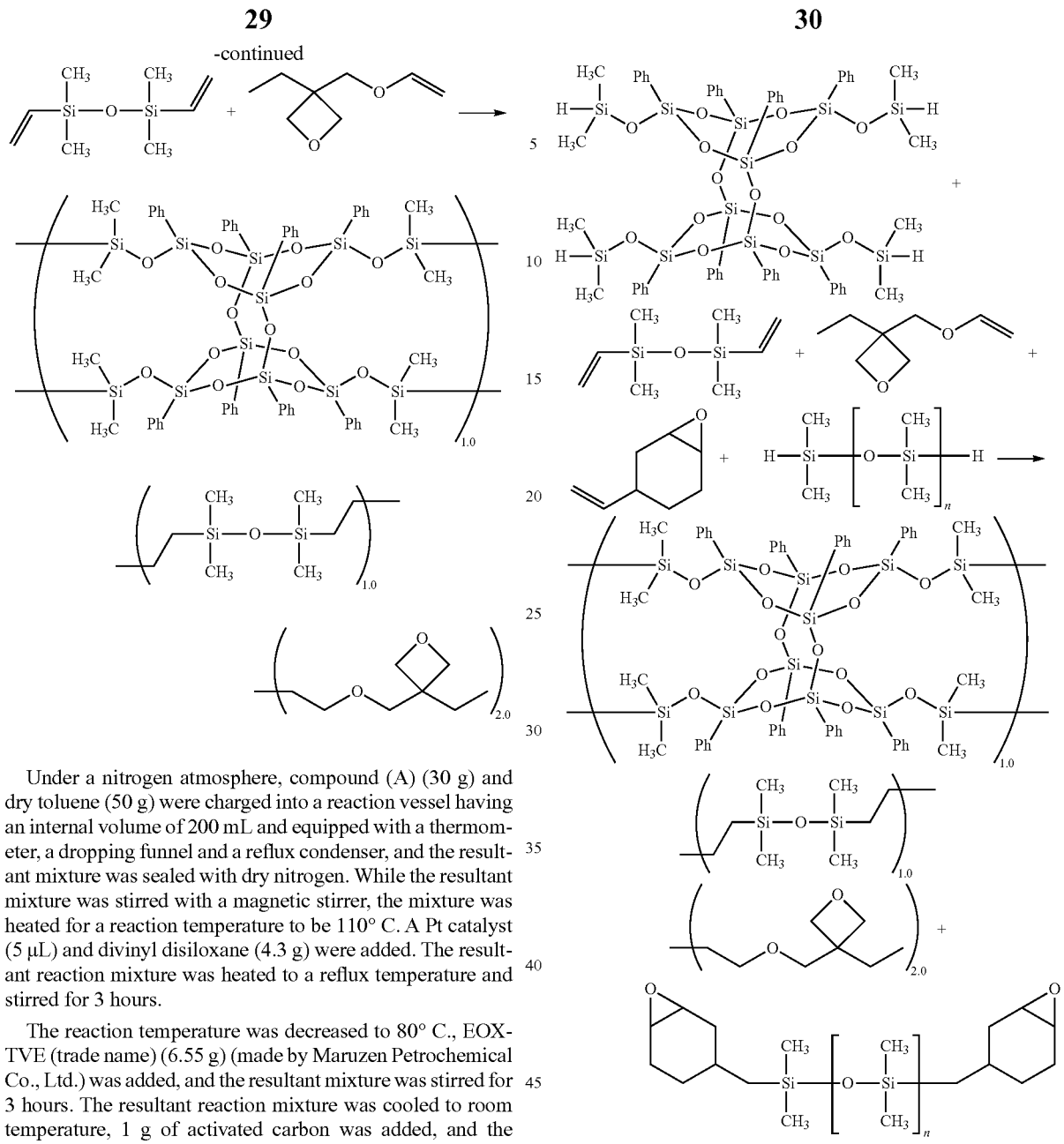

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 µL) and divinyl disiloxane (4.3 g) were added. The resultant reaction mixture was heated to a reflux temperature and stirred for 3 hours.

The reaction temperature was decreased to 80° C., EOX-TVE (trade name) (6.55 g) (made by Maruzen Petrochemical Co., Ltd.) was added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (trade name) (5 g) (made by Kyowa Chemical Industry Co., Ltd.). Hexane (200 mL) was further added to allow washing of a purified material. A solution obtained was concentrated using an evaporator, and thus 38 g of a colorless glassy concentrate (abc2) was obtained. When the concentrate was analyzed by GPC, number average molecular weight (Mn) was 3,500 and weight average molecular weight (Mw) was 7,300.

Synthesis Example 5

Compound (abc2+es) was manufactured according to a formula below.

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 µL) and divinyl disiloxane (4.3 g) were added. The resultant reaction mixture was heated to a reflux temperature and stirred for 3 hours.

The reaction temperature was decreased to 80° C., EOX-TVE (trade name) (6.6 g) (made by Maruzen Petrochemical Co., Ltd.) was added, and the resultant mixture was stirred for 5 hours. The resultant reaction mixture was cooled to room temperature, 1 g of activated carbon was added, and the resultant mixture was stirred overnight.

Subsequently, FM-1105 including hydrosilyl groups at both terminals (5.9 g), and CELLOXIDE 2000 (3.2 g) were added, and the resultant mixture was stirred for 1 hour. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (trade name) (5 g) (made by Kyowa Chemical Industry Co., Ltd.). Hexane (200 mL) was further added to allow washing of a purified material. A solution obtained was concentrated using an evaporator, and thus 48 g of a colorless glassy concentrate (abc2+es) was obtained. When the concentrate was analyzed by GPC, number average molecular weight (Mn) was 3,300 and weight average molecular weight (Mw) was 7,000.

Synthesis Example 6

Compound (abc3) was manufactured according to a formula below.

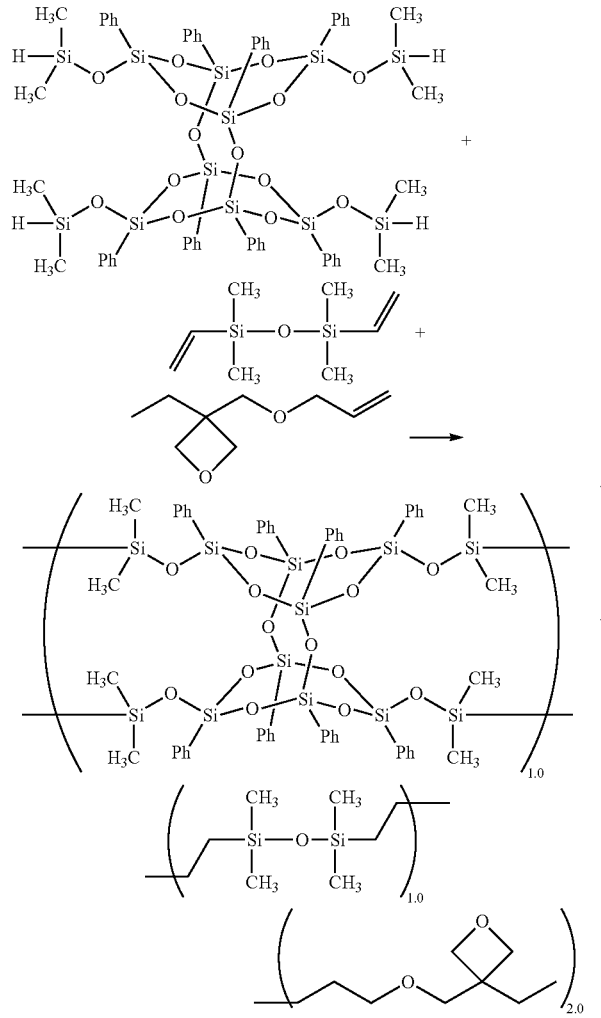

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 μL) and divinyl disiloxane (4.29 g) were added. The resultant reaction mixture was heated to a reflux temperature and stirred for 3 hours.

The reaction temperature was decreased to 80° C., a Pt catalyst (5 μL) and allyl oxetane (7.2 g) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (trade name) (5 g) (made by Kyowa Chemical Industry Co., Ltd.). Hexane (200 mL) was further added to allow washing of a purified material. A solution obtained was concentrated using an evaporator, and thus 38 g of a colorless glassy concentrate (abc3) was obtained. When the concentrate was analyzed by GPC, number average molecular weight (Mn) was 3,500 and weight average molecular weight (Mw) was 7,300.

Synthesis Example 7

Compound (abc3+es) was manufactured according to a formula below.

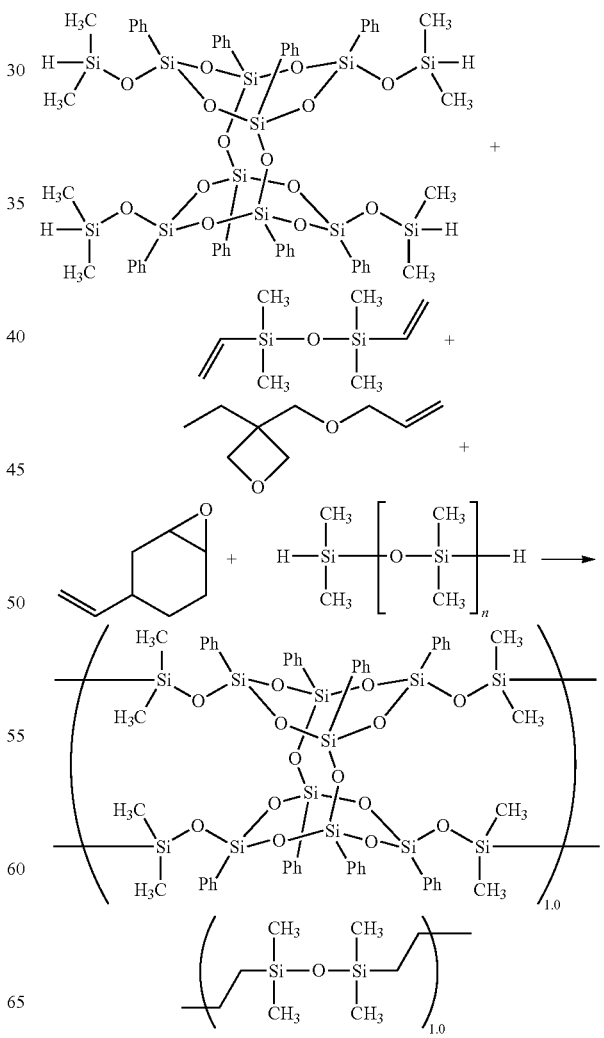

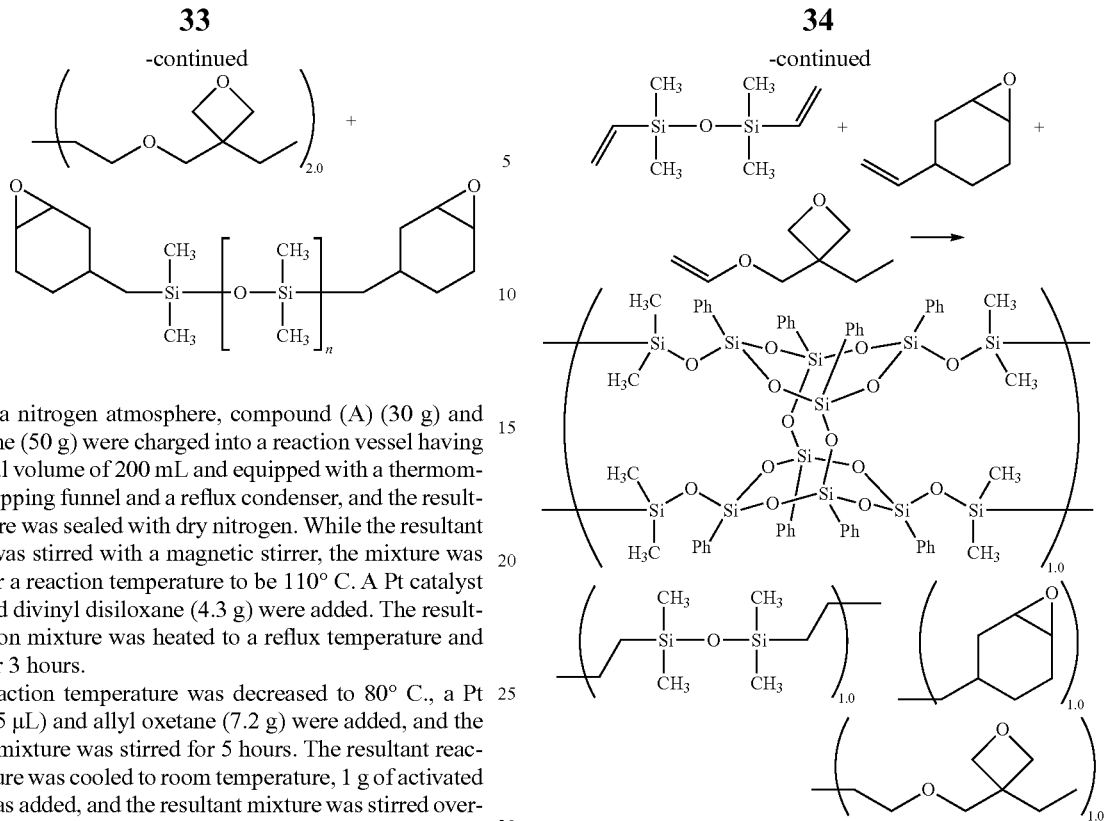

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 μL) and divinyl disiloxane (4.3 g) were added. The resultant reaction mixture was heated to a reflux temperature and stirred for 3 hours.

The reaction temperature was decreased to 80° C., a Pt catalyst (5 μL) and allyl oxetane (7.2 g) were added, and the resultant mixture was stirred for 5 hours. The resultant reaction mixture was cooled to room temperature, 1 g of activated carbon was added, and the resultant mixture was stirred overnight.

Subsequently, FM-1105 including hydrosilyl groups at both terminals (5.9 g), and CELLOXIDE 2000 (3.2 g) were added, and the resultant mixture was stirred for 1 hour. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (trade name) (5 g) (made by Kyowa Chemical Industry Co., Ltd.). Hexane (200 mL) was further added to allow washing of a purified material. A solution obtained was concentrated using an evaporator, and thus 48 g of a colorless glassy concentrate (abc3+es) was obtained. When the concentrate was analyzed by GPC, number average molecular weight (Mn) was 3,300 and weight average molecular weight (Mw) was 7,000.

Synthesis Example 8

Compound (abc4) was manufactured according to a formula below.

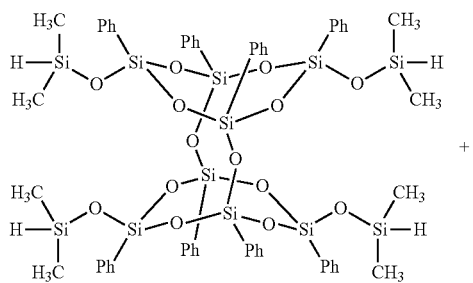

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 μL) and divinyl disiloxane (4.29 g) were added. The resultant reaction mixture was heated to a reflux temperature and stirred for 3 hours.

The reaction temperature was decreased to 80° C., a Pt catalyst (5 μL) and EOXTVE (3.3 g) were added, and the resultant mixture was stirred for 3 hours. Subsequently, CELLOXIDE 2000 (2.9 g) was added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (trade name) (5 g) (made by Kyowa Chemical Industry Co., Ltd.). Hexane (200 mL) was further added to allow washing of a purified material. A solution obtained was concentrated using an evaporator, and thus 38 g of a colorless glassy concentrate (abc4) was obtained. When the concentrate was analyzed by GPC, number average molecular weight (Mn) was 3,500 and weight average molecular weight (Mw) was 7,300.

Synthesis Example 9

Compound (abc4+es) was manufactured according to a formula below.

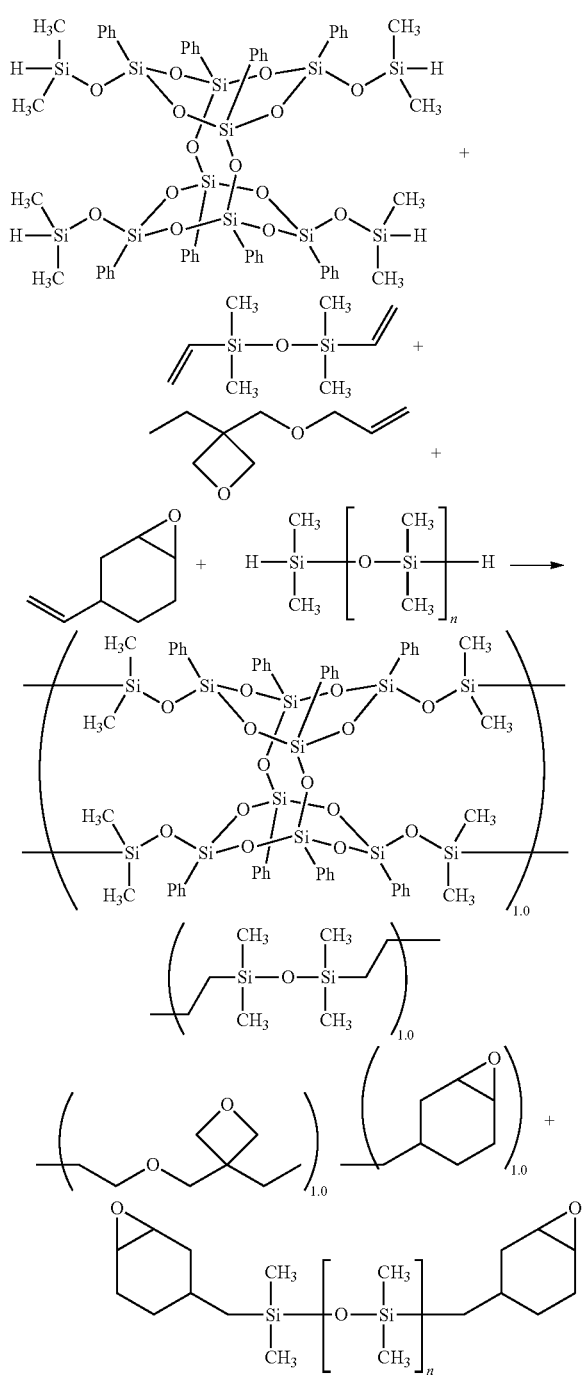

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 μL) and divinyl disiloxane (4.3 g) were added. The resultant reaction mixture was heated to a reflux temperature and stirred for 3 hours.

The reaction temperature was decreased to 80° C., a Pt catalyst (5 μL) and EOXTVE (3.3 g) were added, and the resultant mixture was stirred for 3 hours. Subsequently, CEL-LOXIDE 2000 (2.9 g) was added, and the resultant mixture was stirred for 1 hour. The resultant reaction mixture was cooled to room temperature, 1 g of activated carbon was added, and the resultant mixture was stirred overnight.

Subsequently, FM-1105 including hydrosilyl groups at both terminals (5.9 g), and CELLOXIDE 2000 (3.2 g) were added, and the resultant mixture was stirred for 1 hour. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (trade name) (5 g) (made by Kyowa Chemical Industry Co., Ltd.). Hexane (200 mL) was further added to allow washing of a purified material. A solution obtained was concentrated using an evaporator, and thus 48 g of a colorless glassy concentrate (abc4+es) was obtained. When the concentrate was analyzed by GPC, number average molecular weight (Mn) was 3,300 and weight average molecular weight (Mw) was 7,000.

Synthesis Example 10

Compound (abc5) was manufactured according to a formula below.

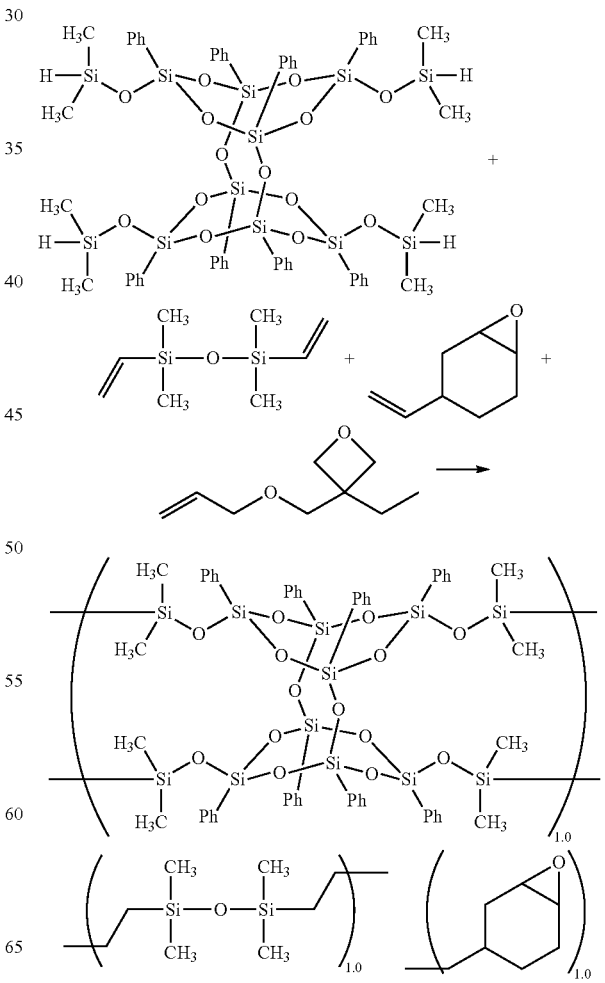

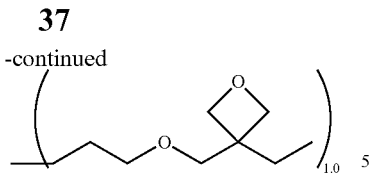

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 μL) and divinyl disiloxane (4.3 g) were added. The resultant reaction mixture was heated to a reflux temperature and stirred for 3 hours.

The reaction temperature was decreased to 80° C., a Pt catalyst (5 μL ) and allyl oxetane (3.6 g) were added, and the resultant mixture was stirred for 3 hours. Subsequently, CEL-LOXIDE 2000 (2.9 g) was added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Thus, 38 g of a colorless glassy concentrate (abc5) was obtained. When the concentrate was analyzed by GPC, number average molecular weight (Mn) was 3,500 and weight average molecular weight (Mw) was 7,300.

Synthesis Example 11

Compound (abc5+es) was manufactured according to a formula below.

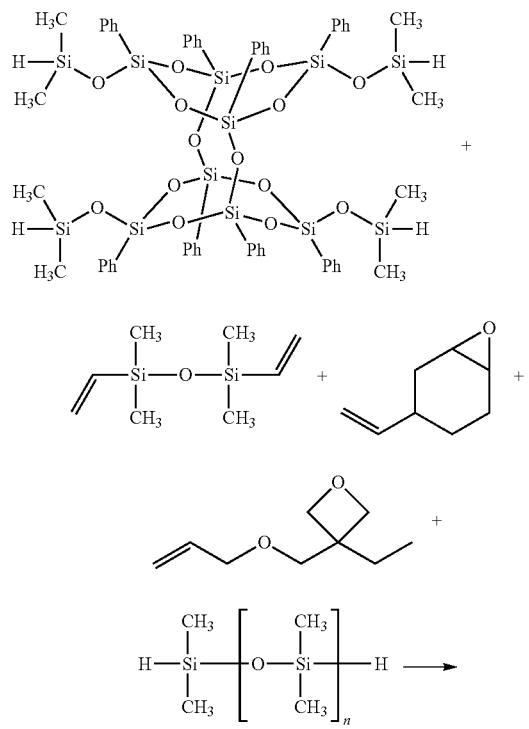

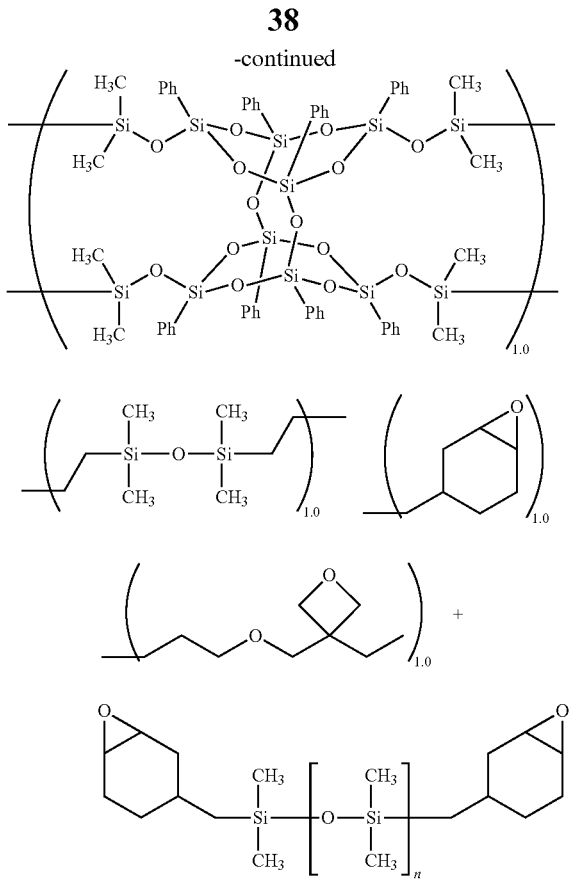

Under a nitrogen atmosphere, compound (A) (30 g) and dry toluene (50 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 110° C. A Pt catalyst (5 μL) and divinyl disiloxane (4.3 g) were added. The resultant reaction mixture was heated to a reflux temperature and stirred for 3 hours.

The reaction temperature was decreased to 80° C., a Pt catalyst (5 μL ) and allyl oxetane (3.6 g) were added, and the resultant mixture was stirred for 3 hours. Subsequently, CEL-LOXIDE 2000 (2.9 g) was added, and the resultant mixture was stirred for 3 hour.

Subsequently, FM-1105 including hydrosilyl groups at both terminals (5.9 g), and CELLOXIDE 2000 (3.2 g) were added, and the resultant mixture was stirred for 1 hour. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (trade name) (5 g) (made by Kyowa Chemical Industry Co., Ltd.). Hexane (200 mL) was further added to allow washing of a purified material. A solution obtained was concentrated using an evaporator, and thus 48 g of a colorless glassy concentrate (abc5+es) was obtained. When the concentrate was analyzed by GPC, number average molecular weight (Mn) was 3,300 and weight average molecular weight (Mw) was 7,000.

Synthesis Example 12

Compound (abd1) was manufactured according to a formula below.

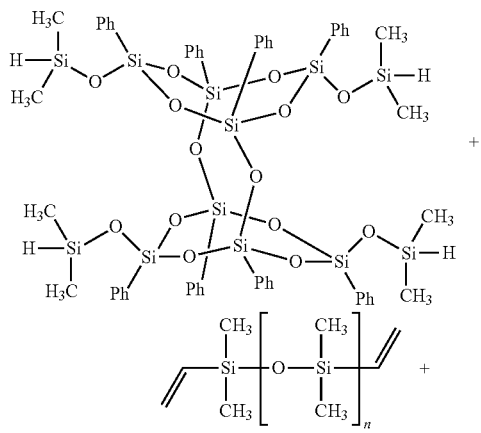
+
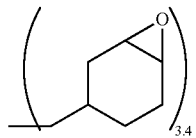
→
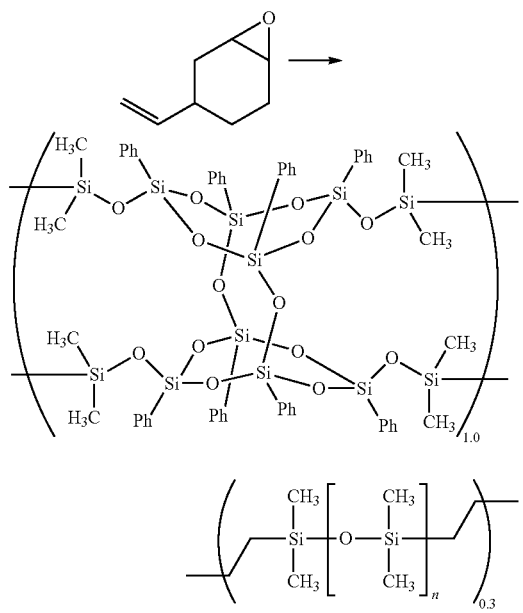

Under a nitrogen atmosphere, compound (A) (30 g) and dry ethyl acetate (42 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 µL) and vinyl terminated polydimethylsiloxane at both terminals DMS-V05 (18.4 g) (weight average molecular weight (Mw): 2,500, made by AZmax, Co.) were added. The resultant reaction mixture was heated to a reflux temperature and stirred for 2 hours.

The reaction temperature was decreased to 80° C., a Pt catalyst (5 µL) and CELLOXIDE 2000 (9.7 g) were added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (7 g). Hexane (300 mL) was further added to allow washing of a purified material. A solution obtained was concentrated using an evaporator, and thus 56 g of a colorless glassy concentrate (abd1) was obtained. When the concentrate was analyzed by GPC, number average molecular weight (Mn) was 9,200 and weight average molecular weight (Mw) was 79,000.

Synthesis Example 13

Compound (abd1+es) was manufactured according to a formula below.

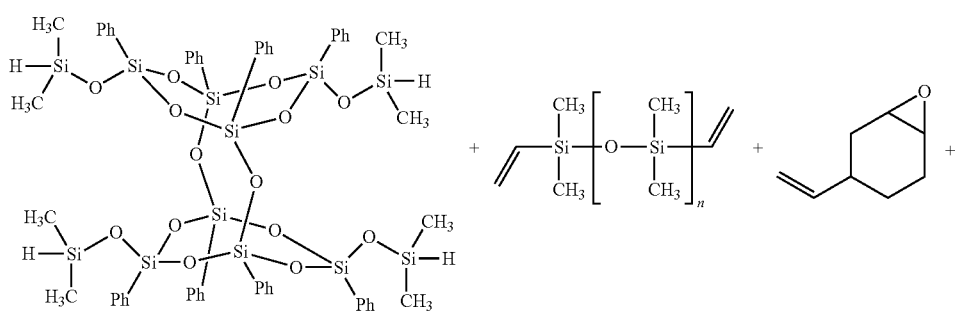

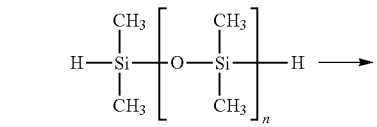

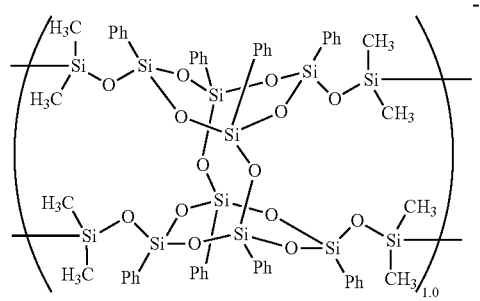 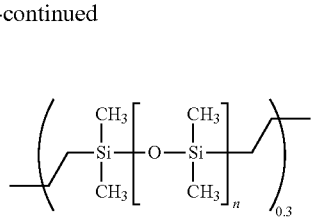 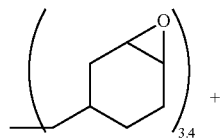

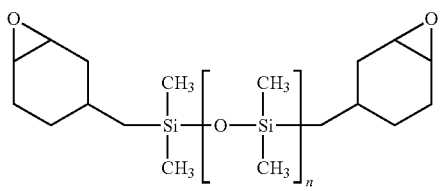

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 µL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 µL) and CELLOXIDE 2000 (9.7 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (7 g). Hexane (300 mL) was further added to allow washing of a purified material. A solution obtained was concentrated using an evaporator, and thus 65 g of a colorless glassy concentrate (abd1+es) was obtained. When the concentrate was analyzed by GPC, number average molecular weight (Mn) was 8,700 and weight average molecular weight (Mw) was 75,000.

Synthesis Example 14

Compound (abd2) was manufactured according to a formula below.

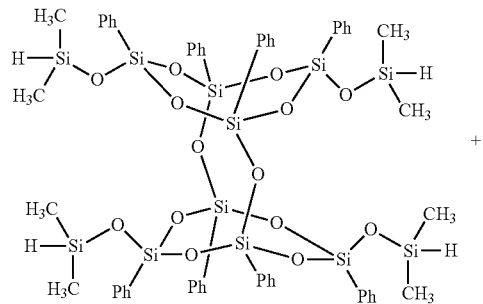

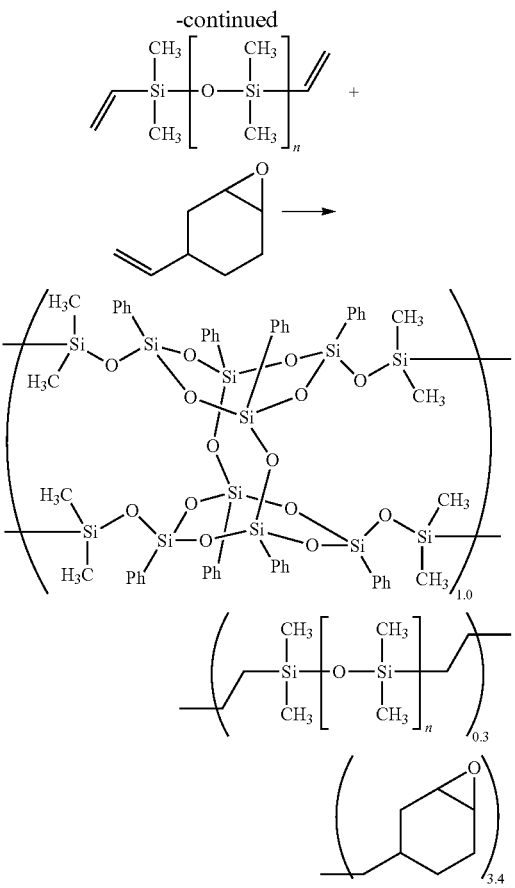

Under a nitrogen atmosphere, compound (A) (30 g) and dry ethyl acetate (42 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 µL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 μL) and EOXTVE (11.1 g) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 56 g of a colorless glassy concentrate (abd2) was obtained. When the concentrate was analyzed by GPC, number average molecular weight (Mn) was 9,200 and weight average molecular weight (Mw) was 79,000.

Synthesis Example 15

Compound (abd 2es) was manufactured according to a formula below.

the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 μL) and EOXTVE (11.1 g) were added, and the resultant mixture was stirred for 5 hours. The resultant reaction mixture was cooled to room temperature, 1 g of activated carbon was added, and the resultant mixture was stirred overnight.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a con-

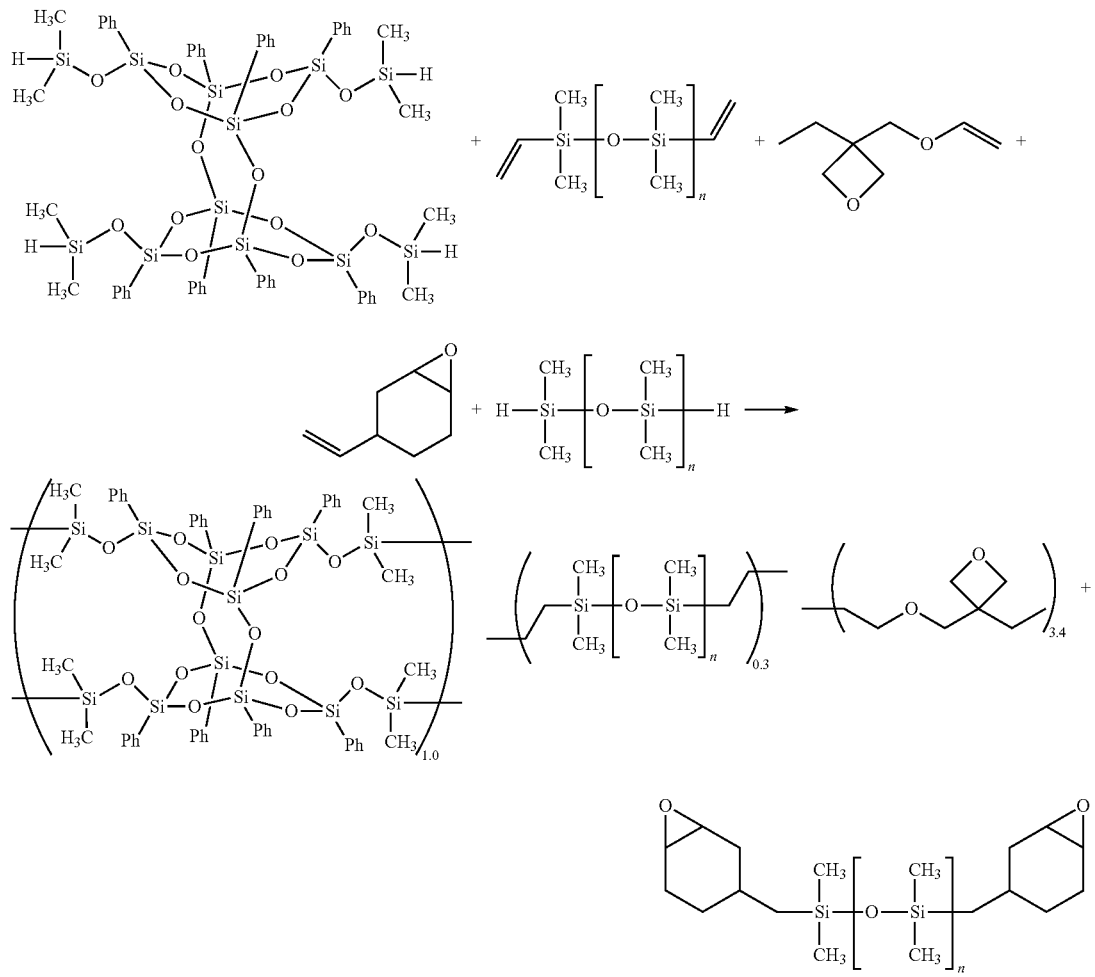

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and centrate obtained to allow dissolution at 50° C. Purification was performed by chromatography using Kyoward 500 (7 g). Hexane (300 mL) was further added to allow washing of a purified material. A solution obtained was concentrated using an evaporator, and thus 65 g of a colorless glassy concentrate (abd2+es) was obtained. When the concentrate was analyzed by GPC, number average molecular weight (Mn) was 8,700 and weight average molecular weight (Mw) was 75,000.

Synthesis Example 16

Compound (abd3) was manufactured according to a formula below.

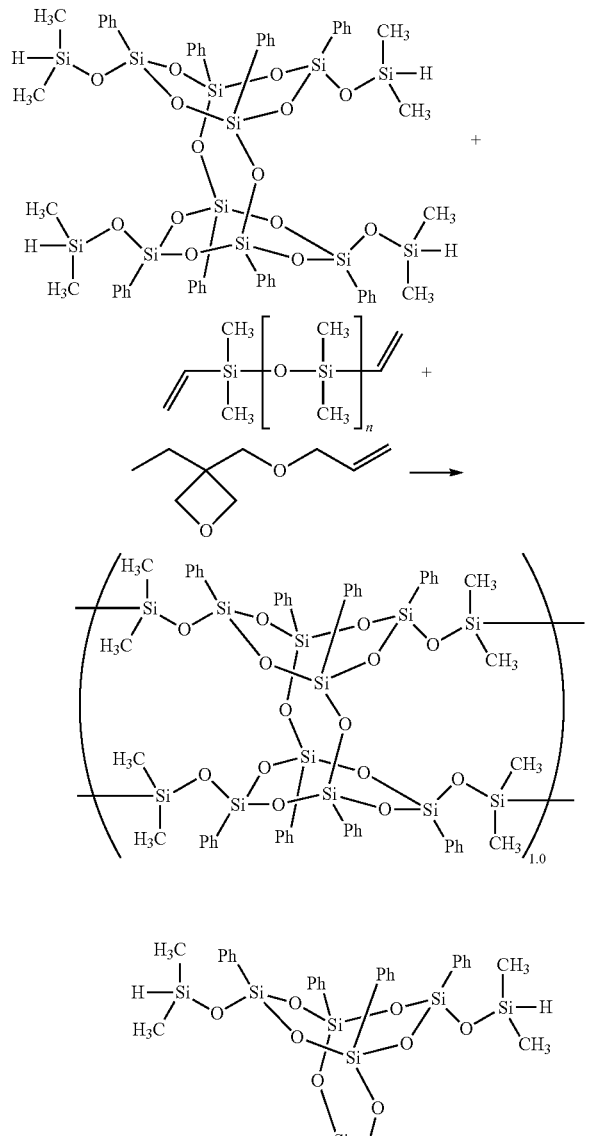

-continued

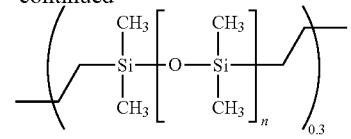

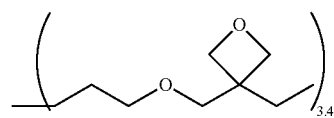

Under a nitrogen atmosphere, compound (A) (30 g) and dry ethyl acetate (42 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 µL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 µL) and allyl oxetane (12.2 g) were added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 56 g of a colorless glassy concentrate (abd3) was obtained. When the concentrate was analyzed by GPC, number average molecular weight (Mn) was 9,200 and weight average molecular weight (Mw) was 79,000.

Synthesis Example 17

Compound (abd3+es) was manufactured according to a formula below.

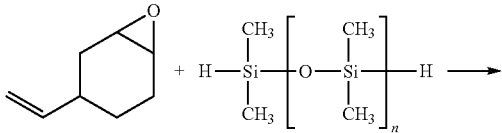

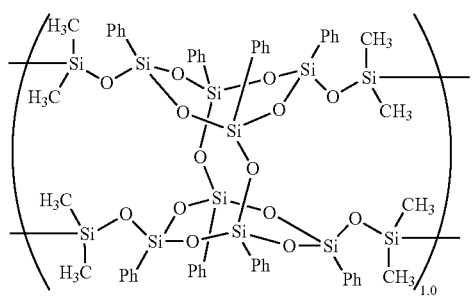
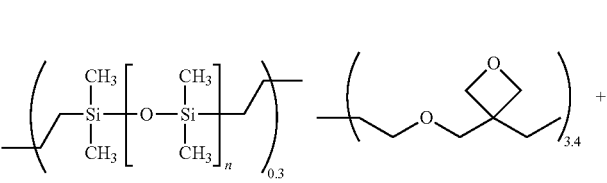
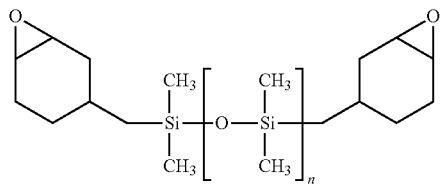

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 μL) and allyl oxetane (11.1 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (7 g). Hexane (300 mL) was further added to allow washing of a purified material. A solution obtained was concentrated using an evaporator, and thus 65 g of a colorless glassy concentrate (abd3+es) was obtained. When the concentrate was analyzed by GPC, number average molecular weight (Mn) was 8,700 and weight average molecular weight (Mw) was 75,000.

Synthesis Example 18

Compound (abd4) was manufactured according to a formula below.

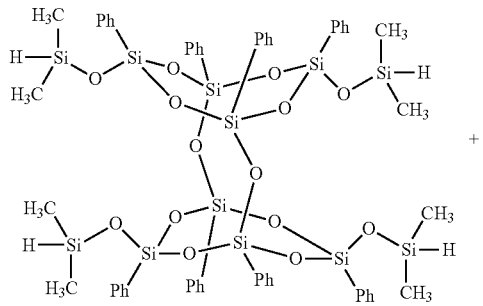

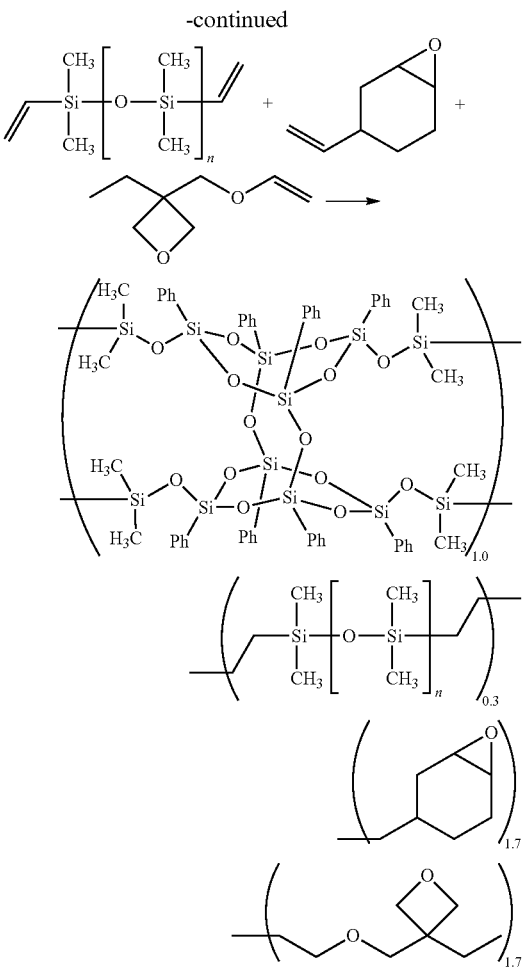

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 μL) and EOXTVE (5.6 g) were added, and the resultant mixture was stirred for 3 hours. Subsequently, CELLOXIDE 2000 (4.9 g) was added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 56 g of a colorless glassy concentrate (abd4) was obtained. When the concentrate was analyzed by GPC, number average molecular weight (Mn) was 9,200 and weight average molecular weight (Mw) was 79,000.

Synthesis Example 19

Compound (abd4+es) was manufactured according to a formula below.

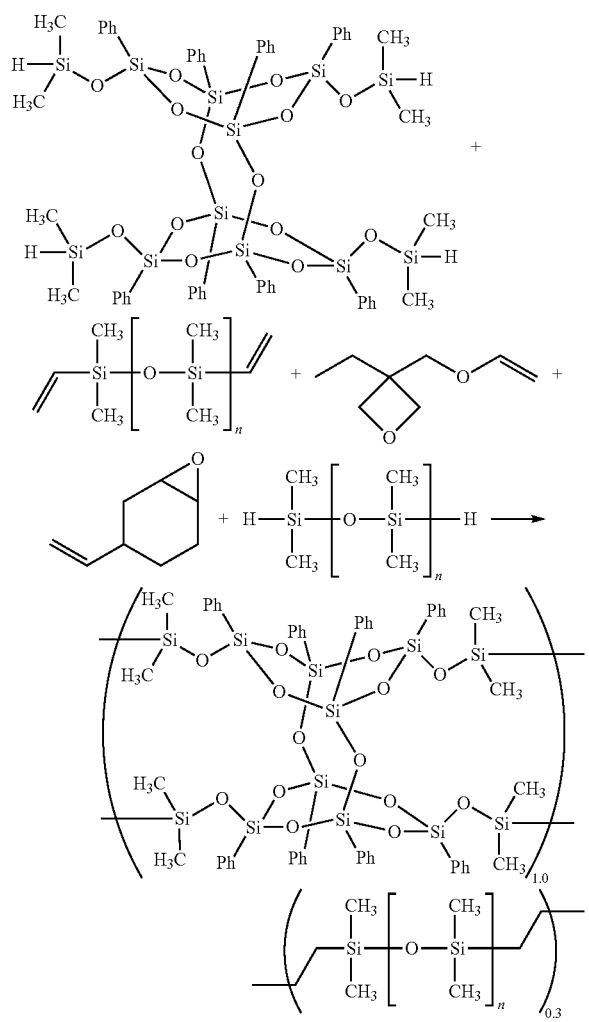

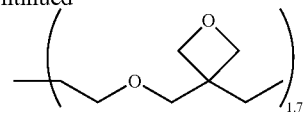

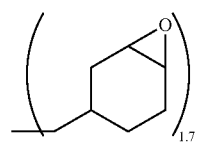

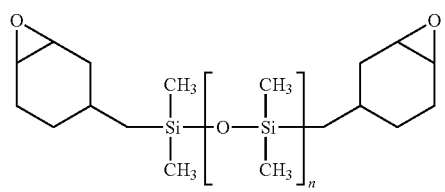

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 μL) and EOXTVE (5.6 g) were added, and the resultant mixture was stirred for 3 hours. Subsequently, CELLOXIDE 2000 (4.9 g) was added and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 65 g of a colorless glassy concentrate (abd4+es) was obtained. When the concentrate was analyzed by GPC, number average molecular weight (Mn) was 8,700 and weight average molecular weight (Mw) was 75,000.

Synthesis Example 20

Compound (abd5) was manufactured according to a formula below.

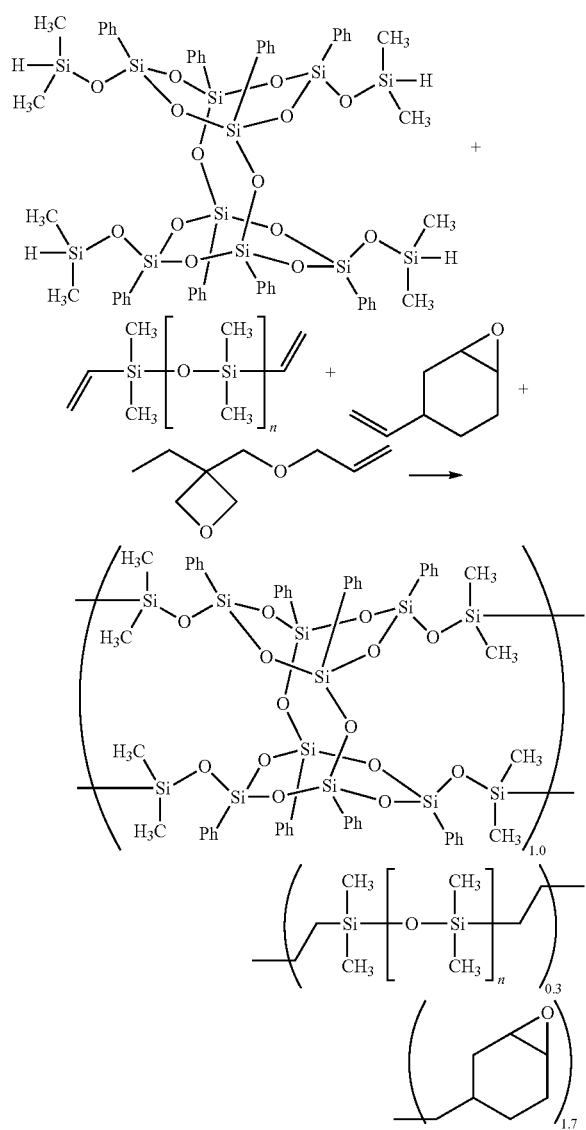

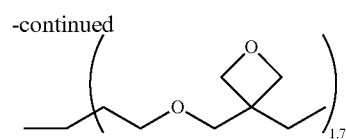

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 µL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 µL) and allyl oxetane (6.1 g) were added, and the resultant mixture was stirred for 3 hours. Subsequently, CEL-LOXIDE 2000 (4.9 g) was added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 56 g of a colorless glassy concentrate (abd5) was obtained. When the concentrate was analyzed by GPC, number average molecular weight (Mn) was 9,200 and weight average molecular weight (Mw) was 79,000.

Synthesis Example 21

Compound (abd5+es) was manufactured according to a formula below.

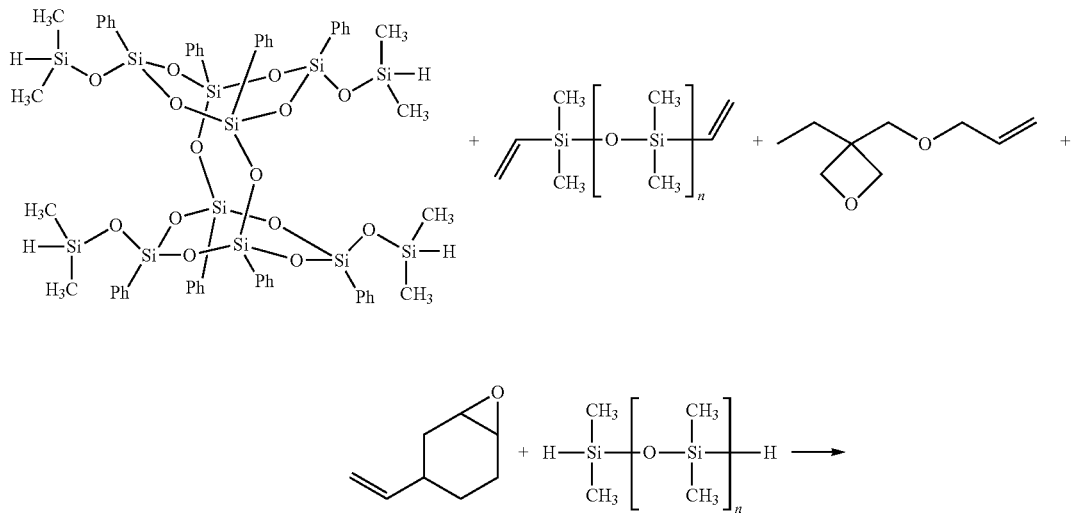

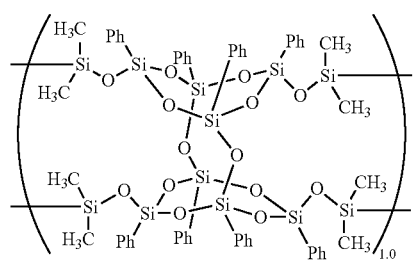
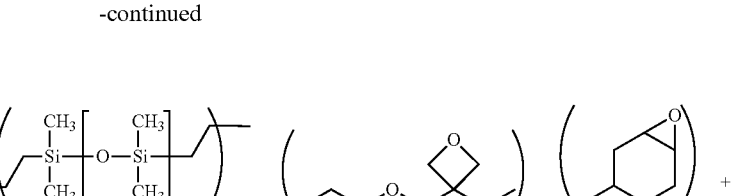
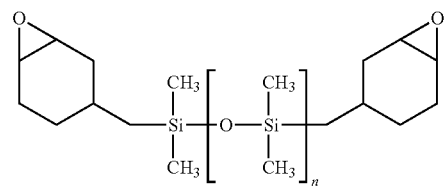

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals DMS-V05 (18.4 g) were added. The resultant reaction mixture was heated to a reflux temperature and stirred for 2 hours.

The reaction temperature was decreased to 80° C., a Pt catalyst (5 μL) and allyl oxetane (6.1 g) were added, and the resultant mixture was stirred for 3 hours. Subsequently, CELLOXIDE 2000 (4.9 g) was added and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 65 g of a colorless glassy concentrate (abd5+es) was obtained. When the concentrate was analyzed by GPC, number average molecular weight (Mn) was 8,700 and weight average molecular weight (Mw) was 75,000.

Synthesis Example 22

Compound (abel) was manufactured according to a formula below.

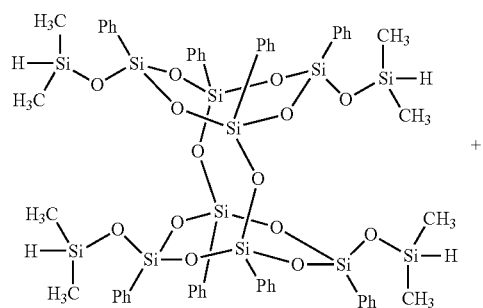

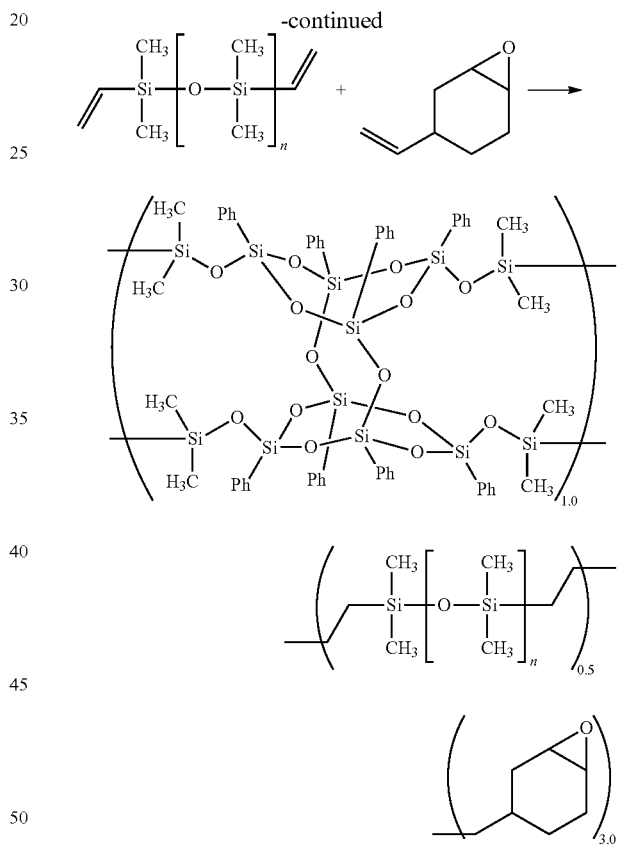

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2205 (8.1 g) (weight average molecular weight (Mw): 700, made by JNC Corporation) were added. The resultant reaction mixture was heated to a reflux temperature and stirred for 2 hours.

The reaction temperature was decreased to 80° C., a Pt catalyst (5 μL) and CELLOXIDE 2000 (trade name) (8.6 g)

(made by Daicel Chemical Industries, Ltd.) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (trade name) (5 g). Hexane (300 mL) was further added to allow washing of a purified material. A solution obtained was concentrated using an evaporator, and thus 45 g of a colorless glassy concentrate (abe1) was obtained. When the concentrate was analyzed by GPC, number average molecular weight (Mn) was 3,900 and weight average molecular weight (Mw) was 8,400.

Synthesis Example 23

Compound (abe 1+es) was manufactured according to a formula below.

catalyst (1 μL) and vinyl terminated polydimethylsiloxane at both terminals FM-2205 (8.1 g) were added. The resultant reaction mixture was heated to a reflux temperature and stirred for 2 hours.

The reaction temperature was decreased to 80° C., a Pt catalyst (5 μL) and CELLOXIDE 2000 (8.6 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (7 g). Hexane (300 mL) was further added to allow washing of a purified material. A solution obtained was concentrated using an evaporator, and thus 56 g of a colorless glassy concentrate (abe1 +es) was obtained. When the concentrate was analyzed

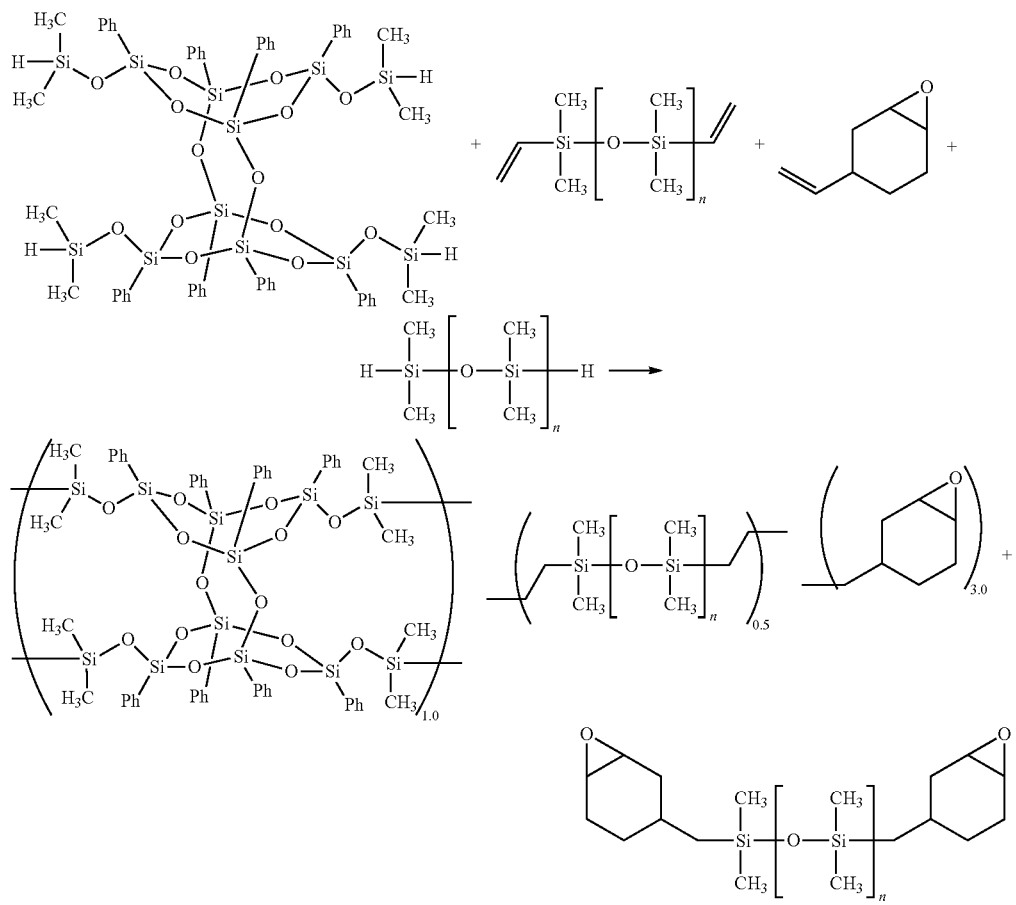

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt by GPC, number average molecular weight (Mn) was 3,500 and weight average molecular weight (Mw) was 7,600.

Synthesis Example 24

Compound (abe2) was manufactured according to a formula below.

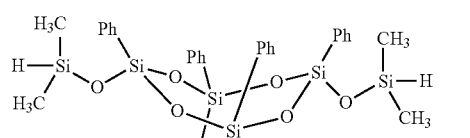

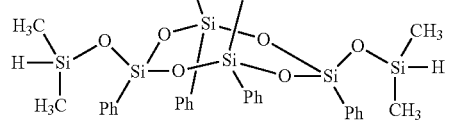

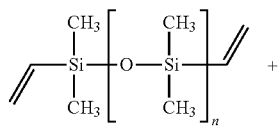

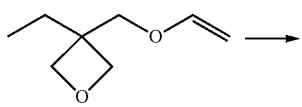

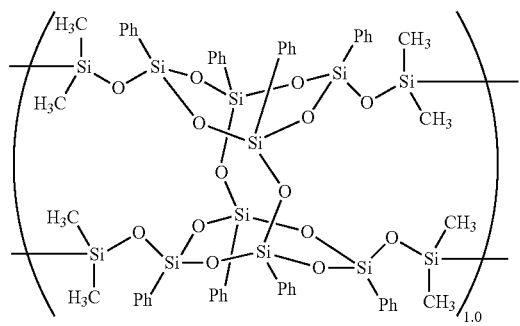

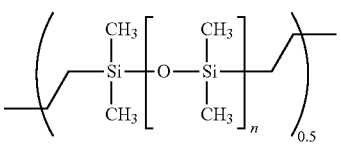

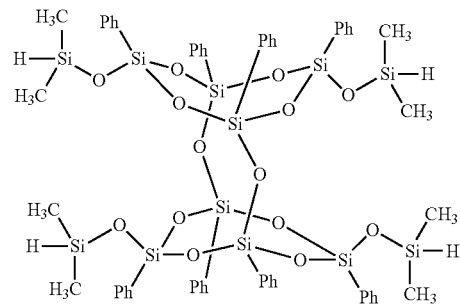

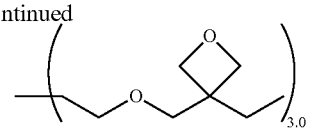

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2205 (8.1 g) were added. The resultant reaction mixture was heated to a reflux temperature and stirred for 2 hours.

The reaction temperature was decreased to 80° C., a Pt catalyst (5 μL) and EOXTVE (9.83 g) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (trade name) (5 g). Hexane (300 mL) was further added to allow washing of a purified material. A solution obtained was concentrated using an evaporator, and thus 46 g of a highly transparent and colorless glassy concentrate (abe2) was obtained. When the concentrate was analyzed by GPC, number average molecular weight (Mn) was 3,900 and weight average molecular weight (Mw) was 8,400.

Synthesis Example 25

Compound (abf2+es) was manufactured according to a formula below.

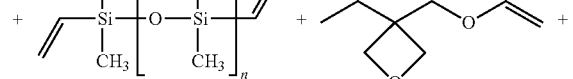

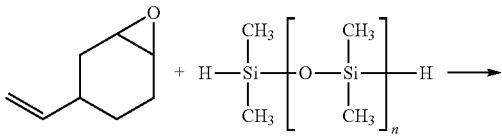

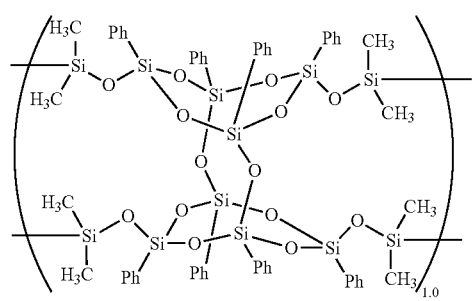
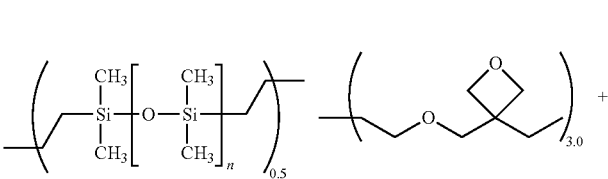

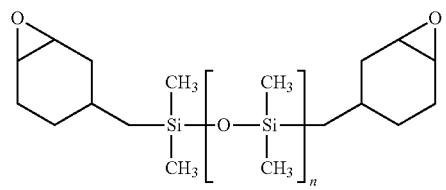

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 µL) and vinyl terminated polydimethylsiloxane at both terminals FM-2205 (8.1 g) were added. The resultant reaction mixture was heated to a reflux temperature and stirred for 2 hours.

The reaction temperature was decreased to 80° C., a Pt catalyst (5 µL) and EOXTVE (9.8 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (7 g). Hexane (300 mL) was further added to allow washing of a purified material. A solution obtained was concentrated using an evaporator, and thus 56 g of a colorless glassy concentrate (abe2+es) was obtained. When the concentrate was analyzed by GPC, number average molecular weight (Mn) was 3,500 and weight average molecular weight (Mw) was 7,600.

Synthesis Example 26

Compound (abe3) was manufactured according to a formula below.

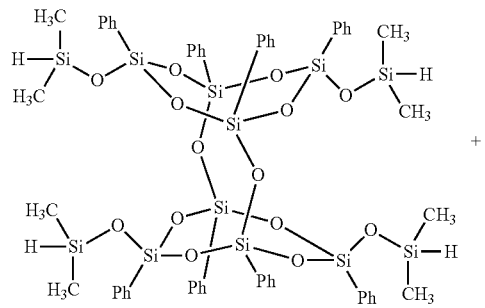

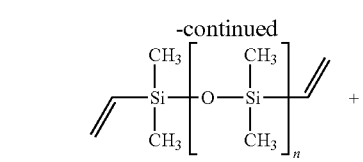

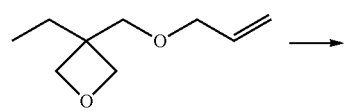

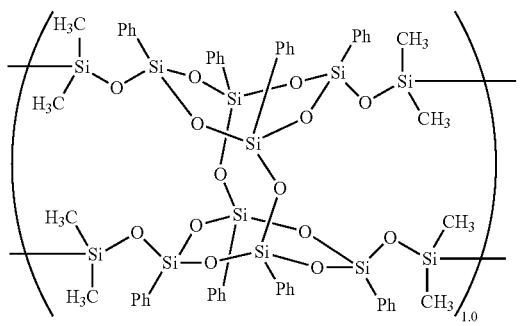

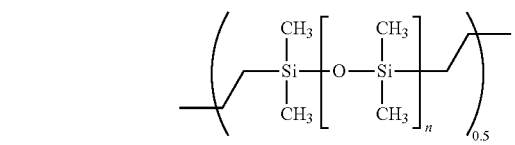

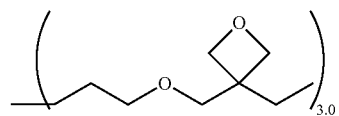

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 µL) and vinyl terminated polydimethylsiloxane at both terminals FM-2205 (8.1 g) were added. The resultant reaction mixture was heated to a reflux temperature and stirred for 2 hours.

The reaction mixture was stirred at the reflux temperature (80° C.) for 2 hours. Subsequently, a Pt catalyst (5 μL) and allyl oxetane (10.8 g) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 46 g of a highly transparent and colorless glassy concentrate (abe3) was obtained. When the concentrate was analyzed by GPC, number average molecular weight (Mn) was 3,900 and weight average molecular weight (Mw) was 8,400.

Synthesis Example 27

Compound (abe3+es) was manufactured according to a formula below.

having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2205 (8.1 g) were added. The resultant reaction mixture was heated to a reflux temperature and stirred for 2 hours.

The reaction temperature was decreased to 80° C., a Pt catalyst (5 μL) and allyl oxetane (10.8 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (7 g). Hexane (300 mL) was further added to allow washing of a purified material. A solution obtained was concentrated using an evaporator, and thus 56g of a colorless glassy concentrate (abe3+es) was obtained. When the concentrate was analyzed

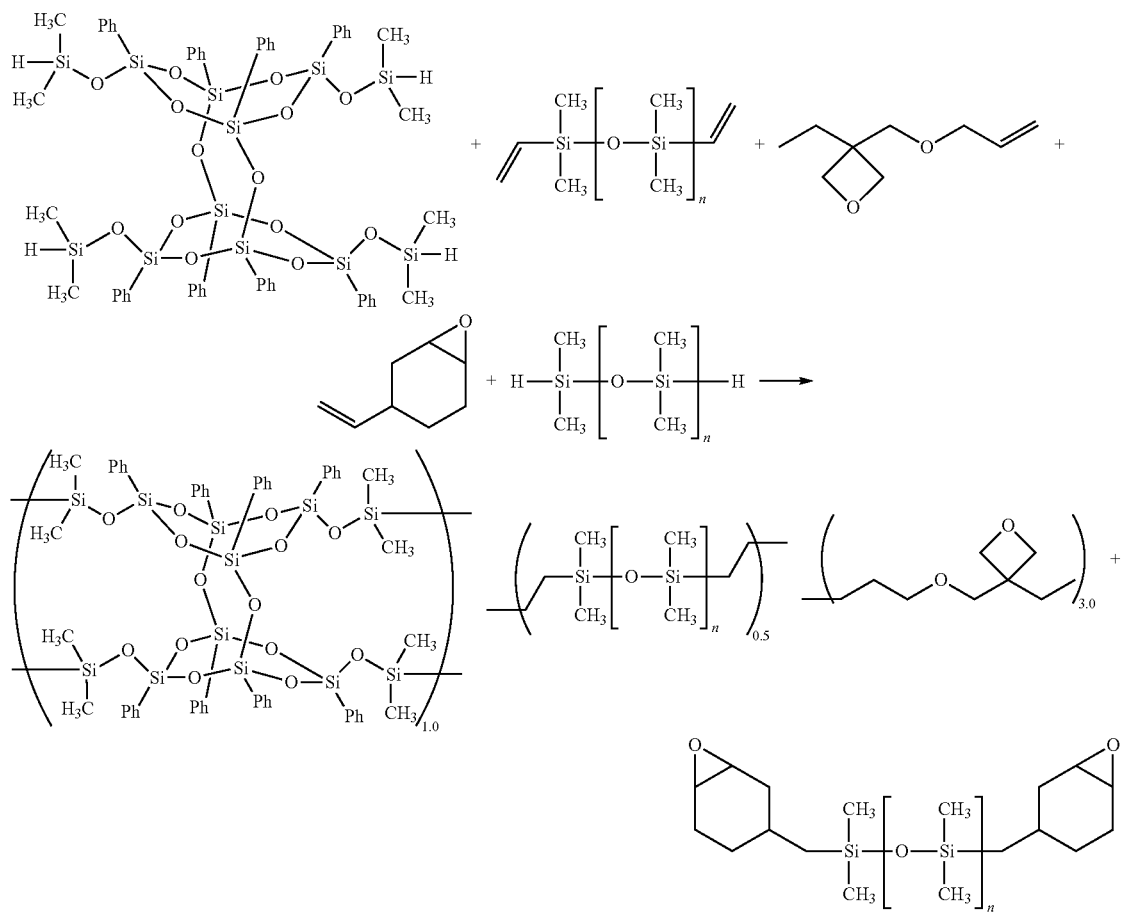

Under a nitrogen atmosphere, compound (A) (30 g) and dry ethyl acetate (45 g) were charged into a reaction vessel by GPC, number average molecular weight (Mn) was 3,500 and weight average molecular weight (Mw) was 7,600.

Synthesis Example 28

Compound (abe4) was manufactured according to a formula below.

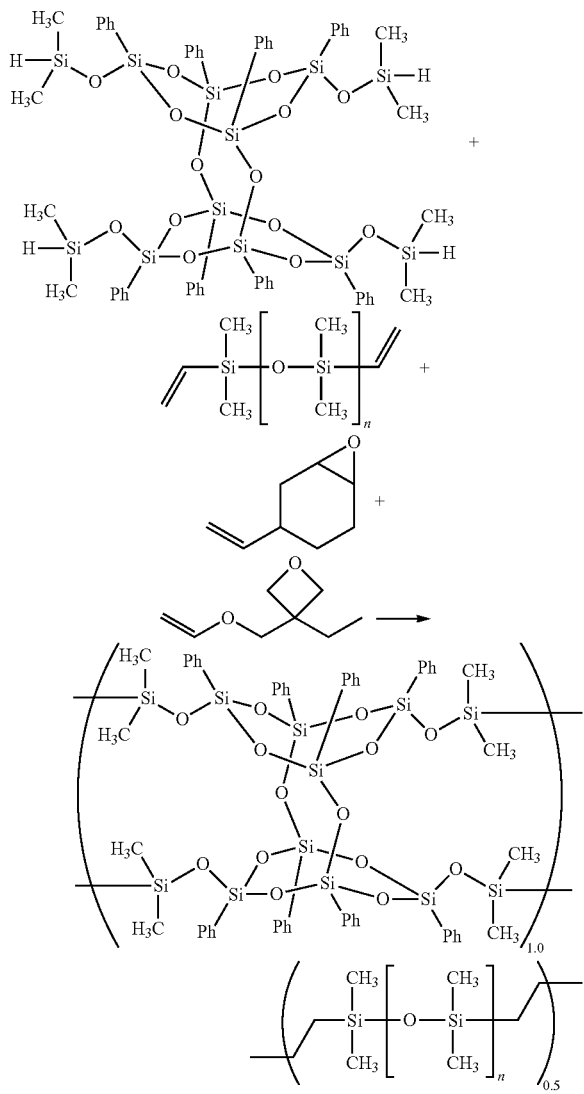

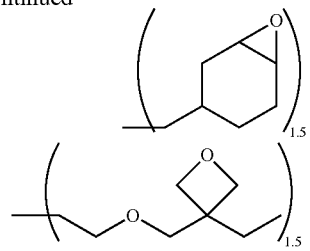

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2205 (8.1 g) (weight average molecular weight (Mw): 700, made by JNC Corporation) were added. The resultant reaction mixture was heated to a reflux temperature and stirred for 2 hours.

The reaction temperature was decreased to 80° C., a Pt catalyst (5 μL) and EOXTVE (4.9 g) were added, and the resultant mixture was stirred for 3 hours. Subsequently, CEL-LOXIDE 2000 (trade name) (4.3 g) (made by Daicel Chemical Industries, Ltd.) was added, and the resultant mixture was stirred for 3 hours. The resultant reaction mixture was cooled to room temperature, 1g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 45 g of a highly transparent and colorless glassy concentrate (abe4) was obtained. When the concentrate was analyzed by GPC, number average molecular weight (Mn) was 3,900 and weight average molecular weight (Mw) was 8,400.

Synthesis Example 29

Compound (abe4+es) was manufactured according to a formula below.

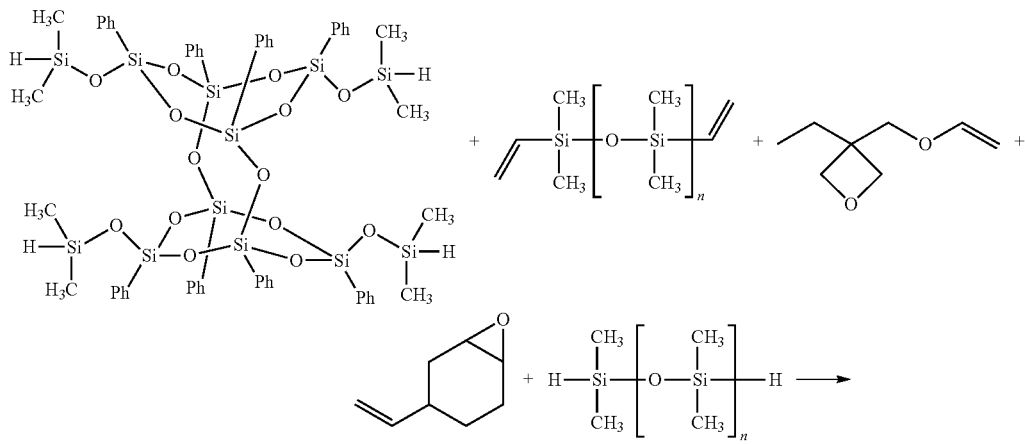

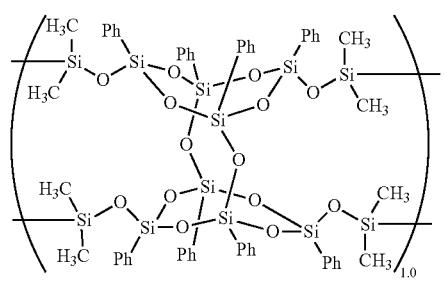
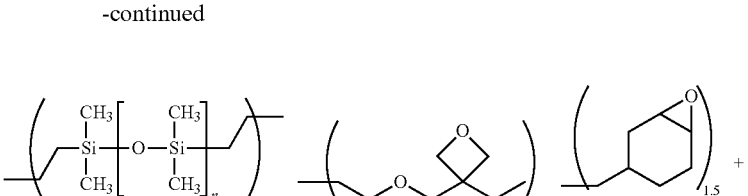
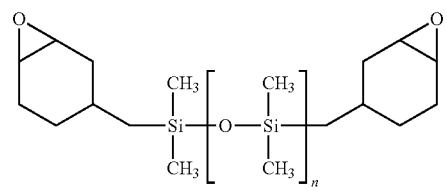

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2205 (8.1 g) were added. The resultant reaction mixture was heated to a reflux temperature and stirred for 2 hours.

The reaction temperature was decreased to 80° C., a Pt catalyst (5 μL) and EOXTVE (4.9 g) were added, and the resultant mixture was stirred for 3 hours. Subsequently, CELLOXIDE 2000 (4.3 g) was added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 55 g of a colorless glassy concentrate (abe4+es) was obtained. When the concentrate was analyzed by GPC, number average molecular weight (Mn) was 3,500 and weight average molecular weight (Mw) was 7,600.

Synthesis Example 30

Compound (abe5) was manufactured according to a formula below.

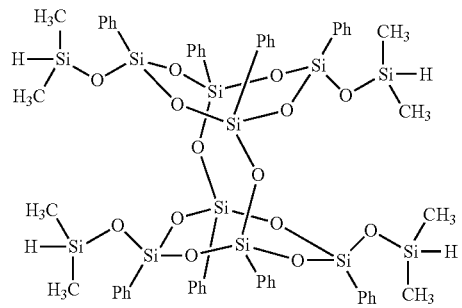
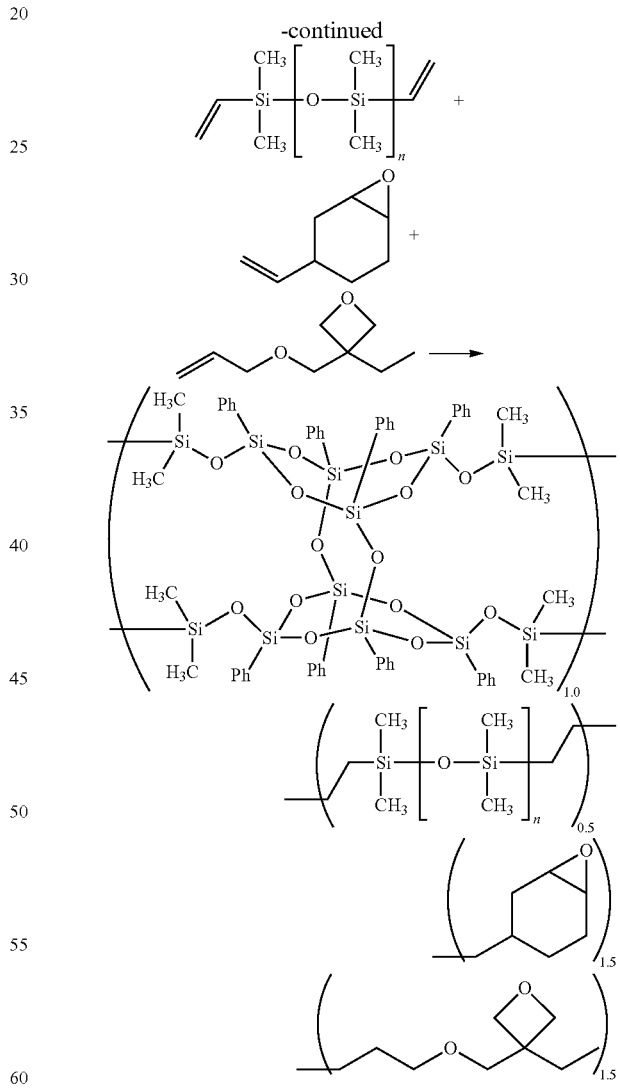

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2205 (8.1 g) were added. The resultant reaction mixture was heated to a reflux temperature and stirred for 2 hours.

The reaction temperature was decreased to 80° C., a Pt catalyst (5 μL) and allyl oxetane (5.4 g) were added, and the resultant mixture was stirred for 3 hours. Subsequently, CEL-LOXIDE 2000 (4.3 g) was added, and the resultant mixture was stirred for 2 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 46 g of a highly transparent and colorless glassy concentrate (abe5) was obtained. When the concentrate was analyzed by GPC, number average molecular weight (Mn) was 3,900 and weight average molecular weight (Mw) was 8,400.

Synthesis Example 31

Compound (abe5+es) was manufactured according to a formula below.

Under a nitrogen atmosphere, compound (A) (30 g) and dry ethyl acetate (45 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2205 (8.1 g) were added. The resultant reaction mixture was heated to a reflux temperature and stirred for 2 hours.

The reaction temperature was decreased to 80° C., a Pt catalyst (5 μL) and allyl oxetane (5.4 g) were added, and the resultant mixture was stirred for 3 hours. Subsequently, CEL-LOXIDE 2000 (trade name) (4.3 g) was added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 55 g of a colorless glassy concentrate (abe5+es) was obtained. When the concentrate was analyzed

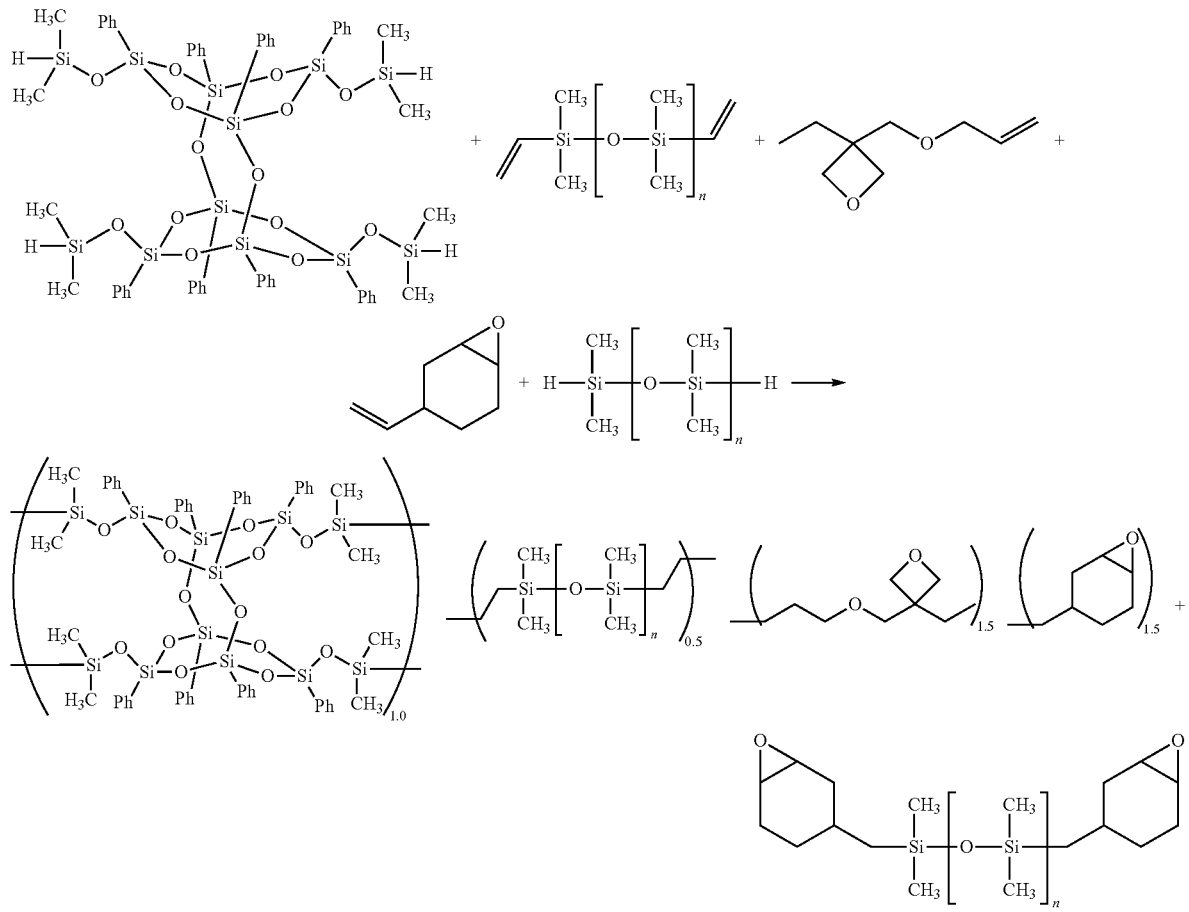

by GPC, number average molecular weight (Mn) was 3,500 and weight average molecular weight (Mw) was 7,600.

Synthesis Example 32

Compound (abfl) was manufactured according to a formula below.

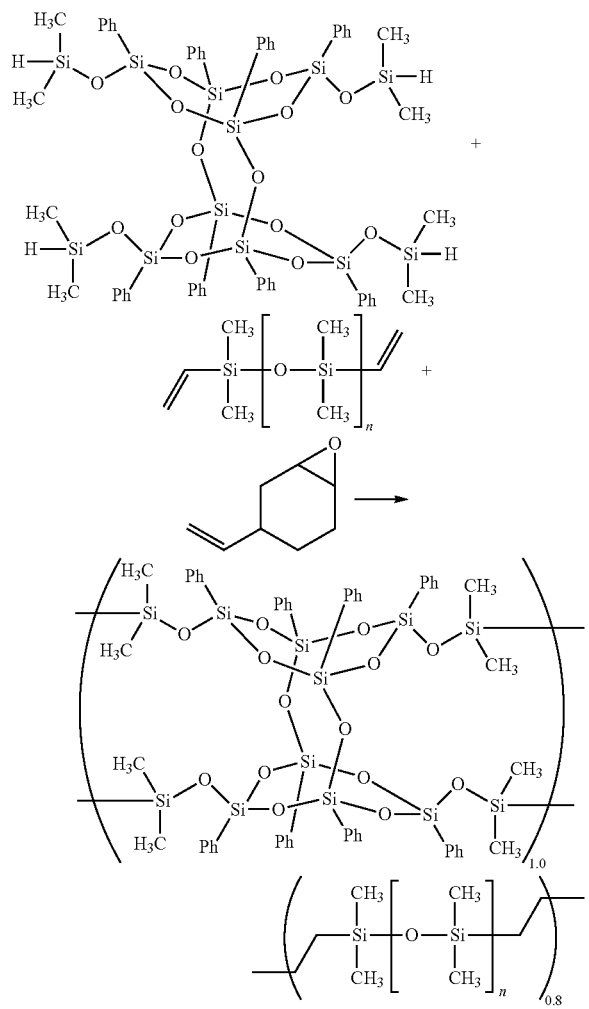

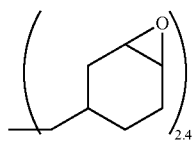

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (2 µL) and vinyl terminated polydimethylsiloxane at both terminals FM-2203 (7.4 g) (weight average molecular weight (Mw): 400, made by JNC Corporation) were added. The resultant reaction mixture was heated to a reflux temperature and stirred for 2 hours.

The reaction temperature was decreased to 80° C., a Pt catalyst (5 µL) and CELLOXIDE 2000 (6.9 g) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (4 g). Hexane (300 mL) was further added to allow washing of a purified material. A solution obtained was concentrated using an evaporator, and thus 47 g of a highly transparent and colorless glassy concentrate (abf1) was obtained. When the concentrate was analyzed by GPC, number average molecular weight (Mn) was 4,800 and weight average molecular weight (Mw) was 11,600.

Synthesis Example 33

Compound (abfl+es) was manufactured according to a formula below.

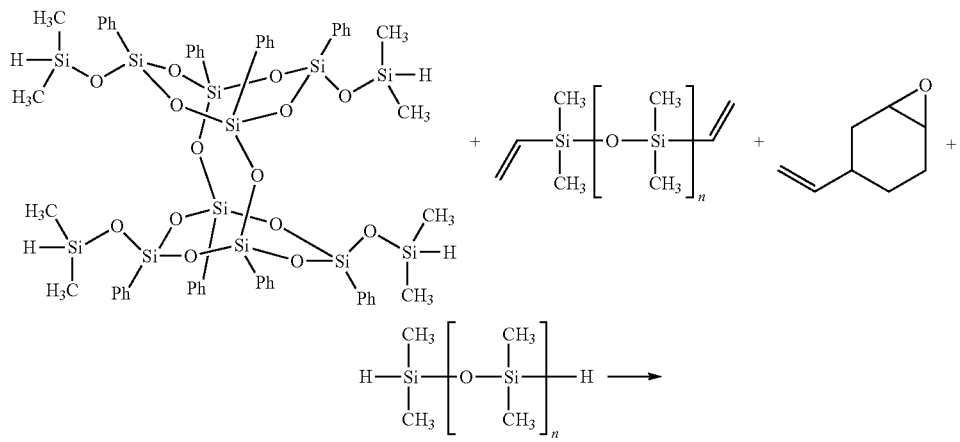

-continued

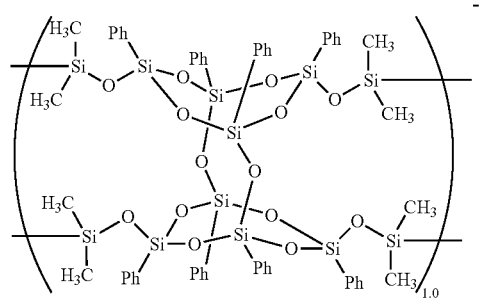 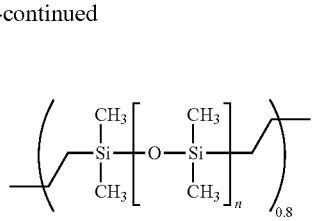 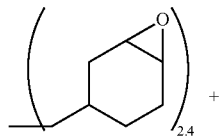

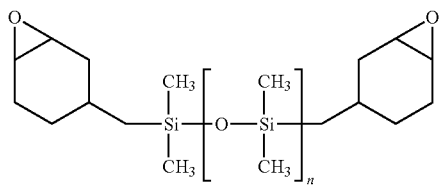

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (2 µL) and vinyl terminated polydimethylsiloxane at both terminals FM-2203 (7.4 g) (weight average molecular weight (Mw): 400, made by JNC Corporation) were added. The resultant reaction mixture was heated to a reflux temperature and stirred for 2 hours.

The reaction temperature was decreased to 80° C., a Pt catalyst (5 µL) and CELLOXIDE 2000 (6.9 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 51 g of a colorless glassy concentrate (abf1+es) was obtained. When the concentrate was analyzed by GPC, number average molecular weight (Mn) was 4,600 and weight average molecular weight (Mw) was 11,000.

Synthesis Example 34

Compound (abf2) was manufactured according to a formula below.

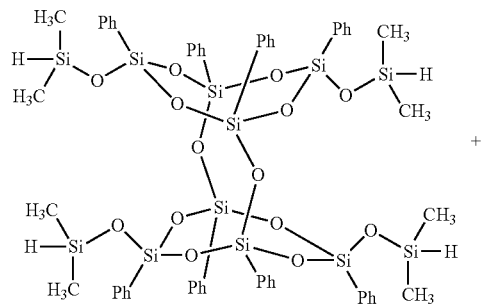

-continued

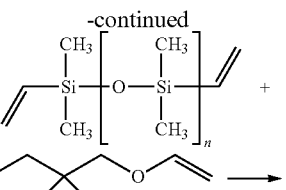

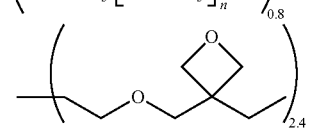

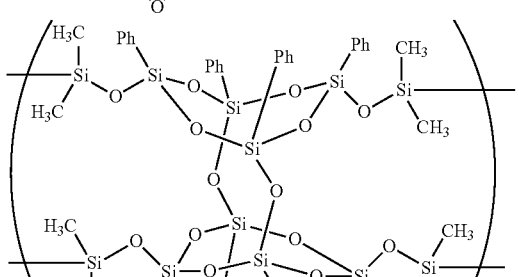

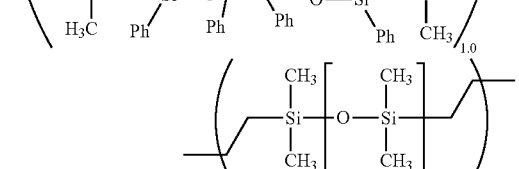

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (0.8 µL) and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 µL) and EOXTVE (7.9 g) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 300 mL of hexane was added to a concentrate obtained to allow dissolution at 50° C. Purification was performed by chromatography using Kyoward 500 (4 g). Hexane (300 mL) was further added to allow washing of a purified material. A solution obtained was concentrated using an evaporator, and thus 43 g of a highly transparent and colorless glassy concentrate (abf2) was obtained. When the concentrate was analyzed by GPC, number average molecular weight (Mn) was 4,800 and weight average molecular weight (Mw) was 11,600.

Synthesis Example 35

Compound (abf2+es) was manufactured according to a formula below.

catalyst (0.8 μL) and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 μL) and EOXTVE (7.9 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 53 g of a colorless glassy concentrate (abf2+es) was obtained. When the concentrate was analyzed

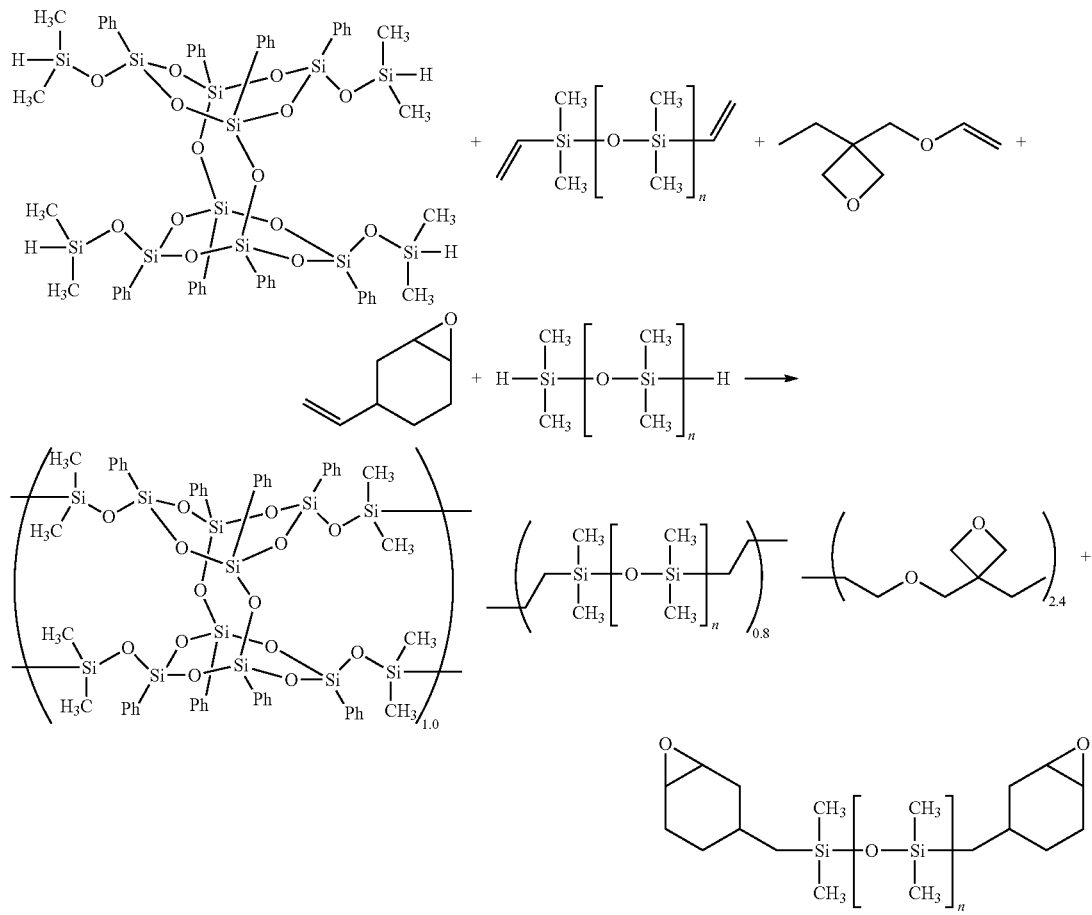

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt by GPC, number average molecular weight (Mn) was 4,600 and weight average molecular weight (Mw) was 11,000.

Synthesis Example 36

Compound (abf3) was manufactured according to a formula below.

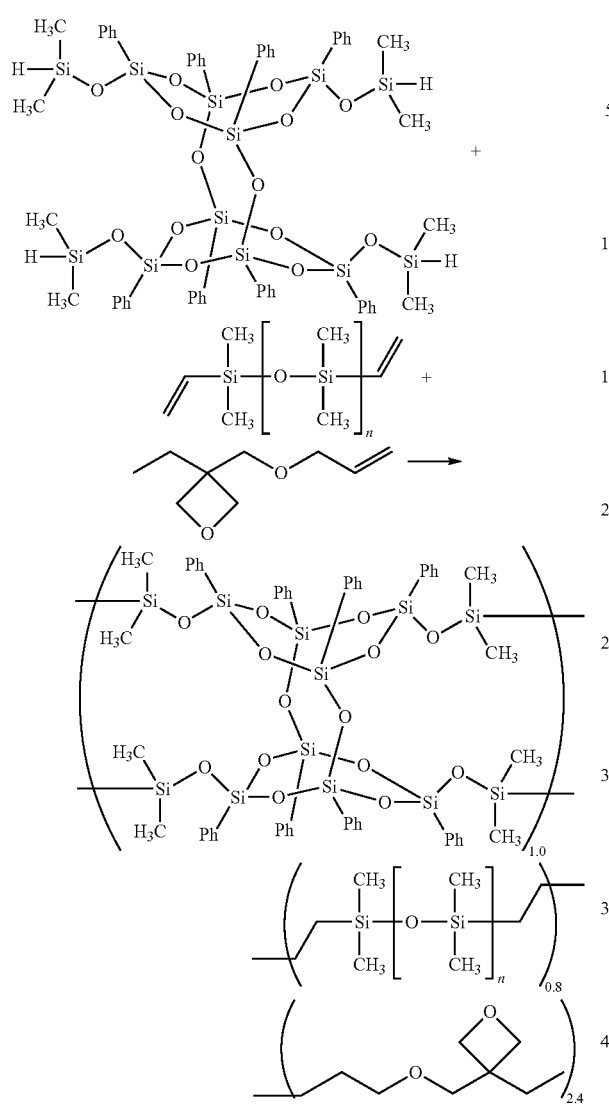

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 μL) and allyl oxetane (8.6 g) were added, and the resultant mixture was stirred for 5 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (4 g). Hexane (300 mL) was further added to allow washing of a purified material. A solution obtained was concentrated using an evaporator, and thus 44 g of a highly transparent and colorless glassy concentrate (abf3) was obtained. When the concentrate was analyzed by GPC, number average molecular weight (Mn) was 4,800 and weight average molecular weight (Mw) was 11,600.

Synthesis Example 37

Compound (abf3+es) was manufactured according to a formula below.

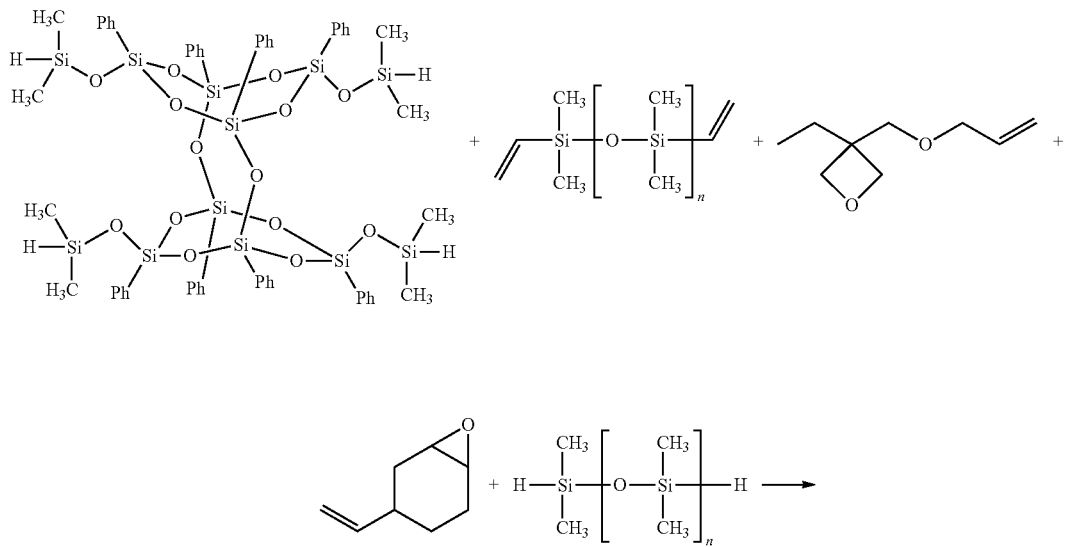

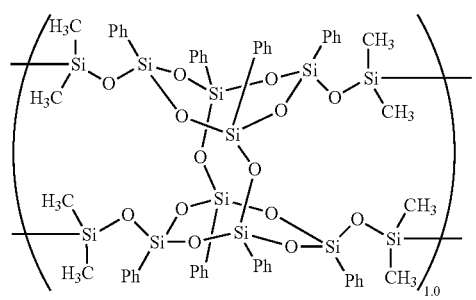
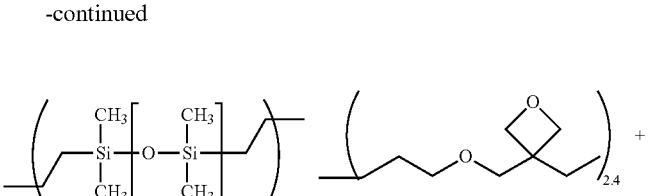

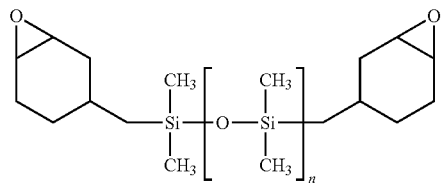

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 μL) and allyl oxetane (8.6 g) were added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 53 g of a colorless glassy concentrate (abf3+es) was obtained. When the concentrate was analyzed by GPC, number average molecular weight (Mn) was 4,600 and weight average molecular weight (Mw) was 11,000.

Synthesis Example 38

Compound (abf4) was manufactured according to a formula below.

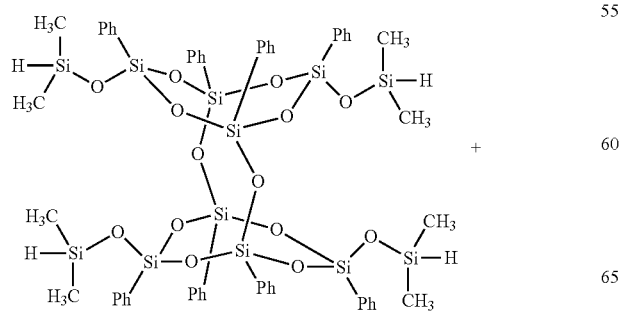

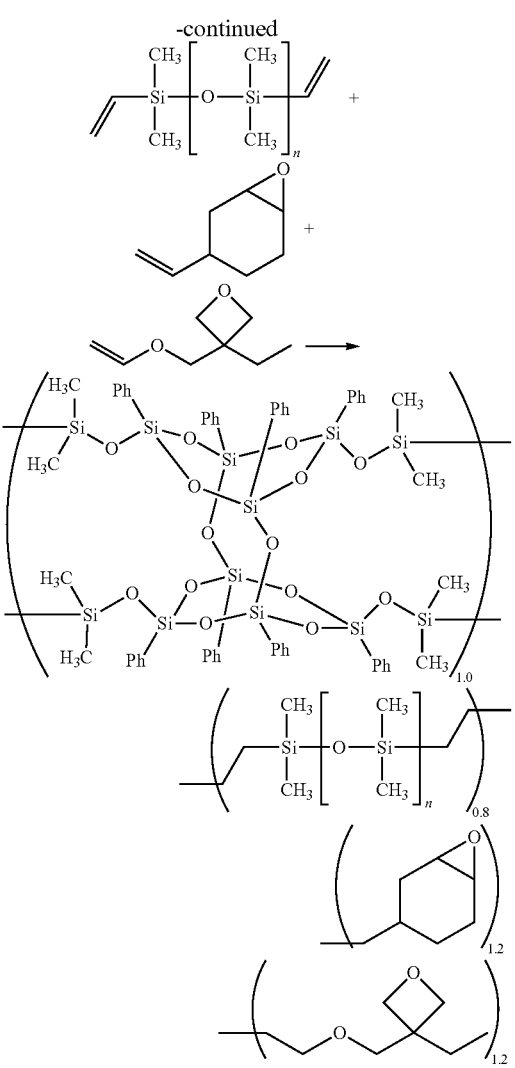

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 μl) and EOXTVE (3.9 g) were added, and the resultant mixture was stirred for 3 hours. Subsequently, CELLOXIDE 2000 (3.4 g) was added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 42 g of a highly transparent and colorless glassy concentrate (abf4) was obtained. When the concentrate was analyzed by GPC, number average molecular weight (Mn) was 4,800 and weight average molecular weight (Mw) was 11,600.

Synthesis Example 39

Compound (abf4+es) was manufactured according to a formula below.

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μl) and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 μL) and EOXTVE (3.9 g) were added, and the resultant mixture was stirred for 3 hours. Subsequently, CELLOXIDE 2000 (3.4 g) was added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 ((5 g). Hexane (300 mL) was further added to allow washing of a purified material. A solution obtained was concentrated using an evaporator, and thus 53 g of a colorless glassy concentrate

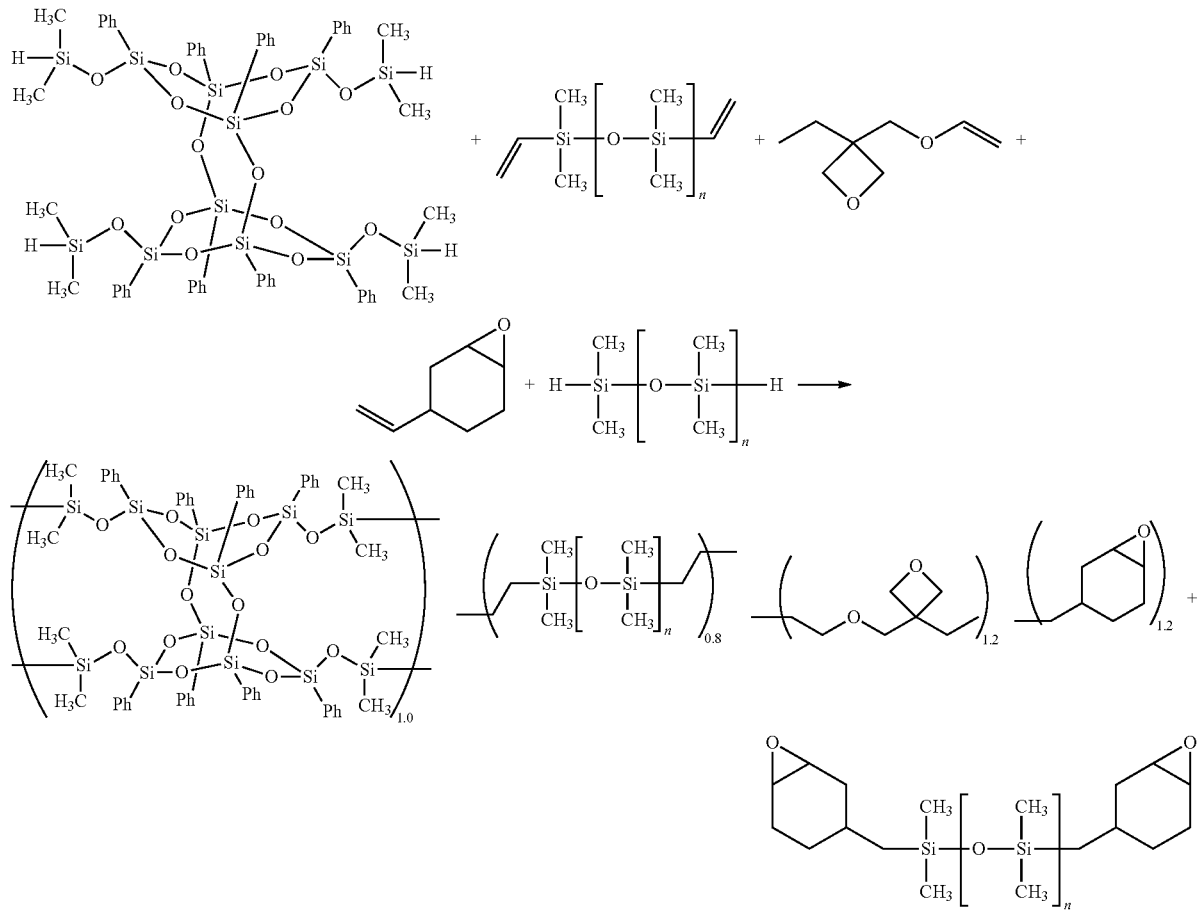

(abf4+es) was obtained. When the concentrate was analyzed by GPC, number average molecular weight (Mn) was 4,600 and weight average molecular weight (Mw) was 11,000.

Synthesis Example 40

Compound (abf5) was manufactured according to a formula below.

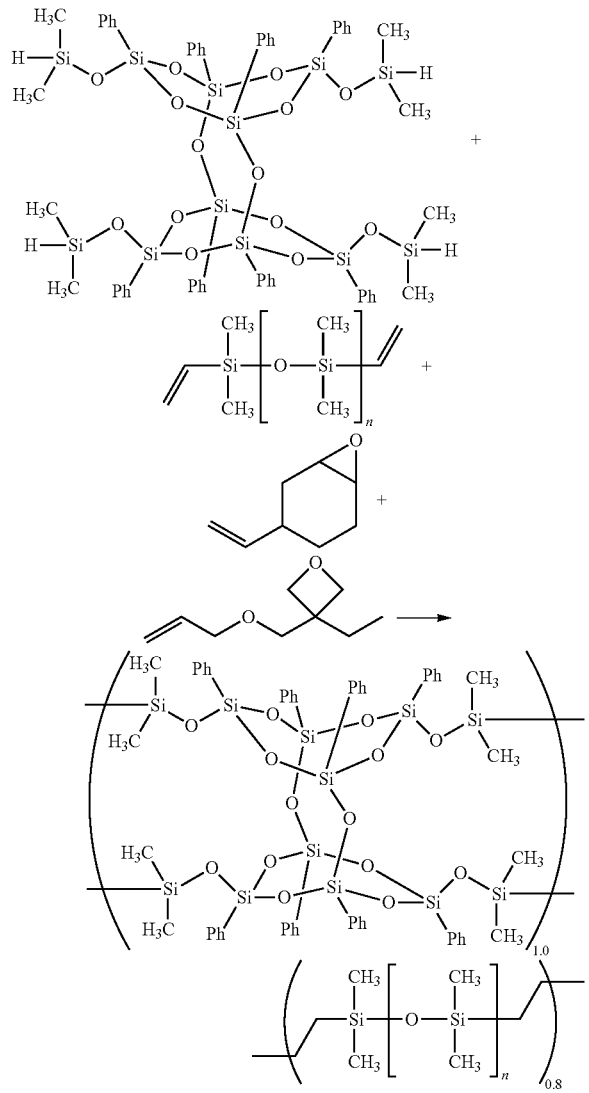

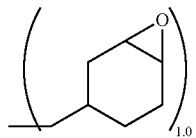

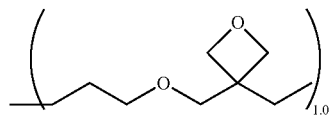

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 μL) and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 μL) and allyl oxetane (4.3 g) were added, and the resultant mixture was stirred for 3 hours. Subsequently, CEL-LOXIDE 2000 (trade name) (3.6 g) was added, and the resultant mixture was stirred for 3 hours. The resultant reaction mixture was cooled to room temperature, 1 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 43 g of a highly transparent and colorless glassy concentrate (abf5) was obtained. When the concentrate was analyzed by GPC, number average molecular weight (Mn) was 4,800 and weight average molecular weight (Mw) was 11,600.

Synthesis Example 41

Compound (abf5+es) was manufactured according to a formula below.

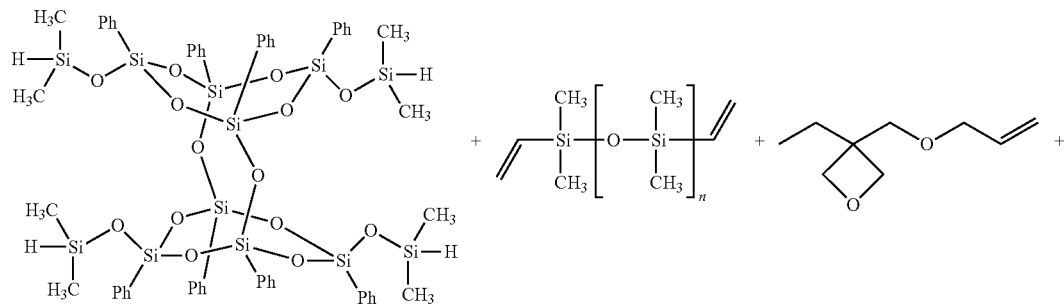

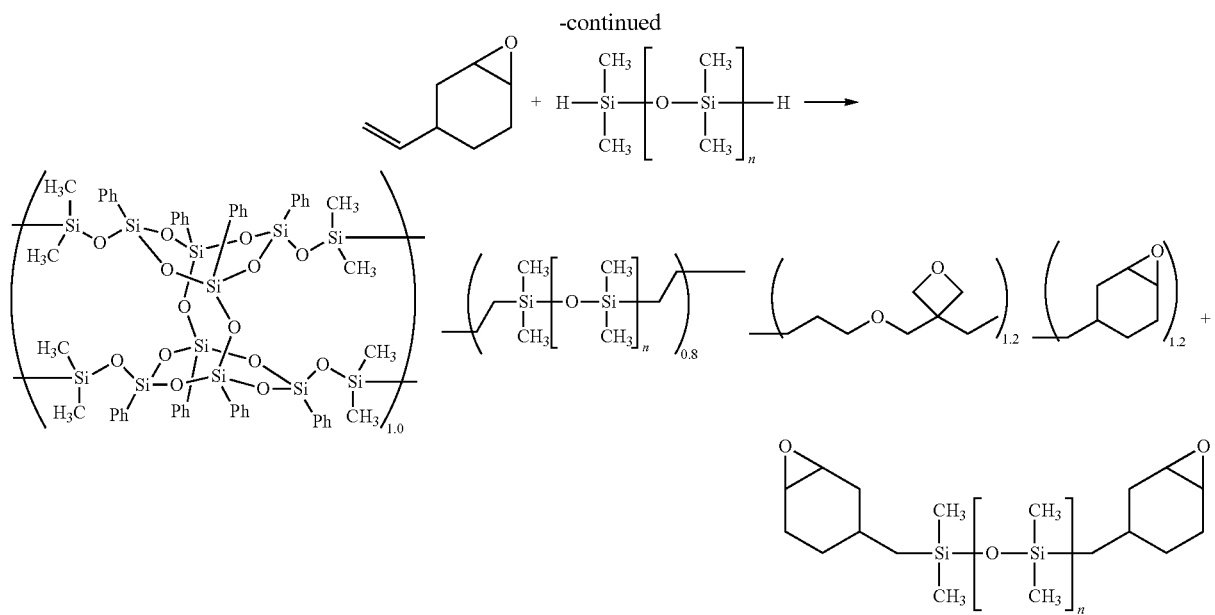

Under a nitrogen atmosphere, compound (A) (30 g) and dry ethyl acetate (51 g) were charged into a reaction vessel having an internal volume of 200 mL and equipped with a thermometer, a dropping funnel and a reflux condenser, and the resultant mixture was sealed with dry nitrogen. While the resultant mixture was stirred with a magnetic stirrer, the mixture was heated for a reaction temperature to be 80° C. A Pt catalyst (1 and vinyl terminated polydimethylsiloxane at both terminals FM-2203 (7.4 g) were added. The resultant reaction mixture was heated to a reflux temperature and stirred for 2 hours.

The reaction temperature was decreased to 80° C., a Pt catalyst (5 μL) and ally oxetane (4.3 g) were added, and the resultant mixture was stifled for 3 hours. Subsequently, CEL-LOXIDE 2000 (3.4 g) was added, and the resultant mixture was stirred for 3 hours.

Subsequently, FM-1105 (5.9 g) and CELLOXIDE 2000 (3.2 g) were added, and the resultant mixture was stirred for 1 hour. The resultant reaction mixture was cooled to room temperature, 2 g of activated carbon was added, and the resultant mixture was stirred overnight.

The activated carbon was removed by filtration. The resultant filtrate was transferred into an evaporator and concentrated therein. Then, 500 mL of hexane was added to a concentrate obtained to allow dissolution at 50° C. Purification was performed by chromatography using Kyoward 500 (5 g). Hexane (300 mL) was further added to allow washing of a purified material. A solution obtained was concentrated using an evaporator, and thus 53 g of a colorless glassy concentrate (abf5+es) was obtained. When the concentrate was analyzed by GPC, number average molecular weight (Mn) was 4,600 and weight average molecular weight (Mw) was 11,000.

Surface Treatment of a Phosphor with a Silane Coupling Agent

Under a nitrogen atmosphere, 2 g of a yellow phosphor YAG $(Y,Gd)_3(Al,Ga)_5O_{12}:Ce)$, 0.2 g of silane coupling agent (Silaplane 5530 (trade name), made by Chisso Corporation), and 100 mL of 95% ethanol were added to a reaction vessel having an internal volume of 200 mL and equipped with a thermometer, a dropping funnel and a reflux condenser, and the resultant mixture was stirred at 80° C. for 1 hour. After a reaction, a solvent was distilled off under reduced pressure at 100° C., and thus a phosphor subjected to surface modification was obtained.

Main Materials Used in the Present Examples

Silicon Compound Having an Epoxy Group

Compounds (ab), (abc1), (abc1+es), (abc2), (abc2+es), (abc3), (abc3+es), (abc4), (abc4+es), (abc5), (abc5+es), (abd1), (abd1+es), (abd2), (abd2+es), (abd3), (abd3+es), (abd4), (abd4+es), (abd5), (abd5+es), (abe1), (abe1+es), (abet), (abe2+es), (abe3), (abe3+es), (abe4), (abe4+es), (abe5), (abe5+es), (abf1), (abf1+es), (abf2), (abf2+es), (abf3), (abf3+es), (abf4), (abf4+es), (abf5), and (abf5+es), as manufactured in Synthesis Examples Phosphor Yellow phosphor YAG subjected to surface modification with a silane coupling agent (Silaplane 5530 (trade name), made by Chisso Corporation)

Hardening Agent

Thermal cationic polymerization initiator: TA-100, made by San-Apro Ltd.

Photocationic polymerization initiator: HS-1PG, made by San-Apro Ltd.

Epoxy Resin Including No Benzene Ring and No Silicon Atom in a Molecule

Oxetane resin: Aron Oxetane (trade name) DOX, made by Toagosei Co., Ltd.

Epoxy resin: CELLOXIDE (trade name) CEL2021P, made by Daicel Chemical Industries, Ltd.

Silane Coupling Agent

Silane coupling agent 5530 (trade name), made by Chisso Corporation Stabilizer

Antioxidant: IRGANOX 1010 (trade name), made by Ciba Japan K.K.

Antioxidant: IRGAFOS 168 (trade name), made by Ciba Japan K.K.

(Preparation of Hardened Materials 1 to 128)

A mixture of a stabilizer, an epoxy resin including no benzene ring and no silicon atom in a molecule, and a compound prepared in Synthetic Example was put into a screw vial, including compound (ab), (abc1), (abc1+es), (abc2), (abc2+es), (abc3), (abc3+es), (abc4), (abc4+es), (abc5), (abc5+es), (abd1), (abd1+es), (abd2), (abd2+es), (abd3), (abd3+es), (abd4), (abd4+es), (abd5), (abd5+es), (abe1), (abe1+es), (abe2), (abe2+es), (abe3), (abe3+es), (abe4), (abe4+es), (abe5), (abe5+es), (abf1), (abf1+es), (abf2), (abf2+es), (abf3), (abf3+es), (abf4), (abf4+es), (abf5) or (abf5+es) prepared in Synthesis Example 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40 or 41, and subsequently a thermal cationic polymerization initiator was added therein as a hardening agent. The screw vial was set to Planetary Centrifugal Mixer (Thinky Mixer ARE-250 (trade name), made by Thinky Corporation), mixing and defoaming were performed, and thus a varnish was prepared.

The varnish was coated onto a biaxially oriented polyester film (50 μm, made by Mitsubishi Chemical Polyester Film Co., Ltd.) at a thickness of 100 micrometers with avoiding involvement of foam, a coated film was placed in an oven warmed at 100° C. to allow hardening. Heating was performed in the order of 100° C. for 1 hour, and 150° C. for 3 hours, and thus an epoxy silsesquioxane film was obtained. A film obtained was cut using a cutter knife, and a sample for measuring each of physical properties was prepared.
(Preparation of Hardened Materials 129 to 328)

Hardened materials 129 to 328 were prepared in a manner similar to preparation of hardened materials 1 to 128 except the hardening agent was changed to a photocationic polymerization initiator.

A mixture of an antioxidant, an epoxy resin, and a compound prepared in Synthetic Example was put into a screw vial, including a compound prepared in Synthesis Example 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40 or 41, and subsequently a cationic polymerization initiator was added therein. The screw vial was set to Planetary Centrifugal Mixer (Thinky Mixer ARE-250 (trade name), made by Thinky Corporation), mixing and defoaming were performed, and thus a varnish was prepared.

The varnish was coated onto a biaxially oriented polyester film (50 um, made by Mitsubishi Chemical Polyester Film Co., Ltd.) at a thickness of 100 micrometers with avoiding involvement of foam.

When ultraviolet ray irradiation equipment J-CURE 1500 (trade name), made by JAPAN TECHNOLOGY SYSTEM Corporation, was used, and the varnish was irradiated with i-rays having an intensity of 500 mJ/cm$^2$, an epoxy silsesquioxane film was obtained. A film obtained was cut using a cutter knife, and a sample for measuring each of physical properties was prepared.
(Preparation of comparative hardened materials 1 to 14) As a compound, at least one of an epoxy resin (CELLOXIDE CEL2021P (trade name), made by Daicel Chemical Industries, Ltd.), and octakis, made by Mayaterials, Inc., being a silsesquioxane derivative having an alicyclic epoxy group, was used, and as a hardening agent, a photocationic polymerization initiator was used, and thus a varnish was obtained in compositions as presented in Table 9 and Table 18. A film was prepared under conditions similar to the conditions for preparation of hardened materials 129 to 328.

Tables 1 to 9 and Tables 10 to 18 present compositions of hardened materials 1 to 328 and comparative hardened materials 1 to 14.

TABLE 1

| | Silicon-based polymer derivative | Epoxy including no silicon | Silane coupling agent (S530) | Hardening agent (TA-100) | Antioxidant Irganox1010:Irgafos168 1:3 |
|---|---|---|---|---|---|
| Hardened material 1 | ab (60) | DOX (40) | — | (0.01) | (1.0) |
| Hardened material 2 | ab (60) | DOX (35) | (5) | (0.01) | (1.0) |
| Hardened material 3 | ab (50) | CEL-2021P (50) | — | (0.01) | (1.0) |
| Hardened material 4 | ab (50) | CEL-2021P (45) | (5) | (0.01) | (1.0) |
| Hardened material 5 | abc1 (70) | DOX (30) | — | (0.01) | (1.0) |
| Hardened material 6 | abc1 (70) | DOX (25) | (5) | (0.01) | (1.0) |
| Hardened material 7 | abc1 (80) | CEL-2021P (20) | — | (0.01) | (1.0) |
| Hardened material 8 | abc1 (80) | CEL-2021P (15) | (5) | (0.01) | (1.0) |
| Hardened material 9 | [abc1 + es] (70) | DOX (30) | — | (0.01) | (1.0) |
| Hardened material 10 | [abc1 + es] (70) | DOX (25) | (5) | (0.01) | (1.0) |
| Hardened material 11 | [abc1 + es] (80) | CEL-2021P (20) | — | (0.01) | (1.0) |
| Hardened material 12 | [abc1 + es] (80) | CEL-2021P (15) | (5) | (0.01) | (1.0) |
| Hardened material 13 | abc2 (70) | DOX (30) | — | (0.01) | (1.0) |
| Hardened material 14 | abc2 (70) | DOX (25) | (5) | (0.01) | (1.0) |
| Hardened material 15 | abc2 (80) | CEL-2021P (20) | — | (0.01) | (1.0) |
| Hardened material 16 | abc2 (80) | CEL-2021P (15) | (5) | (0.01) | (1.0) |
| Hardened material 17 | [abc2 + es] (70) | DOX (30) | — | (0.01) | (1.0) |

TABLE 1-continued

|  | Silicon-based polymer derivative | Epoxy including no silicon | Silane coupling agent (S530) | Hardening agent (TA-100) | Antioxidant Irganox1010:Irgafos168 1:3 |
|---|---|---|---|---|---|
| Hardened material 18 | [abc2 + es] (70) | DOX (25) | (5) | (0.01) | (1.0) |
| Hardened material 19 | [abc2 + es] (80) | CEL-2021P (20) | — | (0.01) | (1.0) |
| Hardened material 20 | [abc2 + es] (80) | CEL-2021P (15) | (5) | (0.01) | (1.0) |

TABLE 2

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 21 | abc3 (70) | DOX (30) | — | (0.01) | (1.0) |
| Hardened material 22 | abc3 (70) | DOX (25) | (5) | (0.01) | (1.0) |
| Hardened material 23 | abc3 (70) | CEL-2021P (30) | — | (0.01) | (1.0) |
| Hardened material 24 | abc3 (70) | CEL-2021P (25) | (5) | (0.01) | (1.0) |
| Hardened material 25 | [abc3 + es] (70) | DOX (30) | — | (0.01) | (1.0) |
| Hardened material 26 | [abc3 + es] (70) | DOX (25) | (5) | (0.01) | (1.0) |
| Hardened material 27 | [abc3 + es] (80) | CEL-2021P (20) | — | (0.01) | (1.0) |
| Hardened material 28 | [abc3 + es] (80) | CEL-2021P (15) | (5) | (0.01) | (1.0) |
| Hardened material 29 | abc4 (70) | DOX (30) | — | (0.01) | (1.0) |
| Hardened material 30 | abc4 (70) | DOX (25) | (5) | (0.01) | (1.0) |
| Hardened material 31 | abc4 (80) | CEL-2021P (20) | — | (0.01) | (1.0) |
| Hardened material 32 | abc4 (80) | CEL-2021P (15) | (5) | (0.01) | (1.0) |
| Hardened material 33 | [abc4 + es] (70) | DOX (30) | — | (0.01) | (1.0) |
| Hardened material 34 | [abc4 + es] (70) | DOX (25) | (5) | (0.01) | (1.0) |
| Hardened material 35 | [abc4 + es] (80) | CEL-2021P (20) | — | (0.01) | (1.0) |
| Hardened material 36 | [abc3 + es] (80) | CEL-2021P (15) | (5) | (0.01) | (1.0) |
| Hardened material 37 | abc5 (70) | DOX (30) | — | (0.01) | (1.0) |
| Hardened material 38 | abc5 (70) | DOX (25) | (5) | (0.01) | (1.0) |
| Hardened material 39 | abc5 (80) | CEL-2021P (20) | — | (0.01) | (1.0) |
| Hardened material 40 | abc5 (80) | CEL-2021P (15) | (5) | (0.01) | (1.0) |

TABLE 3

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 41 | [abc5 + es] (70) | DOX (30) | — | (0.01) | (1.0) |
| Hardened material 42 | [abc5 + es] (70) | DOX (25) | (5) | (0.01) | (1.0) |
| Hardened material 43 | [abc5 + es] (80) | CEL-2021P (20) | — | (0.01) | (1.0) |
| Hardened material 44 | [abc5 + es] (80) | CEL-2021P (15) | (5) | (0.01) | (1.0) |

TABLE 3-continued

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 45 | abd1 (70) | DOX (30) | — | (0.01) | (1.0) |
| Hardened material 46 | abd1 (70) | DOX (25) | (5) | (0.01) | (1.0) |
| Hardened material 47 | abd1 (80) | CEL-2021P (20) | — | (0.01) | (1.0) |
| Hardened material 48 | abd1 (80) | CEL-2021P (15) | (5) | (0.01) | (1.0) |
| Hardened material 49 | [abd1 + es] (70) | DOX (30) | — | (0.01) | (1.0) |
| Hardened material 50 | [abd1 + es] (70) | DOX (25) | (5) | (0.01) | (1.0) |
| Hardened material 51 | [abd1 + es] (80) | CEL-2021P (20) | — | (0.01) | (1.0) |
| Hardened material 52 | [abd1 + es] (80) | CEL-2021P (15) | (5) | (0.01) | (1.0) |
| Hardened material 53 | abd2 (70) | DOX (30) | — | (0.01) | (1.0) |
| Hardened material 54 | abd2 (70) | DOX (25) | (5) | (0.01) | (1.0) |
| Hardened material 55 | abd2 (80) | CEL-2021P (20) | — | (0.01) | (1.0) |
| Hardened material 56 | abd2 (80) | CEL-2021P (15) | (5) | (0.01) | (1.0) |
| Hardened material 57 | [abd2 + es] (70) | DOX (30) | — | (0.01) | (1.0) |
| Hardened material 58 | [abd2 + es] (70) | DOX (25) | (5) | (0.01) | (1.0) |
| Hardened material 59 | [abd2 + es] (80) | CEL-2021P (20) | — | (0.01) | (1.0) |
| Hardened material 60 | [abd2 + es] (80) | CEL-2021P (15) | (5) | (0.01) | (1.0) |

TABLE 4

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 61 | abd3 (70) | DOX (30) | — | (0.01) | (1.0) |
| Hardened material 62 | abd3 (70) | DOX (25) | (5) | (0.01) | (1.0) |
| Hardened material 63 | abd3 (80) | CEL-2021P (20) | — | (0.01) | (1.0) |
| Hardened material 64 | abd3 (80) | CEL-2021P (15) | (5) | (0.01) | (1.0) |
| Hardened material 65 | [abd3 + es] (70) | DOX (30) | — | (0.01) | (1.0) |
| Hardened material 66 | [abd3 + es] (70) | DOX (25) | (5) | (0.01) | (1.0) |
| Hardened material 67 | [abd3 + es] (80) | CEL-2021P (20) | — | (0.01) | (1.0) |
| Hardened material 68 | [abd3 + es] (80) | CEL-2021P (15) | (5) | (0.01) | (1.0) |
| Hardened material 69 | abd4 (70) | DOX (30) | — | (0.01) | (1.0) |
| Hardened material 70 | abd4 (70) | DOX (25) | (5) | (0.01) | (1.0) |
| Hardened material 71 | abd4 (80) | CEL-2021P (20) | — | (0.01) | (1.0) |
| Hardened material 72 | abd4 (80) | CEL-2021P (15) | (5) | (0.01) | (1.0) |
| Hardened material 73 | [abd4 + es] (70) | DOX (30) | — | (0.01) | (1.0) |
| Hardened material 74 | [abd4 + es] (70) | DOX (25) | (5) | (0.01) | (1.0) |
| Hardened material 75 | [abd4 + es] (80) | CEL-2021P (20) | — | (0.01) | (1.0) |
| Hardened material 76 | [abd4 + es] (80) | CEL-2021P (15) | (5) | (0.01) | (1.0) |

TABLE 4-continued

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 77 | abd5 (70) | DOX (30) | — | (0.01) | (1.0) |
| Hardened material 78 | abd5 (70) | DOX (25) | (5) | (0.01) | (1.0) |
| Hardened material 79 | abd5 (80) | CEL-2021P (20) | — | (0.01) | (1.0) |
| Hardened material 80 | abd5 (80) | CEL-2021P (15) | (5) | (0.01) | (1.0) |

TABLE 5

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 81 | [abd5 + es] (70) | DOX (30) | — | (0.01) | (1.0) |
| Hardened material 82 | [abd5 + es] (70) | DOX (25) | (5) | (0.01) | (1.0) |
| Hardened material 83 | [abd5 + es] (80) | CEL-2021P (20) | — | (0.01) | (1.0) |
| Hardened material 84 | [abd5 + es] (80) | CEL-2021P (15) | (5) | (0.01) | (1.0) |
| Hardened material 85 | abe1 (70) | DOX (30) | — | (0.01) | (1.0) |
| Hardened material 86 | abe1 (70) | DOX (25) | (5) | (0.01) | (1.0) |
| Hardened material 87 | abe1 (80) | CEL-2021P (20) | — | (0.01) | (1.0) |
| Hardened material 88 | abe1 (80) | CEL-2021P (15) | (5) | (0.01) | (1.0) |
| Hardened material 89 | [abe1 + es] (70) | DOX (30) | — | (0.01) | (1.0) |
| Hardened material 90 | [abe1 + es] (70) | DOX (25) | (5) | (0.01) | (1.0) |
| Hardened material 91 | [abe1 + es] (80) | CEL-2021P (20) | — | (0.01) | (1.0) |
| Hardened material 92 | [abe1 + es] (80) | CEL-2021P (15) | (5) | (0.01) | (1.0) |
| Hardened material 93 | abe2 (70) | DOX (30) | — | (0.01) | (1.0) |
| Hardened material 94 | abe2 (70) | DOX (25) | (5) | (0.01) | (1.0) |
| Hardened material 95 | abe2 (80) | CEL-2021P (20) | — | (0.01) | (1.0) |
| Hardened material 96 | abe2 (80) | CEL-2021P (15) | (5) | (0.01) | (1.0) |
| Hardened material 97 | [abe2 + es] (70) | DOX (30) | — | (0.01) | (1.0) |
| Hardened material 98 | [abe2 + es] (70) | DOX (25) | (5) | (0.01) | (1.0) |
| Hardened material 99 | [abe2 + es] (80) | CEL-2021P (20) | — | (0.01) | (1.0) |
| Hardened material 100 | [abe2 + es] (80) | CEL-2021P (15) | (5) | (0.01) | (1.0) |

TABLE 6

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 101 | abe3 (70) | DOX (30) | — | (0.01) | (1.0) |
| Hardened material 102 | abe3 (70) | DOX (25) | (5) | (0.01) | (1.0) |
| Hardened material 103 | abe3 (80) | CEL-2021P (20) | — | (0.01) | (1.0) |

TABLE 6-continued

| | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 104 | abe3 (80) | CEL-2021P (15) | (5) | (0.01) | (1.0) |
| Hardened material 105 | [abe3 + es] (70) | DOX (30) | — | (0.01) | (1.0) |
| Hardened material 106 | [abe3 + es] (70) | DOX (25) | (5) | (0.01) | (1.0) |
| Hardened material 107 | [abe3 + es] (80) | CEL-2021P (20) | — | (0.01) | (1.0) |
| Hardened material 108 | [abe3 + es] (80) | CEL-2021P (15) | (5) | (0.01) | (1.0) |
| Hardened material 109 | abe4 (70) | DOX (30) | — | (0.01) | (1.0) |
| Hardened material 110 | abe4 (70) | DOX (25) | (5) | (0.01) | (1.0) |
| Hardened material 111 | abe4 (80) | CEL-2021P (20) | — | (0.01) | (1.0) |
| Hardened material 112 | abe4 (80) | CEL-2021P (15) | (5) | (0.01) | (1.0) |
| Hardened material 113 | [abe4 + es] (70) | DOX (30) | — | (0.01) | (1.0) |
| Hardened material 114 | [abe4 + es] (70) | DOX (25) | (5) | (0.01) | (1.0) |
| Hardened material 115 | [abe4 + es] (80) | CEL-2021P (20) | — | (0.01) | (1.0) |
| Hardened material 116 | [abe4 + es] (80) | CEL-2021P (15) | (5) | (0.01) | (1.0) |
| Hardened material 117 | abe5 (70) | DOX (30) | — | (0.01) | (1.0) |
| Hardened material 118 | abe5 (70) | DOX (25) | (5) | (0.01) | (1.0) |
| Hardened material 119 | abe5 (80) | CEL-2021P (20) | — | (0.01) | (1.0) |
| Hardened material 120 | abe5 (80) | CEL-2021P (15) | (5) | (0.01) | (1.0) |

TABLE 7

| | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 121 | [abe5 + es] (70) | DOX (30) | — | (0.01) | (1.0) |
| Hardened material 122 | [abe5 + es] (70) | DOX (25) | (5) | (0.01) | (1.0) |
| Hardened material 123 | [abe5 + es] (80) | CEL-2021P (20) | — | (0.01) | (1.0) |
| Hardened material 124 | [abe5 + es] (80) | CEL-2021P (15) | (5) | (0.01) | (1.0) |
| Hardened material 125 | abf1 (70) | DOX (30) | — | (0.01) | (1.0) |
| Hardened material 126 | abf1 (70) | DOX (25) | (5) | (0.01) | (1.0) |
| Hardened material 127 | abf1 (80) | CEL-2021P (20) | — | (0.01) | (1.0) |
| Hardened material 128 | abf1 (80) | CEL-2021P (15) | (5) | (0.01) | (1.0) |
| Hardened material 129 | [abf1 + es] (70) | DOX (30) | — | (0.01) | (1.0) |
| Hardened material 130 | [abf1 + es] (70) | DOX (25) | (5) | (0.01) | (1.0) |
| Hardened material 131 | [abf1 + es] (80) | CEL-2021P (20) | — | (0.01) | (1.0) |
| Hardened material 132 | [abf1 + es] (80) | CEL-2021P (15) | (5) | (0.01) | (1.0) |
| Hardened material 133 | abf2 (70) | DOX (30) | — | (0.01) | (1.0) |
| Hardened material 134 | abf2 (70) | DOX (25) | (5) | (0.01) | (1.0) |
| Hardened material 135 | abf2 (80) | CEL-2021P (20) | — | (0.01) | (1.0) |

TABLE 7-continued

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 136 | abf2 (80) | CEL-2021P (15) | (5) | (0.01) | (1.0) |
| Hardened material 137 | [abf2 + es] (70) | DOX (30) | — | (0.01) | (1.0) |
| Hardened material 138 | [abf2 + es] (70) | DOX (25) | (5) | (0.01) | (1.0) |
| Hardened material 139 | [abf2 + es] (80) | CEL-2021P (20) | — | (0.01) | (1.0) |
| Hardened material 140 | [abf2 + es] (80) | CEL-2021P (15) | (5) | (0.01) | (1.0) |

TABLE 8

|  | Silicon-based polymer derivative | Epoxy including no silicon | Silane coupling agent (S530) | Hardening agent (TA-100) | Antioxidant Irganox1010: Irgafos168 1:3 |
|---|---|---|---|---|---|
| Hardened material 141 | abf3 (70) | DOX (30) | — | (0.01) | (1.0) |
| Hardened material 142 | abf3 (70) | DOX (25) | (5) | (0.01) | (1.0) |
| Hardened material 143 | abf3 (80) | CEL-2021P (20) | — | (0.01) | (1.0) |
| Hardened material 144 | abf3 (80) | CEL-2021P (15) | (5) | (0.01) | (1.0) |
| Hardened material 145 | [abf3 + es] (70) | DOX (30) | — | (0.01) | (1.0) |
| Hardened material 146 | [abf3 + es] (70) | DOX (25) | (5) | (0.01) | (1.0) |
| Hardened material 147 | [abf3 + es] (80) | CEL-2021P (20) | — | (0.01) | (1.0) |
| Hardened material 148 | [abf3 + es] (80) | CEL-2021P (15) | (5) | (0.01) | (1.0) |
| Hardened material 149 | abf4 (70) | DOX (30) | — | (0.01) | (1.0) |
| Hardened material 150 | abf4 (70) | DOX (25) | (5) | (0.01) | (1.0) |
| Hardened material 151 | abf4 (80) | CEL-2021P (20) | — | (0.01) | (1.0) |
| Hardened material 152 | abf4 (80) | CEL-2021P (15) | (5) | (0.01) | (1.0) |
| Hardened material 153 | [abf4 + es] (70) | DOX (30) | — | (0.01) | (1.0) |
| Hardened material 154 | [abf4 + es] (70) | DOX (25) | (5) | (0.01) | (1.0) |
| Hardened material 155 | [abf4 + es] (80) | CEL-2021P (20) | — | (0.01) | (1.0) |
| Hardened material 156 | [abf4 + es] (80) | CEL-2021P (15) | (5) | (0.01) | (1.0) |
| Hardened material 157 | abf5 (70) | DOX (30) | — | (0.01) | (1.0) |
| Hardened material 158 | abf5 (70) | DOX (25) | (5) | (0.01) | (1.0) |
| Hardened material 159 | abf5 (80) | CEL-2021P (20) | — | (0.01) | (1.0) |
| Hardened material 160 | abf5 (80) | CEL-2021P (15) | (5) | (0.01) | (1.0) |
| Hardened material 161 | [abf5 + es] (70) | DOX (30) | — | (0.01) | (1.0) |
| Hardened material 162 | [abf5 + es] (70) | DOX (25) | (5) | (0.01) | (1.0) |
| Hardened material 163 | [abf5 + es] (80) | CEL-2021P (20) | — | (0.01) | (1.0) |
| Hardened material 164 | [abf5 + es] (80) | CEL-2021P (15) | (5) | (0.01) | (1.0) |

TABLE 9

|  | Silicon-based polymer derivative | Epoxy including no silicon | Hardening agent (TA-100) | Antioxidant Irganox 1010: Irgafos 168 1:3 | Remarks |
|---|---|---|---|---|---|
| Comparative hardened material 1 |  | CEL-2021P (100) | (0.01) | (1.0) |  |
| Comparative hardened material 2 |  | CEL-2021P (100) | (0.30) | (1.0) |  |
| Comparative hardened material 3 | T8-CEL2000(50) | CEL-2021P (50) | (0.01) | (1.0) | The silicon derivative was not dissolved. |
| Comparative hardened material 4 | T8-CEL2000(30) | CEL-2021P (70) | (0.01) | (1.0) | The antioxidant was not dissolved. |
| Comparative hardened material 5 | T8-CEL2000(30) | CEL-2021P (70) | (0.05) | (1.0) |  |
| Comparative hardened material 6 | T8-CEL2000(30) | DOX (70) | (0.01) | (1.0) | The silicon derivative was not dissolved. |
| Comparative hardened material 7 | T8-CEL2000(31) | DOX (47) CEL-2021P (22) | (0.01) | (1.0) |  |

TABLE 10

|  | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 165 | ab (60) | DOX (40) | — | (0.02) | (1.0) |
| Hardened material 166 | ab (60) | DOX (35) | (5) | (0.02) | (1.0) |
| Hardened material 167 | ab (50) | CEL-2021P (50) | — | (0.03) | (1.0) |
| Hardened material 168 | ab (50) | CEL-2021P (45) | (5) | (0.03) | (1.0) |
| Hardened material 169 | abc1 (70) | DOX (30) | — | (0.01) | (1.0) |
| Hardened material 170 | abc1 (70) | DOX (25) | (5) | (0.01) | (1.0) |
| Hardened material 171 | abc1 (80) | CEL-2021P (20) | — | (0.01) | (1.0) |
| Hardened material 172 | abc1 (80) | CEL-2021P (15) | (5) | (0.01) | (1.0) |
| Hardened material 173 | [abc1 + es] (70) | DOX (30) | — | (0.01) | (1.0) |
| Hardened material 174 | [abc1 + es] (70) | DOX (25) | (5) | (0.01) | (1.0) |
| Hardened material 175 | [abc1 + es] (80) | CEL-2021P (20) | — | (0.01) | (1.0) |
| Hardened material 176 | [abc1 + es] (80) | CEL-2021P (15) | (5) | (0.01) | (1.0) |
| Hardened material 177 | abc2 (70) | DOX (30) | — | (0.01) | (1.0) |
| Hardened material 178 |  | DOX (25) | (5) | (0.01) | (1.0) |
| Hardened material 179 | abc2 (80) | CEL-2021P (20) | — | (0.01) | (1.0) |
| Hardened material 180 | abc2 (80) | CEL-2021P (15) | (5) | (0.01) | (1.0) |
| Hardened material 181 | [abc2 + es] (70) | DOX (30) | — | (0.01) | (1.0) |
| Hardened material 182 | [abc2 + es] (70) | DOX (25) | (5) | (0.01) | (1.0) |
| Hardened material 183 | [abc2 + es] (80) | CEL-2021P (20) | — | (0.01) | (1.0) |

TABLE 10-continued

|   | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 184 | [abc2 + es] (80) | CEL-2021P (15) | (5) | (0.01) | (1.0) |

TABLE 11

|   | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 185 | abc3 (70) | DOX (30) | — | (0.01) | (1.0) |
| Hardened material 186 | abc3 (70) | DOX (25) | (5) | (0.01) | (1.0) |
| Hardened material 187 | abc3 (70) | CEL-2021P (30) | — | (0.01) | (1.0) |
| Hardened material 188 | abc3 (70) | CEL-2021P (25) | (5) | (0.01) | (1.0) |
| Hardened material 189 | [abc3 + es] (70) | DOX (30) | — | (0.01) | (1.0) |
| Hardened material 190 | [abc3 + es] (70) | DOX (25) | (5) | (0.01) | (1.0) |
| Hardened material 191 | [abc3 + es] (80) | CEL-2021P (20) | — | (0.01) | (1.0) |
| Hardened material 192 | [abc3 + es] (80) | CEL-2021P (15) | (5) | (0.01) | (1.0) |
| Hardened material 193 | abc4 (70) | DOX (30) | — | (0.01) | (1.0) |
| Hardened material 194 | abc4 (70) | DOX (25) | (5) | (0.01) | (1.0) |
| Hardened material 195 | abc4 (80) | CEL-2021P (20) | — | (0.01) | (1.0) |
| Hardened material 196 | abc4 (80) | CEL-2021P (15) | (5) | (0.01) | (1.0) |
| Hardened material 197 | [abc4 + es] (70) | DOX (30) | — | (0.01) | (1.0) |
| Hardened material 198 | [abc4 + es] (70) | DOX (25) | (5) | (0.01) | (1.0) |
| Hardened material 199 | [abc4 + es] (80) | CEL-2021P (20) | — | (0.01) | (1.0) |
| Hardened material 200 | [abc3 + es] (80) | CEL-2021P (15) | (5) | (0.01) | (1.0) |
| Hardened material 201 | abc5 (70) | DOX (30) | — | (0.01) | (1.0) |
| Hardened material 202 | abc5 (70) | DOX (25) | (5) | (0.01) | (1.0) |
| Hardened material 203 | abc5 (80) | CEL-2021P (20) | — | (0.01) | (1.0) |
| Hardened material 204 | abc5 (80) | CEL-2021P (15) | (5) | (0.01) | (1.0) |

TABLE 12

|   | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 205 | [abc5 + es] (70) | DOX (30) | — | (0.01) | (1.0) |
| Hardened material 206 | [abc5 + es] (70) | DOX (25) | (5) | (0.01) | (1.0) |
| Hardened material 207 | [abc5 + es] (80) | CEL-2021P (20) | — | (0.01) | (1.0) |
| Hardened material 208 | [abc5 + es] (80) | CEL-2021P (15) | (5) | (0.01) | (1.0) |
| Hardened material 209 | abd1 (70) | DOX (30) | — | (0.01) | (1.0) |
| Hardened material 210 | abd1 (70) | DOX (25) | (5) | (0.01) | (1.0) |

TABLE 12-continued

| | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 211 | abd1 (80) | CEL-2021P (20) | — | (0.01) | (1.0) |
| Hardened material 212 | abd1 (80) | CEL-2021P (15) | (5) | (0.01) | (1.0) |
| Hardened material 213 | [abd1 + es] (70) | DOX (30) | — | (0.01) | (1.0) |
| Hardened material 214 | [abd1 + es] (70) | DOX (25) | (5) | (0.01) | (1.0) |
| Hardened material 215 | [abd1 + es] (80) | CEL-2021P (20) | — | (0.01) | (1.0) |
| Hardened material 216 | [abd1 + es] (80) | CEL-2021P (15) | (5) | (0.01) | (1.0) |
| Hardened material 217 | abd2 (70) | DOX (30) | — | (0.01) | (1.0) |
| Hardened material 218 | abd2 (70) | DOX (25) | (5) | (0.01) | (1.0) |
| Hardened material 219 | abd2 (80) | CEL-2021P (20) | — | (0.01) | (1.0) |
| Hardened material 220 | abd2 (80) | CEL-2021P (15) | (5) | (0.01) | (1.0) |
| Hardened material 221 | [abd2 + es] (70) | DOX (30) | — | (0.01) | (1.0) |
| Hardened material 222 | [abd2 + es] (70) | DOX (25) | (5) | (0.01) | (1.0) |
| Hardened material 223 | [abd2 + es] (80) | CEL-2021P (20) | — | (0.01) | (1.0) |
| Hardened material 224 | [abd2 + es] (80) | CEL-2021P (15) | (5) | (0.01) | (1.0) |

TABLE 13

| | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 225 | abd3 (70) | DOX (30) | — | (0.01) | (1.0) |
| Hardened material 226 | abd3 (70) | DOX (25) | (5) | (0.01) | (1.0) |
| Hardened material 227 | abd3 (80) | CEL-2021P (20) | — | (0.01) | (1.0) |
| Hardened material 228 | abd3 (80) | CEL-2021P (15) | (5) | (0.01) | (1.0) |
| Hardened material 229 | [abd3 + es] (70) | DOX (30) | — | (0.01) | (1.0) |
| Hardened material 230 | [abd3 + es] (70) | DOX (25) | (5) | (0.01) | (1.0) |
| Hardened material 231 | [abd3 + es] (80) | CEL-2021P (20) | — | (0.01) | (1.0) |
| Hardened material 232 | [abd3 + es] (80) | CEL-2021P (15) | (5) | (0.01) | (1.0) |
| Hardened material 233 | abd4 (70) | DOX (30) | — | (0.01) | (1.0) |
| Hardened material 234 | abd4 (70) | DOX (25) | (5) | (0.01) | (1.0) |
| Hardened material 235 | abd4 (80) | CEL-2021P (20) | — | (0.01) | (1.0) |
| Hardened material 236 | abd4 (80) | CEL-2021P (15) | (5) | (0.01) | (1.0) |
| Hardened material 237 | [abd4 + es] (70) | DOX (30) | — | (0.01) | (1.0) |
| Hardened material 238 | [abd4 + es] (70) | DOX (25) | (5) | (0.01) | (1.0) |
| Hardened material 239 | [abd4 + es] (80) | CEL-2021P (20) | — | (0.01) | (1.0) |
| Hardened material 240 | [abd4 + es] (80) | CEL-2021P (15) | (5) | (0.01) | (1.0) |
| Hardened material 241 | abd5 (70) | DOX (30) | — | (0.01) | (1.0) |
| Hardened material 242 | abd5 (70) | DOX (25) | (5) | (0.01) | (1.0) |

TABLE 13-continued

|  | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 243 | abd5 (80) | CEL-2021P (20) | — | (0.01) | (1.0) |
| Hardened material 244 | abd5 (80) | CEL-2021P (15) | (5) | (0.01) | (1.0) |

TABLE 14

|  | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 245 | [abd5 + es] (70) | DOX (30) | — | (0.01) | (1.0) |
| Hardened material 246 | [abd5 + es] (70) | DOX (25) | (5) | (0.01) | (1.0) |
| Hardened material 247 | [abd5 + es] (80) | CEL-2021P (20) | — | (0.01) | (1.0) |
| Hardened material 248 | [abd5 + es] (80) | CEL-2021P (15) | (5) | (0.01) | (1.0) |
| Hardened material 249 | abe1 (70) | DOX (30) | — | (0.01) | (1.0) |
| Hardened material 250 | abe1 (70) | DOX (25) | (5) | (0.01) | (1.0) |
| Hardened material 251 | abe1 (80) | CEL-2021P (20) | — | (0.01) | (1.0) |
| Hardened material 252 | abe1 (80) | CEL-2021P (15) | (5) | (0.01) | (1.0) |
| Hardened material 253 | [abe1 + es] (70) | DOX (30) | — | (0.01) | (1.0) |
| Hardened material 254 | [abe1 + es] (70) | DOX (25) | (5) | (0.01) | (1.0) |
| Hardened material 255 | [abe1 + es] (80) | CEL-2021P (20) | — | (0.01) | (1.0) |
| Hardened material 256 | [abe1 + es] (80) | CEL-2021P (15) | (5) | (0.01) | (1.0) |
| Hardened material 257 | abe2 (70) | DOX (30) | — | (0.01) | (1.0) |
| Hardened material 258 | abe2 (70) | DOX (25) | (5) | (0.01) | (1.0) |
| Hardened material 259 | abe2 (80) | CEL-2021P (20) | — | (0.01) | (1.0) |
| Hardened material 260 | abe2 (80) | CEL-2021P (15) | (5) | (0.01) | (1.0) |
| Hardened material 261 | [abe2 + es] (70) | DOX (30) | — | (0.01) | (1.0) |
| Hardened material 262 | [abe2 + es] (70) | DOX (25) | (5) | (0.01) | (1.0) |
| Hardened material 263 | [abe2 + es] (80) | CEL-2021P (20) | — | (0.01) | (1.0) |
| Hardened material 264 | [abe2 + es] (80) | CEL-2021P (15) | (5) | (0.01) | (1.0) |

TABLE 15

|  | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 265 | abe3 (70) | DOX (30) | — | (0.01) | (1.0) |
| Hardened material 266 | abe3 (70) | DOX (25) | (5) | (0.01) | (1.0) |
| Hardened material 267 | abe3 (80) | CEL-2021P (20) | — | (0.01) | (1.0) |
| Hardened material 268 | abe3 (80) | CEL-2021P (15) | (5) | (0.01) | (1.0) |
| Hardened material 269 | [abe3 + es] (70) | DOX (30) | — | (0.01) | (1.0) |

TABLE 15-continued

| | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 270 | [abe3 + es] (70) | DOX (25) | (5) | (0.01) | (1.0) |
| Hardened material 271 | [abe3 + es] (80) | CEL-2021P (20) | — | (0.01) | (1.0) |
| Hardened material 272 | [abe3 + es] (80) | CEL-2021P (15) | (5) | (0.01) | (1.0) |
| Hardened material 273 | abe4 (70) | DOX (30) | — | (0.01) | (1.0) |
| Hardened material 274 | abe4 (70) | DOX (25) | (5) | (0.01) | (1.0) |
| Hardened material 275 | abe4 (80) | CEL-2021P (20) | — | (0.01) | (1.0) |
| Hardened material 276 | abe4 (80) | CEL-2021P (15) | (5) | (0.01) | (1.0) |
| Hardened material 277 | [abe4 + es] (70) | DOX (30) | — | (0.01) | (1.0) |
| Hardened material 278 | [abe4 + es] (70) | DOX (25) | (5) | (0.01) | (1.0) |
| Hardened material 279 | [abe4 + es] (80) | CEL-2021P (20) | — | (0.01) | (1.0) |
| Hardened material 280 | [abe4 + es] (80) | CEL-2021P (15) | (5) | (0.01) | (1.0) |
| Hardened material 281 | abe5 (70) | DOX (30) | — | (0.01) | (1.0) |
| Hardened material 282 | abe5 (70) | DOX (25) | (5) | (0.01) | (1.0) |
| Hardened material 283 | abe5 (80) | CEL-2021P (20) | — | (0.01) | (1.0) |
| Hardened material 284 | abe5 (80) | CEL-2021P (15) | (5) | (0.01) | (1.0) |

TABLE 16

| | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 285 | [abe5 + es] (70) | DOX (30) | — | (0.01) | (1.0) |
| Hardened material 286 | [abe5 + es] (70) | DOX (25) | (5) | (0.01) | (1.0) |
| Hardened material 287 | [abe5 + es] (80) | CEL-2021P (20) | — | (0.01) | (1.0) |
| Hardened material 288 | [abe5 + es] (80) | CEL-2021P (15) | (5) | (0.01) | (1.0) |
| Hardened material 289 | abf1 (70) | DOX (30) | — | (0.01) | (1.0) |
| Hardened material 290 | abf1 (70) | DOX (25) | (5) | (0.01) | (1.0) |
| Hardened material 291 | abf1 (80) | CEL-2021P (20) | — | (0.01) | (1.0) |
| Hardened material 292 | abf1 (80) | CEL-2021P (15) | (5) | (0.01) | (1.0) |
| Hardened material 293 | [abf1 + es] (70) | DOX (30) | — | (0.01) | (1.0) |
| Hardened material 294 | [abf1 + es] (70) | DOX (25) | (5) | (0.01) | (1.0) |
| Hardened material 295 | [abf1 + es] (80) | CEL-2021P (20) | — | (0.01) | (1.0) |
| Hardened material 296 | [abf1 + es] (80) | CEL-2021P (15) | (5) | (0.01) | (1.0) |
| Hardened material 297 | abf2 (70) | DOX (30) | — | (0.01) | (1.0) |
| Hardened material 298 | abf2 (70) | DOX (25) | (5) | (0.01) | (1.0) |
| Hardened material 299 | abf2 (80) | CEL-2021P (20) | — | (0.01) | (1.0) |
| Hardened material 300 | abf2 (80) | CEL-2021P (15) | (5) | (0.01) | (1.0) |
| Hardened material 301 | [abf2 + es] (70) | DOX (30) | — | (0.01) | (1.0) |

TABLE 16-continued

|  | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 302 | [abf2 + es] (70) | DOX (25) | (5) | (0.01) | (1.0) |
| Hardened material 303 | [abf2 + es] (80) | CEL-2021P (20) | — | (0.01) | (1.0) |
| Hardened material 304 | [abf2 + es] (80) | CEL-2021P (15) | (5) | (0.01) | (1.0) |

TABLE 17

|  | Silicon-based polymer derivative | Epoxy including no silicon | Silane coupling agent (S530) | Hardening agent (HS-1PG) | Antioxidant Irganox1010: Irgafos168 1:3 |
|---|---|---|---|---|---|
| Hardened material 305 | abf3 (70) | DOX (30) | — | (0.01) | (1.0) |
| Hardened material 306 | abf3 (70) | DOX (25) | (5) | (0.01) | (1.0) |
| Hardened material 307 | abf3 (80) | CEL-2021P (20) | — | (0.01) | (1.0) |
| Hardened material 308 | abf3 (80) | CEL-2021P (15) | (5) | (0.01) | (1.0) |
| Hardened material 309 | [abf3 + es] (70) | DOX (30) | — | (0.01) | (1.0) |
| Hardened material 310 | [abf3 + es] (70) | DOX (25) | (5) | (0.01) | (1.0) |
| Hardened material 311 | [abf3 + es] (80) | CEL-2021P (20) | — | (0.01) | (1.0) |
| Hardened material 312 | [abf3 + es] (80) | CEL-2021P (15) | (5) | (0.01) | (1.0) |
| Hardened material 313 | abf4 (70) | DOX (30) | — | (0.01) | (1.0) |
| Hardened material 314 | abf4 (70) | DOX (25) | (5) | (0.01) | (1.0) |
| Hardened material 315 | abf4 (80) | CEL-2021P (20) | — | (0.01) | (1.0) |
| Hardened material 316 | abf4 (80) | CEL-2021P (15) | (5) | (0.01) | (1.0) |
| Hardened material 317 | [abf4 + es] (70) | DOX (30) | — | (0.01) | (1.0) |
| Hardened material 318 | [abf4 + es] (70) | DOX (25) | (5) | (0.01) | (1.0) |
| Hardened material 319 | [abf4 + es] (80) | CEL-2021P (20) | — | (0.01) | (1.0) |
| Hardened material 320 | [abf4 + es] (80) | CEL-2021P (15) | (5) | (0.01) | (1.0) |
| Hardened material 321 | abf5 (70) | DOX (30) | — | (0.01) | (1.0) |
| Hardened material 322 | abf5 (70) | DOX (25) | (5) | (0.01) | (1.0) |
| Hardened material 323 | abf5 (80) | CEL-2021P (20) | — | (0.01) | (1.0) |
| Hardened material 324 | abf5 (80) | CEL-2021P(15) | (5) | (0.01) | (1.0) |
| Hardened material 325 | [abf5 + es] (70) | DOX (30) | — | (0.01) | (1.0) |
| Hardened material 326 | [abf5 + es] (70) | DOX (25) | (5) | (0.01) | (1.0) |
| Hardened material 327 | [abf5 + es] (80) | CEL-2021P (20) | — | (0.01) | (1.0) |
| Hardened material 328 | [abf5 + es] (80) | CEL-2021P (15) | (5) | (0.01) | (1.0) |

TABLE 18

| | Silicon-based polymer derivative | Epoxy including no silicon | Hardening agent (HS-1PG) | Antioxidant Irganox 1010: Irgafos 168 1:3 | Remarks |
|---|---|---|---|---|---|
| Comparative hardened material 8 | | CEL-2021P (100) | (0.01) | (1.0) | |
| Comparative hardened material 9 | | CEL-2021P (100) | (0.30) | (1.0) | |
| Comparative hardened material 10 | T8-CEL2000(50) | CEL-2021P (50) | (0.01) | (1.0) | The silicon derivative was not dissolved. |
| Comparative hardened material 11 | T8-CEL2000(30) | CEL-2021P (70) | (0.01) | (1.0) | The antioxidant was not dissolved. |
| Comparative hardened material 12 | T8-CEL2000(30) | CEL-2021P (70) | (0.05) | (1.0) | |
| Comparative hardened material 13 | T8-CEL2000(30) | DOX (70) | (0.01) | (1.0) | The silicon derivative was not dissolved. |
| Comparative hardened material 14 | T8-CEL2000(31) | DOX (47) CEL-2021P (22) | (0.01) | (1.0) | |

Physical properties of films obtained from hardened materials 1 to 328 and comparative hardened materials 1 to 14 were evaluated according methods described below. The results are presented in Tables 19 to 24 with regard to physical properties of films obtained from hardened materials 1 to 164 (Examples 1 to 164), and physical properties of films obtained from comparative hardened materials 1 to 7 (Comparative Examples 1 to 7), and presented in Tables 25 to 30 with regard to physical properties of films obtained from hardened materials 165 to 328 (Examples 165 to 328), and physical properties of films obtained from comparative hardened materials 8 to 14 (Comparative Examples 8 to 14).

Transparency in an Initial Stage

Luminous transmittance (at a wavelength of 400 nanometers) of each film was measured by means of a UV-Vis spectrophotometer (V-660, made by JASCO Corporation). The luminous transmittance was evaluated based on the following criteria:

A: 90% or more in luminous transmittance;

B: 70% or more and less than 90% in luminous transmittance; and

C: less than 70% in luminous transmittance.

Resistance to Thermal Yellowing

Moreover, a retention ratio {(luminous transmittance after heat treatment for 1,000 hours/luminous transmittance in an initial stage)×100} at a wavelength of 400 nanometers was calculated and evaluated. Moreover, a yellowness index (YI value) of a hardened material was calculated and evaluated as follows:

AA: less than 1 in a YI value;

A: 1 or more and less than 1.5 in a YI value;

B: 1.5 or more and less than 2.0 in a YI value; and

C: 2 or more in a YI value.

Heat Resistance Testing

Heat resistance testing was conducted according to a method described below, and heat resistance was evaluated. Two 100 μm-thick films were prepared, luminous transmittance of each film was measured by means of a UV-Vis spectrophotometer (V-660, made by JASCO Corporation), and transmittance at a wavelength of 400 nanometers was described as transmittance in an initial stage.

Each film was put into an oven at 150° C. (forced convection oven: DRM420DA, made by Advantech Toyo Co., Ltd.), and treated for 1,000 hours. Then, luminous transmittance (at a wavelength of 400 nanometers) of a hardened material before and after testing was measured by means of a UV-Vis spectrophotometer (V-660, made by JASCO Corporation). A retention ratio at the wavelength was evaluated from the luminous transmittance obtained based on the following criteria:

AA: 95% or more in a retention ratio of luminous transmittance;

A: 90% or more in a retention ratio of luminous transmittance;

B: 70 or more and less than 90% in a retention ratio of luminous transmittance; and C: less than 70% in a retention ratio of luminous transmittance.

Hardening Properties

Kinds of varnishes prepared in preparation steps of hardened materials 165 to 328 and comparative hardened materials 8 to 14 were exposed with light, and then hardening properties of films obtained were evaluated based on the following criteria:

A: tack-free and hard;

B: tack-free but a film being wrinkled; and

C: tacky.

Adhesion Testing

Kinds of varnishes prepared in preparation steps of hardened materials 1 to 328 and comparative hardened materials 1 to 14 were applied onto glass substrates, and 100 μm-thick films were prepared under conditions similar to the conditions described above. A hardened film obtained was evaluated according to cross cut peeling testing (cross cut testing). Adhesion testing was conducted according to a cross cut tape method for 100 squares each having a space interval of 1 mm, and adhesion was evaluated based on the following criteria:

AA: 0 to 3 in the number of peeled squares;

A: 4 to 10 in the number of peeled squares;

B: 11 to 30 in the number of peeled squares; and

C: 31 to 100 in the number of peeled squares.

TABLE 19

| | Transmittance in initial stage 400 nm | Retention ratio of transmittance by heat resistance testing at 150° C. | Resistance to yellowing by heat resistance testing at 150° C. | Adhesion testing |
|---|---|---|---|---|
| Example 1 | A | A | A | A |
| Example 2 | A | A | A | A |
| Example 3 | A | A | A | A |
| Example 4 | A | A | A | A |
| Example 5 | A | AA | AA | AA |
| Example 6 | A | AA | AA | AA |
| Example 7 | A | AA | AA | AA |
| Example 8 | A | AA | AA | AA |
| Example 9 | A | AA | AA | AA |
| Example 10 | A | AA | AA | AA |
| Example 11 | A | AA | AA | AA |
| Example 12 | A | AA | AA | AA |
| Example 13 | A | AA | AA | AA |
| Example 14 | A | AA | AA | AA |
| Example 15 | A | AA | AA | AA |
| Example 16 | A | AA | AA | AA |
| Example 17 | A | AA | AA | AA |
| Example 18 | A | AA | AA | AA |
| Example 19 | A | AA | AA | AA |
| Example 20 | A | AA | AA | AA |
| Example 21 | A | AA | AA | AA |
| Example 22 | A | AA | AA | AA |
| Example 23 | A | AA | AA | AA |
| Example 24 | A | AA | AA | AA |
| Example 25 | A | AA | AA | AA |
| Example 26 | A | AA | AA | AA |
| Example 27 | A | AA | AA | AA |
| Example 28 | A | AA | AA | AA |
| Example 29 | A | AA | AA | AA |
| Example 30 | A | AA | AA | AA |
| Example 31 | A | AA | AA | AA |
| Example 32 | A | AA | AA | AA |
| Example 33 | A | AA | AA | AA |
| Example 34 | A | AA | AA | AA |
| Example 35 | A | AA | AA | AA |

TABLE 20

| | Transmittance in initial stage 400 nm | Retention ratio of transmittance by heat resistance testing at 150° C. | Resistance to yellowing by heat resistance testing at 150° C. | Adhesion testing |
|---|---|---|---|---|
| Example 36 | A | AA | AA | AA |
| Example 37 | A | AA | AA | AA |
| Example 38 | A | AA | AA | AA |
| Example 39 | A | AA | AA | AA |
| Example 40 | A | AA | AA | AA |
| Example 41 | A | AA | AA | AA |
| Example 42 | A | AA | AA | AA |
| Example 43 | A | AA | AA | AA |
| Example 44 | A | AA | AA | AA |
| Example 45 | A | AA | AA | AA |
| Example 46 | A | AA | AA | AA |
| Example 47 | A | AA | AA | AA |
| Example 48 | A | AA | AA | AA |
| Example 49 | A | AA | AA | AA |
| Example 50 | A | AA | AA | AA |
| Example 51 | A | AA | AA | AA |
| Example 52 | A | AA | AA | AA |
| Example 53 | A | AA | AA | AA |
| Example 54 | A | AA | AA | AA |
| Example 55 | A | AA | AA | AA |
| Example 56 | A | AA | AA | AA |
| Example 57 | A | AA | AA | AA |
| Example 58 | A | AA | AA | AA |
| Example 59 | A | AA | AA | AA |
| Example 60 | A | AA | AA | AA |
| Example 61 | A | AA | AA | AA |
| Example 62 | A | AA | AA | AA |
| Example 63 | A | AA | AA | AA |
| Example 64 | A | AA | AA | AA |
| Example 65 | A | AA | AA | AA |
| Example 66 | A | AA | AA | AA |
| Example 67 | A | AA | AA | AA |
| Example 68 | A | AA | AA | AA |
| Example 69 | A | AA | AA | AA |
| Example 70 | A | AA | AA | AA |

TABLE 21

| | Transmittance in initial stage 400 nm | Retention ratio of transmittance by heat resistance testing at 150° C. | Resistance to yellowing by heat resistance testing at 150° C. | Adhesion testing |
|---|---|---|---|---|
| Example 71 | A | AA | AA | AA |
| Example 72 | A | AA | AA | AA |
| Example 73 | A | AA | AA | AA |
| Example 74 | A | AA | AA | AA |
| Example 75 | A | AA | AA | AA |
| Example 76 | A | AA | AA | AA |
| Example 77 | A | AA | AA | AA |
| Example 78 | A | AA | AA | AA |
| Example 79 | A | AA | AA | AA |
| Example 80 | A | AA | AA | AA |
| Example 81 | A | AA | AA | AA |
| Example 82 | A | AA | AA | AA |
| Example 83 | A | AA | AA | AA |
| Example 84 | A | AA | AA | AA |
| Example 85 | A | AA | AA | AA |
| Example 86 | A | AA | AA | AA |
| Example 87 | A | AA | AA | AA |
| Example 88 | A | AA | AA | AA |
| Example 89 | A | AA | AA | AA |
| Example 90 | A | AA | AA | AA |
| Example 91 | A | AA | AA | AA |
| Example 92 | A | AA | AA | AA |
| Example 93 | A | AA | AA | AA |
| Example 94 | A | AA | AA | AA |
| Example 95 | A | AA | AA | AA |
| Example 96 | A | AA | AA | AA |
| Example 97 | A | AA | AA | AA |
| Example 98 | A | AA | AA | AA |
| Example 99 | A | AA | AA | AA |
| Example 100 | A | AA | AA | AA |
| Example 101 | A | AA | AA | AA |
| Example 102 | A | AA | AA | AA |
| Example 103 | A | AA | AA | AA |
| Example 104 | A | AA | AA | AA |
| Example 105 | A | AA | AA | AA |

TABLE 22

| | Transmittance in initial stage 400 nm | Retention ratio of transmittance by heat resistance testing at 150° C. | Resistance to yellowing by heat resistance testing at 150° C. | Adhesion testing |
|---|---|---|---|---|
| Example 106 | A | AA | AA | AA |
| Example 107 | A | AA | AA | AA |
| Example 108 | A | AA | AA | AA |

TABLE 22-continued

| | Transmittance in initial stage 400 nm | Retention ratio of transmittance by heat resistance testing at 150° C. | Resistance to yellowing by heat resistance testing at 150° C. | Adhesion testing |
|---|---|---|---|---|
| Example 109 | A | AA | AA | AA |
| Example 110 | A | AA | AA | AA |
| Example 111 | A | AA | AA | AA |
| Example 112 | A | AA | AA | AA |
| Example 113 | A | AA | AA | AA |
| Example 114 | A | AA | AA | AA |
| Example 115 | A | AA | AA | AA |
| Example 116 | A | AA | AA | AA |
| Example 117 | A | AA | AA | AA |
| Example 118 | A | AA | AA | AA |
| Example 119 | A | AA | AA | AA |
| Example 120 | A | AA | AA | AA |
| Example 121 | A | AA | AA | AA |
| Example 122 | A | AA | AA | AA |
| Example 123 | A | AA | AA | AA |
| Example 124 | A | AA | AA | AA |
| Example 125 | A | AA | AA | AA |
| Example 126 | A | AA | AA | AA |
| Example 127 | A | AA | AA | AA |
| Example 128 | A | AA | AA | AA |
| Example 129 | A | AA | AA | AA |
| Example 130 | A | AA | AA | AA |
| Example 131 | A | AA | AA | AA |
| Example 132 | A | AA | AA | AA |
| Example 133 | A | AA | AA | AA |
| Example 124 | A | AA | AA | AA |
| Example 135 | A | AA | AA | AA |
| Example 136 | A | AA | AA | AA |
| Example 137 | A | AA | AA | AA |
| Example 138 | A | AA | AA | AA |
| Example 139 | A | AA | AA | AA |
| Example 140 | A | AA | AA | AA |

TABLE 23

| | Transmittance in initial stage 400 nm | Retention ratio of transmittance by heat resistance testing at 150° C. | Resistance to yellowing by heat resistance testing at 150° C. | Adhesion testing |
|---|---|---|---|---|
| Example 141 | A | AA | AA | AA |
| Example 142 | A | AA | AA | AA |
| Example 143 | A | AA | AA | AA |
| Example 144 | A | AA | AA | AA |
| Example 145 | A | AA | AA | AA |
| Example 146 | A | AA | AA | AA |
| Example 147 | A | AA | AA | AA |
| Example 148 | A | AA | AA | AA |
| Example 149 | A | AA | AA | AA |
| Example 150 | A | AA | AA | AA |
| Example 151 | A | AA | AA | AA |
| Example 152 | A | AA | AA | AA |
| Example 153 | A | AA | AA | AA |
| Example 154 | A | AA | AA | AA |
| Example 155 | A | AA | AA | AA |
| Example 156 | A | AA | AA | AA |
| Example 157 | A | AA | AA | AA |
| Example 158 | A | AA | AA | AA |
| Example 159 | A | AA | AA | AA |
| Example 160 | A | AA | AA | AA |
| Example 161 | A | AA | AA | AA |
| Example 162 | A | AA | AA | AA |
| Example 163 | A | AA | AA | AA |
| Example 164 | A | AA | AA | AA |

TABLE 24

| | Transmittance in initial stage 400 nm | Retention ratio of transmittance by heat resistance testing at 150° C. | Resistance to yellowing by heat resistance testing at 150° C. | Adhesion testing | Remarks |
|---|---|---|---|---|---|
| Comparative Example 1 | — | — | — | — | Not hardened |
| Comparative Example 2 | A | C | C | C | Wrinkled |
| Comparative Example 3 | — | — | — | — | Not dissolved |
| Comparative Example 4 | — | — | — | — | Not hardened |
| Comparative Example 5 | A | C | C | C | Wrinkled |
| Comparative Example 6 | — | — | — | — | Not dissolved |
| Comparative Example 7 | A | B | B | B | Wrinkled |

TABLE 25

| | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 165 | A | A | A | A | A |
| Example 166 | A | A | A | A | A |

TABLE 25-continued

|  | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 167 | A | A | A | A | A |
| Example 168 | A | A | A | A | A |
| Example 169 | A | AA | AA | AA | A |
| Example 170 | A | AA | AA | AA | A |
| Example 171 | A | AA | AA | AA | A |
| Example 172 | A | AA | AA | AA | A |
| Example 173 | A | AA | AA | AA | A |
| Example 174 | A | AA | AA | AA | A |
| Example 175 | A | AA | AA | AA | A |
| Example 176 | A | AA | AA | AA | A |
| Example 177 | A | AA | AA | AA | A |
| Example 178 | A | AA | AA | AA | A |
| Example 179 | A | AA | AA | AA | A |
| Example 180 | A | AA | AA | AA | A |
| Example 181 | A | AA | AA | AA | A |
| Example 182 | A | AA | AA | AA | A |
| Example 183 | A | AA | AA | AA | A |
| Example 184 | A | AA | AA | AA | A |
| Example 185 | A | AA | AA | AA | A |
| Example 186 | A | AA | AA | AA | A |
| Example 187 | A | AA | AA | AA | A |
| Example 188 | A | AA | AA | AA | A |
| Example 189 | A | AA | AA | AA | A |
| Example 190 | A | AA | AA | AA | A |
| Example 191 | A | AA | AA | AA | A |
| Example 192 | A | AA | AA | AA | A |
| Example 193 | A | AA | AA | AA | A |
| Example 194 | A | AA | AA | AA | A |
| Example 195 | A | AA | AA | AA | A |
| Example 196 | A | AA | AA | AA | A |
| Example 197 | A | AA | AA | AA | A |

TABLE 26

|  | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 198 | A | AA | AA | AA | A |
| Example 199 | A | AA | AA | AA | A |
| Example 200 | A | AA | AA | AA | A |
| Example 201 | A | AA | AA | AA | A |
| Example 202 | A | AA | AA | AA | A |
| Example 203 | A | AA | AA | AA | A |
| Example 204 | A | AA | AA | AA | A |
| Example 205 | A | AA | AA | AA | A |
| Example 206 | A | AA | AA | AA | A |
| Example 207 | A | AA | AA | AA | A |
| Example 208 | A | AA | AA | AA | A |
| Example 209 | A | AA | AA | AA | A |
| Example 210 | A | AA | AA | AA | A |
| Example 211 | A | AA | AA | AA | A |
| Example 212 | A | AA | AA | AA | A |
| Example 213 | A | AA | AA | AA | A |
| Example 214 | A | AA | AA | AA | A |
| Example 215 | A | AA | AA | AA | A |
| Example 216 | A | AA | AA | AA | A |
| Example 217 | A | AA | AA | AA | A |
| Example 218 | A | AA | AA | AA | A |
| Example 219 | A | AA | AA | AA | A |
| Example 220 | A | AA | AA | AA | A |
| Example 221 | A | AA | AA | AA | A |
| Example 222 | A | AA | AA | AA | A |
| Example 223 | A | AA | AA | AA | A |
| Example 224 | A | AA | AA | AA | A |
| Example 225 | A | AA | AA | AA | A |
| Example 226 | A | AA | AA | AA | A |

TABLE 26-continued

|  | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 227 | A | AA | AA | AA | A |
| Example 228 | A | AA | AA | AA | A |
| Example 229 | A | AA | AA | AA | A |
| Example 230 | A | AA | AA | AA | A |

TABLE 27

|  | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 231 | A | AA | AA | AA | A |
| Example 232 | A | AA | AA | AA | A |
| Example 233 | A | AA | AA | AA | A |
| Example 234 | A | AA | AA | AA | A |
| Example 235 | A | AA | AA | AA | A |
| Example 236 | A | AA | AA | AA | A |
| Example 237 | A | AA | AA | AA | A |
| Example 238 | A | AA | AA | AA | A |
| Example 239 | A | AA | AA | AA | A |
| Example 240 | A | AA | AA | AA | A |
| Example 241 | A | AA | AA | AA | A |
| Example 242 | A | AA | AA | AA | A |
| Example 243 | A | AA | AA | AA | A |
| Example 244 | A | AA | AA | AA | A |
| Example 245 | A | AA | AA | AA | A |
| Example 246 | A | AA | AA | AA | A |
| Example 247 | A | AA | AA | AA | A |
| Example 248 | A | AA | AA | AA | A |
| Example 249 | A | AA | AA | AA | A |
| Example 250 | A | AA | AA | AA | A |
| Example 251 | A | AA | AA | AA | A |
| Example 252 | A | AA | AA | AA | A |
| Example 253 | A | AA | AA | AA | A |
| Example 254 | A | AA | AA | AA | A |
| Example 255 | A | AA | AA | AA | A |
| Example 256 | A | AA | AA | AA | A |
| Example 257 | A | AA | AA | AA | A |
| Example 258 | A | AA | AA | AA | A |
| Example 259 | A | AA | AA | AA | A |
| Example 260 | A | AA | AA | AA | A |
| Example 261 | A | AA | AA | AA | A |
| Example 262 | A | AA | AA | AA | A |
| Example 263 | A | AA | AA | AA | A |

TABLE 28

|  | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 264 | A | AA | AA | AA | A |
| Example 265 | A | AA | AA | AA | A |
| Example 266 | A | AA | AA | AA | A |
| Example 267 | A | AA | AA | AA | A |
| Example 268 | A | AA | AA | AA | A |
| Example 269 | A | AA | AA | AA | A |
| Example 270 | A | AA | AA | AA | A |
| Example 271 | A | AA | AA | AA | A |
| Example 272 | A | AA | AA | AA | A |
| Example 273 | A | AA | AA | AA | A |
| Example 274 | A | AA | AA | AA | A |

TABLE 28-continued

|  | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 275 | A | AA | AA | AA | A |
| Example 276 | A | AA | AA | AA | A |
| Example 277 | A | AA | AA | AA | A |
| Example 278 | A | AA | AA | AA | A |
| Example 279 | A | AA | AA | AA | A |
| Example 280 | A | AA | AA | AA | A |
| Example 281 | A | AA | AA | AA | A |
| Example 282 | A | AA | AA | AA | A |
| Example 283 | A | AA | AA | AA | A |
| Example 284 | A | AA | AA | AA | A |
| Example 285 | A | AA | AA | AA | A |
| Example 286 | A | AA | AA | AA | A |
| Example 287 | A | AA | AA | AA | A |
| Example 288 | A | AA | AA | AA | A |
| Example 289 | A | AA | AA | AA | A |
| Example 290 | A | AA | AA | AA | A |
| Example 291 | A | AA | AA | AA | A |
| Example 292 | A | AA | AA | AA | A |
| Example 293 | A | AA | AA | AA | A |
| Example 294 | A | AA | AA | AA | A |
| Example 295 | A | AA | AA | AA | A |
| Example 296 | A | AA | AA | AA | A |

TABLE 29

|  | Transmittance in initial stage 400 nm | Retention ratio of transmittance by heat resistance testing at 150° C. | Resistance to yellowing by heat resistance testing at 150° C. | Adhesion testing | Hardening properties |
|---|---|---|---|---|---|
| Example 297 | A | AA | AA | AA | A |
| Example 298 | A | AA | AA | AA | A |
| Example 299 | A | AA | AA | AA | A |
| Example 300 | A | AA | AA | AA | A |
| Example 301 | A | AA | AA | AA | A |
| Example 302 | A | AA | AA | AA | A |
| Example 303 | A | AA | AA | AA | A |
| Example 304 | A | AA | AA | AA | A |
| Example 305 | A | AA | AA | AA | A |
| Example 306 | A | AA | AA | AA | A |
| Example 307 | A | AA | AA | AA | A |
| Example 308 | A | AA | AA | AA | A |
| Example 309 | A | AA | AA | AA | A |
| Example 310 | A | AA | AA | AA | A |
| Example 311 | A | AA | AA | AA | A |
| Example 312 | A | AA | AA | AA | A |
| Example 313 | A | AA | AA | AA | A |
| Example 314 | A | AA | AA | AA | A |
| Example 315 | A | AA | AA | AA | A |
| Example 316 | A | AA | AA | AA | A |
| Example 317 | A | AA | AA | AA | A |
| Example 318 | A | AA | AA | AA | A |
| Example 319 | A | AA | AA | AA | A |
| Example 320 | A | AA | AA | AA | A |
| Example 321 | A | AA | AA | AA | A |
| Example 322 | A | AA | AA | AA | A |
| Example 323 | A | AA | AA | AA | A |
| Example 324 | A | AA | AA | AA | A |
| Example 325 | A | AA | AA | AA | A |
| Example 326 | A | AA | AA | AA | A |
| Example 327 | A | AA | AA | AA | A |
| Example 328 | A | AA | AA | AA | A |

TABLE 30

| | Transmittance in initial stage 400 nm | Retention ratio of transmittance by heat resistance testing at 150° C. | Resistance to yellowing by heat resistance testing at 150° C. | Adhesion testing | Hardening properties | Remarks |
|---|---|---|---|---|---|---|
| Comparative Example 8 | — | — | — | — | — | Not hardened |
| Comparative Example 9 | A | C | C | C | C | Wrinkled |
| Comparative Example 10 | — | — | — | — | — | Not dissolved |
| Comparative Example 11 | — | — | — | — | — | Not hardened |
| Comparative Example 12 | A | C | C | C | C | Wrinkled |
| Comparative Example 13 | — | — | — | — | — | Not dissolved |
| Comparative Example 14 | A | B | B | B | B | A small amount of blisters Uneven film |

Examples 329 to 656

To each varnish prepared in preparation steps of the hardened materials 1 to 328, the phosphor (YAG) subjected to surface treatment with the silane coupling agent was mixed for a concentration of particles of the phosphor to be 20% by mass. Then, 100 µm-thick films were prepared in a manner similar to the operations in Examples 1 to 328 except for addition of YAG. A film obtained was cut using a cutter knife, and a sample for measurement was prepared. The samples for measurement obtained from kinds of varnishes prepared in the preparation steps of the hardened materials 1 to 328 were used are described in Examples 329 to 656, respectively.

Comparative Examples 1 to 14

To each varnish prepared in preparation steps of the comparative hardened materials 1 to 14, the phosphor (YAG) subjected to surface treatment with the silane coupling agent was mixed for a concentration of particles of the phosphor to be 20% by mass. Then, 100 um-thick films were prepared in a manner similar to the operations in Examples 1 to 328, and samples for measurement were obtained. The samples for measurement obtained from kinds of varnishes prepared in the preparation steps of the comparative hardened materials 1 to 14 were used are described in Comparative Examples 15 to 28, respectively.

Color Change Testing

Color changes in films according to Examples 329 to 656 and Comparative Examples 15 to 28 were investigated by irradiating the resulting films with light from a blue LED chip, and the color changes were evaluated based on the following criteria:

Good: without a flare spot on a film; and

Bad: with a flare spot on a film.

Table 31 presents the results of evaluation of test specimens obtained in Examples 329 to 656 and Comparative Examples 15 to 28.

TABLE 31

| | Examples 329 to 656 | Comparative Examples 5 to 28 |
|---|---|---|
| Flare spot | Good | Bad |

The results in Table 31 clearly show that the hardened material obtained using the hardening resin composition according to the invention has a high transparency, and while the hardened material has adhesion strength comparable to the strength of a conventional epoxy resin, has an excellent resistance to thermal yellowing even under a high temperature environment over a long period of time.

Moreover, the hardened material obtained using the hardening resin composition according to the invention has a skeleton of double-decker silsesquioxane, and therefore is found to have an excellent compatibility with other compounds to allow the phosphor to be uniformly dispersed into the resin composition.

Furthermore, when the phosphor is subjected to surface modification with the silane coupling agent having the epoxy group upon preparing the hardened material, the phosphor is found to allow quick hardening with the epoxy group in the resin without sedimentation in the resin to allow obtaining of a wavelength conversion material, without a flare spot, into which the phosphor is uniformly dispersed.

Although the invention has been described in detail with reference to a specific embodiment, those skilled in the art will appreciate that various modifications and variations can be made without departing from the intention and the scope of the invention. In addition, the present application is based on Japan Patent Application (application for patent 2011-033970) applied on Feb. 18, 2011, which is herein incorporated by reference in its entirety.

The invention claimed is:

1. A hardening resin composition containing (A) to (E) below:
   (A) a silicon compound that is obtained by performing a hydrosilylation reaction among compound (a), compound (b), and when necessary, compound (c) below, and has at least one of epoxy and oxetanyl, wherein compound (a) is at least one of silicone and silsesquioxane having two or more of SiH in one molecule and is at least one kind selected from the group of compounds represented by formula (a-1) to formula (a-5) and formula (a-7) to formula (a-10) below,
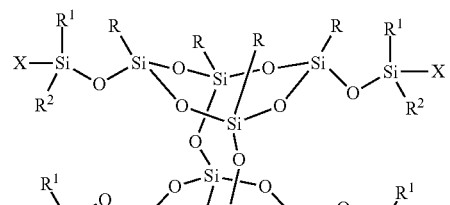
(a-1)
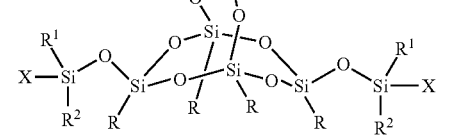
(a-2)
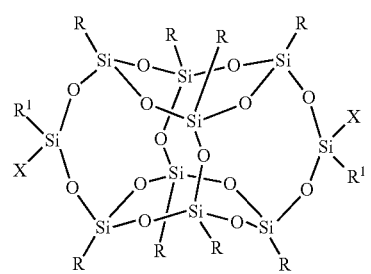
(a-3)
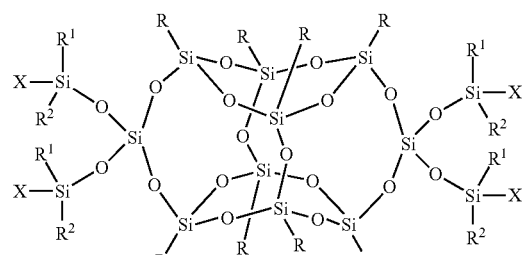
(a-4)
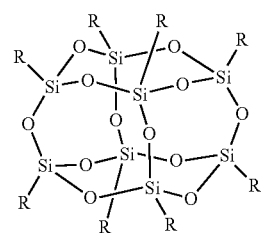
(a-5)
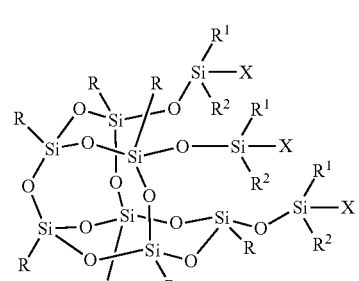
(a-7)
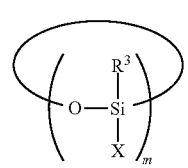
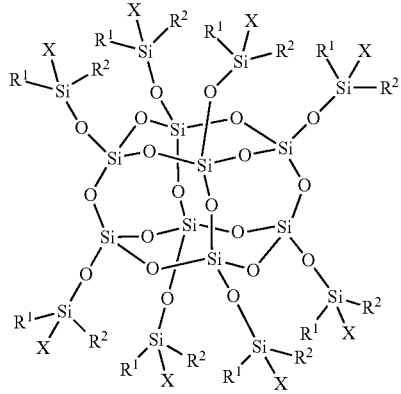
(a-8)
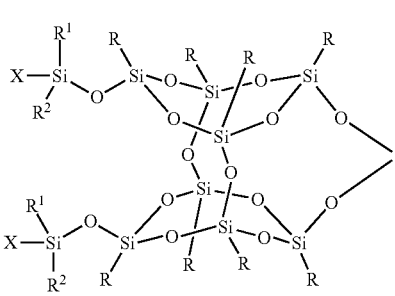
(a-9)
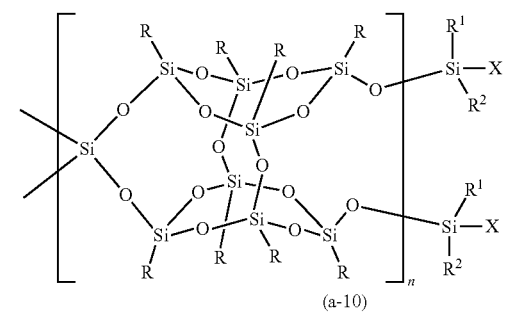
(a-10)

wherein, in formula (a-1) to formula (a-5) and formula (a-7) to formula (a-10),

R is a group independently selected from alkyl having 1 to 45 carbons, cycloalkyl having 4 to 8 carbons, aryl having 6 to 14 carbons and arylalkyl having 7 to 24 carbons; in the alkyl having 1 to 45 carbons, arbitrary hydrogen may be replaced by fluorine, and arbitral non-adjacent —CH$_2$— may be replaced by —O— or —CH=CH—; in a benzene ring in the aryl and the arylalkyl, arbitrary hydrogen may be replaced by halogen or alkyl having 1 to 10 carbons, and in the alkyl having 1 to 10 carbons, arbitrary hydrogen may be replaced by fluorine, and arbitrary non-adjacent —CH$_2$— may be replaced by —O— or —CH=CH—; the number of carbons of alkylene in the arylalkyl is 1 to 10, and arbitrary non-adjacent —CH$_2$—may be replaced by —O—;

$R^1$ and $R^2$ are a group independently selected from alkyl having 1 to 4 carbons, cyclopentyl, cyclohexyl and phenyl;

$R^3$ is a group independently selected from alkyl having 1 to 4 carbons, cyclopentyl, cyclohexyl and phenyl;

at least two of X, in one molecules of each compound, are hydrogen, and the rest of X is a group independently selected from alkyl having 1 to 4 carbons, cyclopentyl, cyclohexyl and phenyl; and n is an integer from 0 to 100, and m is an integer from 3 to 10;

compound (b) is a compound having at least one of epoxy and oxetanyl, and alkenyl having 2 to 18 carbons in one molecule, and compound (c) is at least one of silicone and silsesquioxane having two or more of alkenyl in one molecule;

(B) a phosphor;
(C) an epoxy resin;
(D) a hardening agent; and
(E) an antioxidant.

2. The hardening resin composition according to claim 1, wherein compound (b) is at least one kind selected from the group of compounds represented by formula (b-1) to formula (b-3) below, and compound (c) in a case where compound (c) is used when necessary is at least one kind selected from the group of compounds represented by formula (c-1) and (c-2):

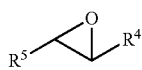
(b-1)

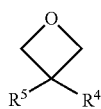
(b-2)

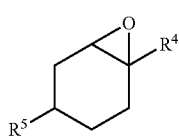
(b-3)

wherein, in formula (b-1) to (b-3), at least one of $R^4$ and $R^5$ is alkenyl having 2 to 10 carbons, and one of —CH$_2$— in the alkenyl may be replaced by 1,4-phenylene, and the other is hydrogen or alkyl having 1 to 6 carbons:

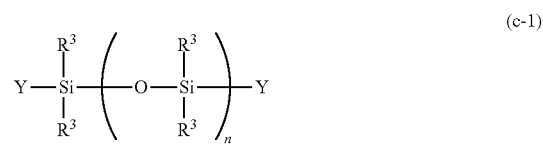
(c-1)

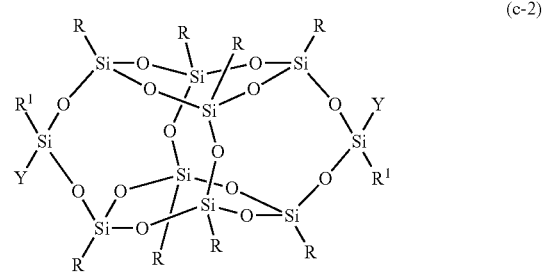
(c-2)

wherein, in formula (c-1) and formula (c-2),

R and $R^3$ are a group defined in a manner similar to the definitions of R and $R^3$ in formula (a-5) and formula (a-7) of claim 1, $R^1$ is a group independently selected from alkyl having 1 to 4 carbons, cyclopentyl, cyclohexyl and phenyl, Y is a group independently selected from vinyl and allyl, and n is an integer from 0 to 100.

3. The hardening resin composition according to claim 1, wherein compound (a) is a silsesquioxane derivative represented by formula (a-1-1) below:

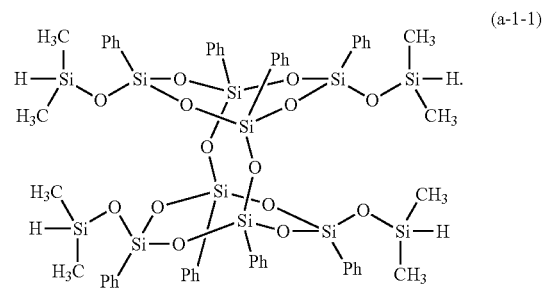
(a-1-1)

4. The hardening resin composition according to claim 1, wherein compound (b) is one kind or two kinds selected from the group of compounds represented by formula (b-1-1), formula (b-2-1), formula (b-2-2), formula (b-3-1) and formula (b-3-2):

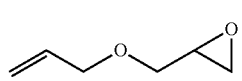
(b-1-1)

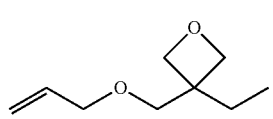
(b-2-1)

-continued (b-2-2)
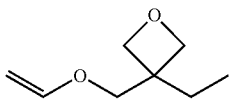

(b-3-1)
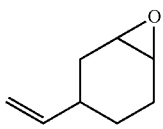

(b-3-2)
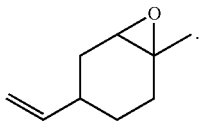

5. The hardening resin composition according to claim 2, wherein compound (c) is represented by formula (c-1-1) or formula (c-2-1) below:

(c-1-1)
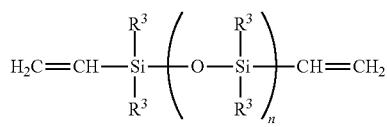

(c-2-1)
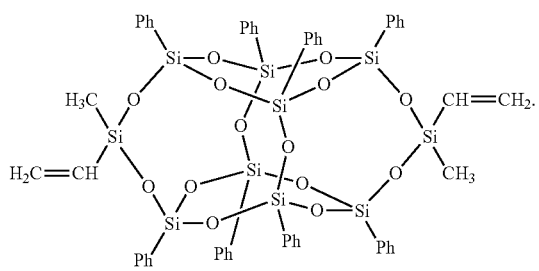

6. The hardening resin composition according to claim 1, wherein the silicon compound represented by (A) and having the epoxy group is polysilsesquioxane represented by formula (α):

(α)
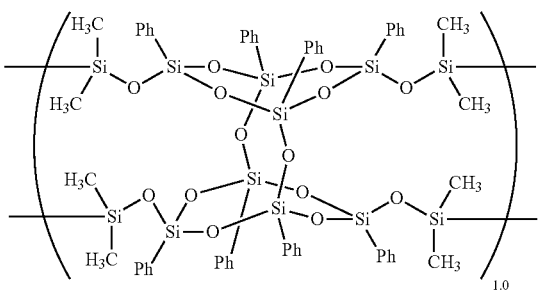

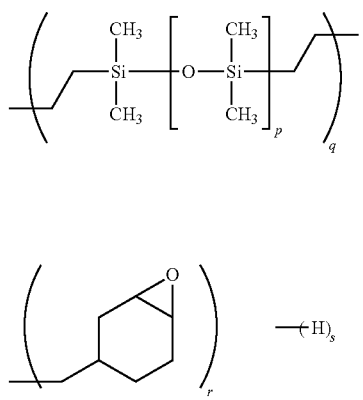

wherein, in formula (α), p is an integer from 1 to 100, q and r each are a value satisfying expressions: 0≤q≤1.95 and 0.1≤r≤4, s is a value satisfying an expression: 0 ≤s≤3, and q, r and s each are a value satisfying an expression: 2q+r+s≤4.

7. The hardening resin composition according to claim 1, wherein the silicon compound represented by (A) and having the epoxy is silsesquioxane represented by formula (β):

(β)
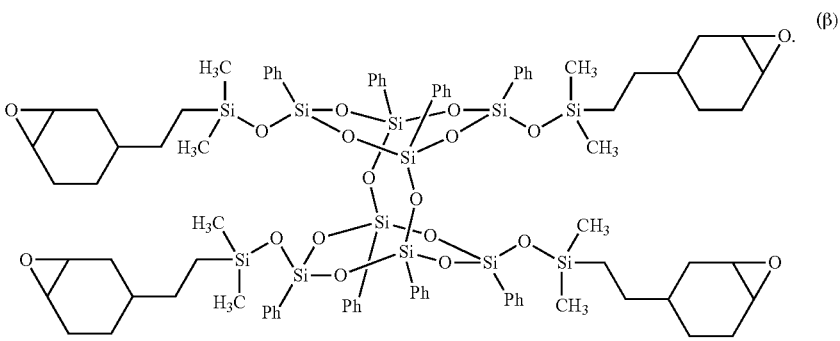 [SMILES: C[Si](C)(CCC1CCC2OC2C1)O[Si]1(c2ccccc2)O[Si]2(c3ccccc3)O[Si](O[Si](C)(C)CCC3CCC4OC4C3)(c3ccccc3)O[Si](c3ccccc3)(O1)O[Si]1(c3ccccc3)O[Si](O[Si](C)(C)CCC3CCC4OC4C3)(c3ccccc3)O[Si](c3ccccc3)(O[Si](O[Si](C)(C)CCC3CCC4OC4C3)(c3ccccc3)O1)O2]

8. The hardening resin composition according to claim 1, wherein the phosphor represented by (B) is a phosphor for a white LED.

9. The hardening resin composition according to claim 1, wherein the epoxy resin represented by (C) is an epoxy resin represented by formula (γ1) or (γ2), and has at least one of the epoxy resins:

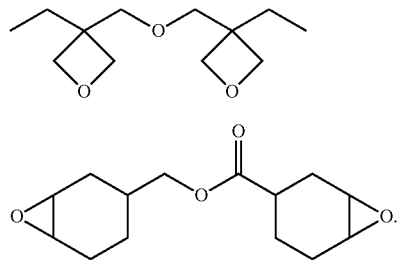

10. The hardening resin composition according to claim 1, wherein the hardening agent represented by (D) is a thermal cationic polymerization initiator or a photocationic polymerization initiator.

11. The hardening resin composition according to claim 1, wherein the antioxidant represented by (E) is a phenolic antioxidant or a phosphorus-based antioxidant, and a phenolic antioxidant.

12. A hardened material in a form of a film, a sheet or a coating film, obtained by applying onto a transparent base material the hardening resin composition according to claim 1, and hardening an applied product by heating or light irradiation.

13. A color conversion material containing the hardened material according to claim 12.

14. An optical semiconductor device including the color conversion material according to claim 13.

* * * * *